United States Patent
Liaw

(10) Patent No.: US 10,879,243 B2
(45) Date of Patent: Dec. 29, 2020

(54) SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/101,573

(22) Filed: Aug. 13, 2018

(65) Prior Publication Data
US 2020/0051980 A1 Feb. 13, 2020

(51) Int. Cl.
| H01L 27/092 | (2006.01) |
| H01L 21/8238 | (2006.01) |
| H01L 21/768 | (2006.01) |
| H01L 29/66 | (2006.01) |
| H01L 27/11 | (2006.01) |
| H01L 29/78 | (2006.01) |
| H01L 29/423 | (2006.01) |

(52) U.S. Cl.
CPC .... *H01L 27/0924* (2013.01); *H01L 21/76832* (2013.01); *H01L 21/76834* (2013.01); *H01L 21/76897* (2013.01); *H01L 21/823821* (2013.01); *H01L 21/823864* (2013.01); *H01L 21/823878* (2013.01); *H01L 21/823892* (2013.01); *H01L 27/1104* (2013.01); *H01L 29/4232* (2013.01); *H01L 29/66795* (2013.01); *H01L 29/785* (2013.01)

(58) Field of Classification Search
CPC ........... H01L 27/0924; H01L 21/76832; H01L 21/76834; H01L 21/823821; H01L 21/82385; H01L 21/823828; H01L 21/823431; H01L 29/4232; H01L 29/66795; H01L 29/785
USPC ................. 257/401, 365, E29.264, E21.422; 438/283, 199
See application file for complete search history.

(56) References Cited

U.S. PATENT DOCUMENTS

| 2013/0258759 A1* | 10/2013 | Liaw .................. H01L 27/0924 365/154 |
| 2017/0133379 A1* | 5/2017 | Kim ...................... H01L 29/161 |
| 2018/0033863 A1* | 2/2018 | Xie ..................... H01L 29/0653 |
| 2018/0138092 A1* | 5/2018 | Lee ................. H01L 21/823437 |
| 2019/0006515 A1* | 1/2019 | Cheng .............. H01L 21/76877 |

* cited by examiner

*Primary Examiner* — Mohammed Shamsuzzaman
*Assistant Examiner* — Aaron J Gray
(74) *Attorney, Agent, or Firm* — McClure, Qualey & Rodack, LLP

(57) ABSTRACT

A semiconductor device includes a first fin, a first gate electrode, a second fin, a second gate electrode, and a first dielectric capping layer. The first fin extends along a direction. The first gate electrode is across the first fin and has a first notched corner. The second fin extends along the direction. The second gate electrode is across the second fin and has a second notched corner. The first dielectric capping layer has a first portion in between the first notched corner and the second notched corner.

9 Claims, 34 Drawing Sheets

SEMICONDUCTOR DEVICE AND METHOD FOR MANUFACTURING THE SAME

BACKGROUND

As the technology nodes shrink, in some integrated circuit (IC) designs, there has been a desire to replace the typically polysilicon gate electrode with a metal gate electrode to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in complementary metal-oxide-semiconductor (CMOS) fabrication. As the gate length and spacing between devices decrease, these problems are exacerbated. For example, source/drain regions may short to metal gate structures due to misalignment of contacts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
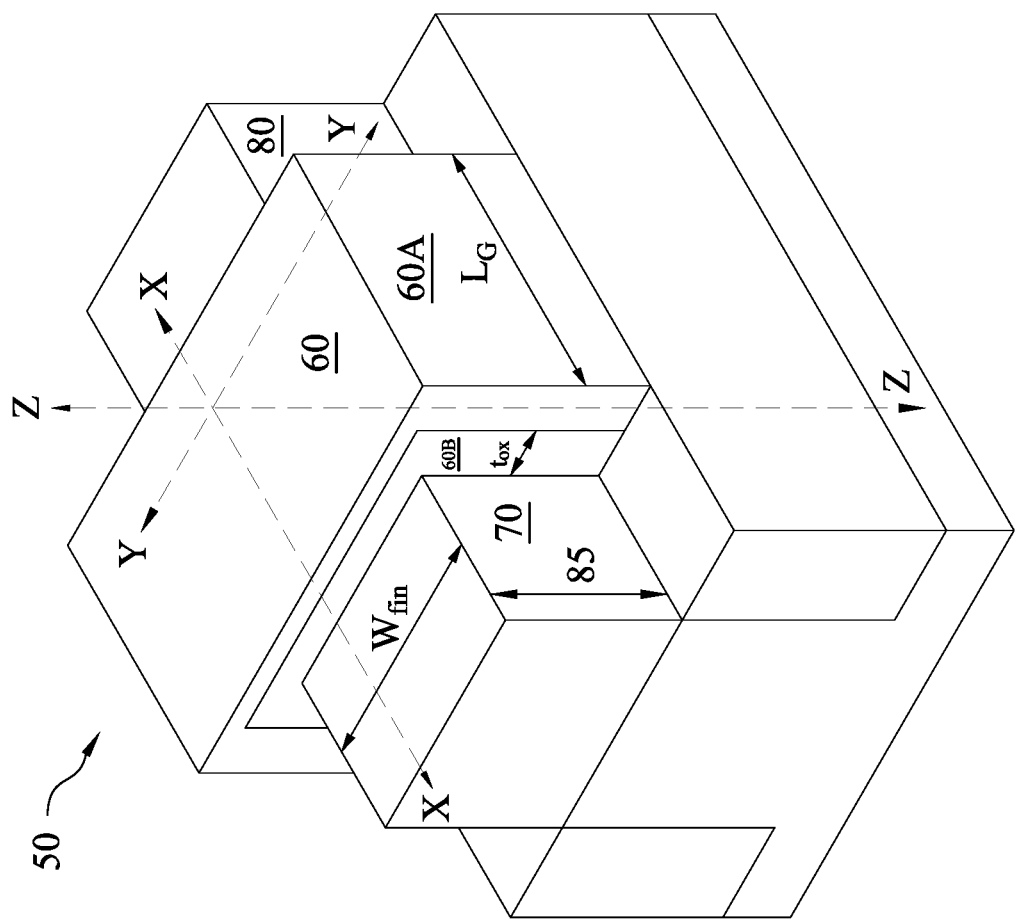
FIG. 1 illustrates a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The use of FinFET devices has been gaining popularity in the semiconductor industry. Referring to FIG. 1, which illustrates a perspective view of an example FinFET device 50. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. In some embodiments, the fin width $W_{fin}$ of the fin may be defined as a width of the top surface of the fin measured along the Y-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 2:
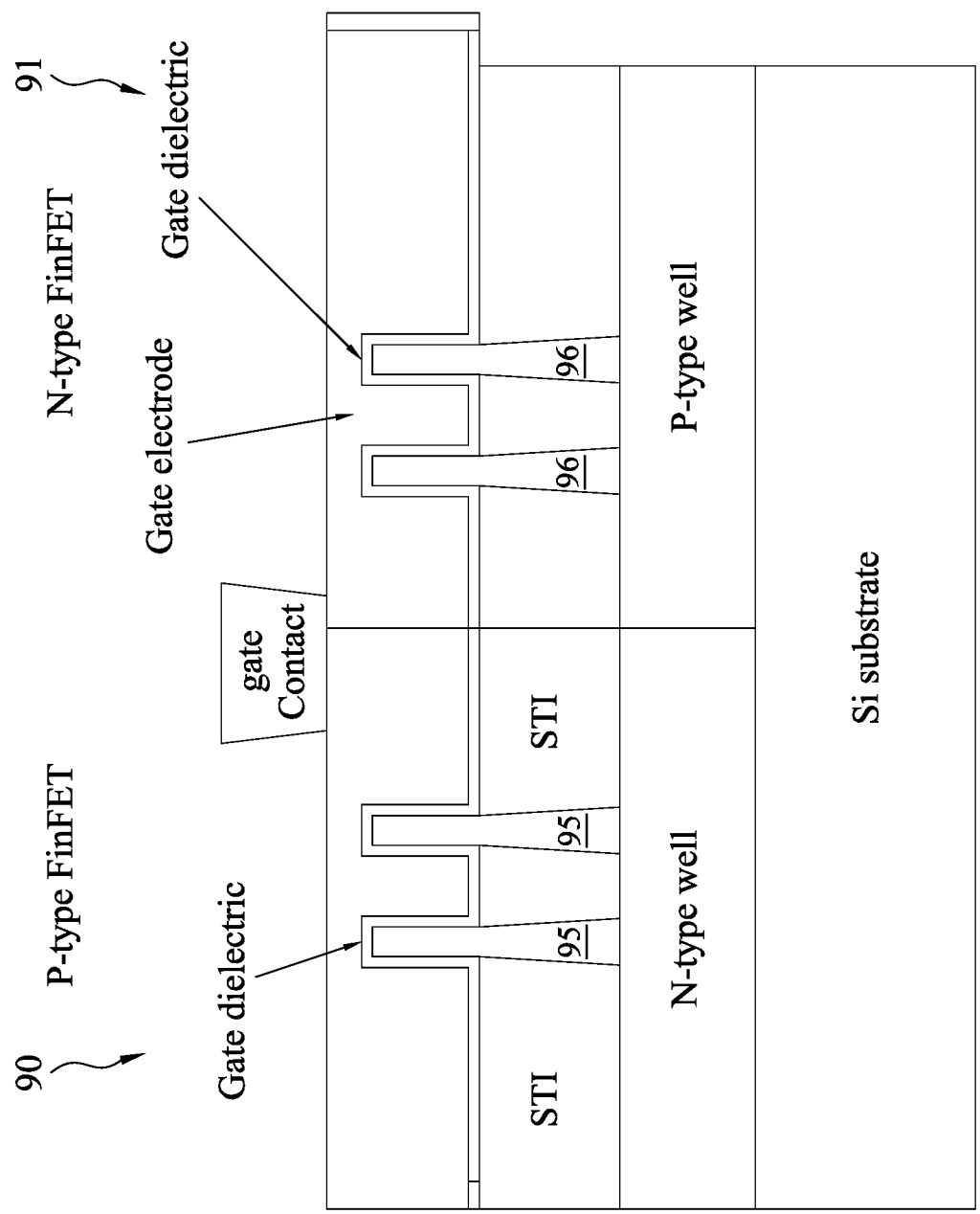
FIG. 2 illustrates a diagrammatic cross-sectional side view of FinFET transistors in a CMOS configuration.

FIG. 2 illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate via is formed on the gate electrode to provide electrical connectivity to the gate.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

Figure 3:
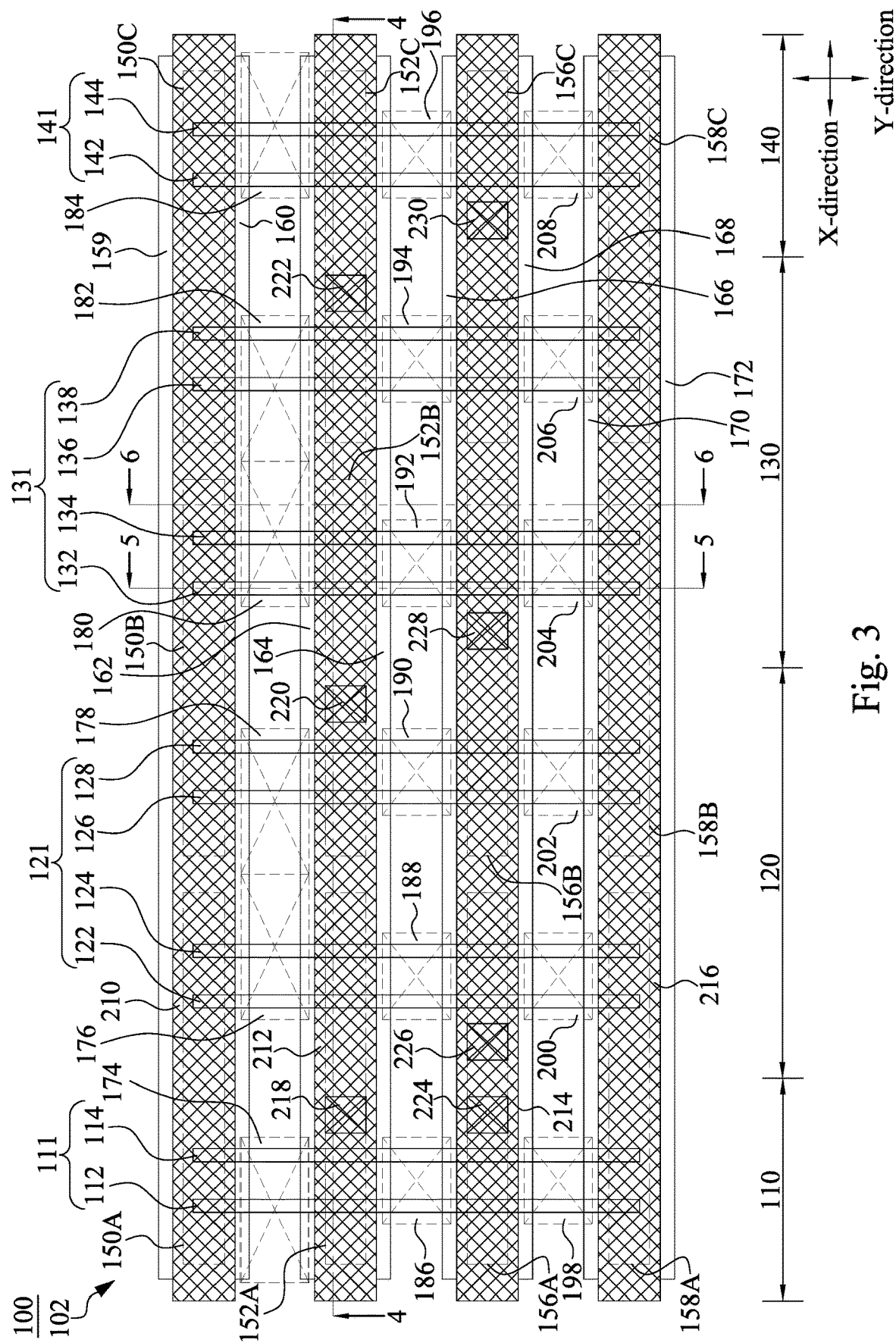
FIG. 3 illustrates a top view of a layout corresponding to a circuit of a semiconductor device according to some embodiments of the present disclosure.

Reference is made to FIG. 3, which illustrates a top view of a layout corresponding to a circuit 102 of a semiconductor device 100 according to some embodiments of the present disclosure. The circuit 102 includes a first active area region 111 with fins 112, 114, a second active area region 121 with fins 122, 124, 126, 128, a third active area region 131 with fins 132, 134, 136, 138, a fourth active area region 141 with fins 142, 144, a plurality of gate electrodes 150A, 150B, 150C, 152A, 152B, 152C, 156A, 156C, 158A, 158B, 158C, a plurality of spacers 159, 160, 162, 164, 166, 168, 170, 172, a plurality of contact areas 174, 176, 178, 180, 182, 184, 186, 188, 190, 192, 194, 196, 198, 200, 202, 204, 206, 208, a plurality of first capping layers 210, 212, 214, 216, and a plurality of gate contacts 218, 220, 222, 224, 226, 228, 230.

The first, second, third, and fourth active area regions 111, 121, 131, 141 extend along a Y-direction of the layout. In some embodiments, the first, second, third, and fourth active area regions 111, 121, 131, 141 are also referred to as oxide-definition (OD) regions. Example materials of the first, second, third, and fourth active area regions 111, 121, 131, 141 include, but are not limited to, semiconductor materials doped with various types of p-dopants and/or n-dopants. In some embodiments, the first, second, third, and fourth active area regions 111, 121, 131, 141 include dopants of the same type. In some embodiments, one of the first, second, third, and fourth active area regions 111, 121, 131, 141 includes dopants of a type different than a type of dopants of another one of the first, second, third, and fourth active area regions 111, 121, 131, 141. The first, second, third, and fourth active area regions 111, 121, 131, 141 are within corresponding well regions. For example, in some embodiments, the first active area region 111 is within a well region 110 which is a p-well region, the second active area region 121 is within a well region 120 which is an n-well region, the third active area region 131 is within a well region 130 which is a p-well region, and the fourth active area region 141 is within a well region 140 which is an n-well region. The described conductivity type of the well regions 110, 120, 130, 140 is an example. Other arrangements are within the scope of various embodiments.

The p-well region 110, the n-well region 120, the p-well region 130, and the n-well region 140 are arranged along an X-direction of the layout and correspond to different regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 3, the p-well region 110 or 130 is a region for forming n-channel metal-oxide semiconductor (NMOS) transistors, and the n-well region 120 or 140 is a region for forming p-channel metal-oxide semiconductor (PMOS) transistors. Each of the first, second, third, and fourth active area regions 111, 121, 131, 141 includes one or more fins to form FinFETs as described in FIGS. 1 and 2. For example, the second active area region 121 comprises the four fins 122, 124, 126, 128 and the third active area region 131 comprises the four fins 132, 134, 136, 138. Other numbers of fins in each of the first, second, third, and fourth active area regions 111, 121, 131, 141 are within the scope of various embodiments. The described FinFET configuration is an example. Other arrangements are within the scope of various embodiments. For example, in one or more embodiments, the first, second, third, and fourth active area regions 111, 121, 131, 141 do not include fins and are configured for forming planar MOSFET transistors.

The fins 112, 114, 122, 124, 126, 128, 132, 134, 136, 138, 142, 144 are extend in an elongated manner in the Y-direction. In some embodiments, the fins 112, 114, 132, 134, 136, 138 are parts of the NMOSFET, and the fins 122, 124, 126, 128, 142, 144 are parts of the PMOSFET. The NMOSFET fins 112, 114, 132, 134, 136, 138 are located over the p-well region 110 or 130, whereas the PMOSFET fins 122, 124, 126, 128, 142, 144 are located over the n-well region 120 or 140. In some embodiments, the NMOSFET fins 112, 114, 132, 134, 136, 138 comprise a non-germanium-containing semiconductor material, for example Si, but the PMOSFET fins 122, 124, 126, 128, 142, 144 comprise a silicon germanium (SiGe) material (for strain effect enhancement). In some embodiment, at least one of the fins 112, 114, 122, 124, 126, 128, 132, 134, 136, 138, 142, 144 has a width measured along the X-direction as described with respect to the fin width $W_{fin}$ in FIG. 1.

The gate electrodes 150A, 150B, 150C, 152A, 152B, 152C, 156A, 156B, 156C, 158A, 158B, 158C extend along the X-direction of the layout. The gate electrodes 150A, 152A, 156A, 158A are across fins 112, 114, 122, 124. The gate electrodes 150B, 152B, 156B, 158B are across fins 126, 128, 132, 134. The gate electrodes 150C, 152C, 156C, 158C are across fins 136, 138, 142, 144. Example materials of the gate electrodes 150A-150C, 152A-152C, 156A-156C, 158A-158C include, but are not limited to, polysilicon and metal. Other materials are within the scope of various embodiments. The gate electrodes 150A-150C, 152A-152C, 156A-156C, 158A-158C and the corresponding first, second, third, and fourth active area regions 111, 121, 131, 141 form one or more transistors in the circuit 102. In the example configuration in FIG. 3, a transistor may be formed by the gate electrode 152A and the second active area region 121, and such transistor may include a gate, a drain and a source. The gate of the transistor is formed by the gate electrode 152A. One of the drain or the source (referred to herein as "source/drain" or "S/D") of the transistor is defined by a region of the second active area region 121 on one side (e.g., the downside in FIG. 3) of the gate electrode 152A. The other source/drain of the transistor is defined by another region of the second active area region 121 on the opposite side (e.g., the upside in FIG. 3) of the gate electrode 152A. For another example, a further transistor may be formed by the gate electrode 152B and the third active area region 131.

In some embodiments, a pair of the adjacent gate electrodes of the gate electrodes 150A-150C, 152A-152C, 156A-156C, 158A-158C may define a gap therebetween. For example, a gap is between the gate electrodes 150A, 150B. In some embodiments, an etching process is performed to cut a gate electrode to form a plurality of the gate electrodes 150A-150C, the gate electrodes 152A-152C, the gate electrodes 156A-156C, or the gate electrodes 158A-158C. For example, a gate electrode extending from the first active area region 111 to the fourth active area region 141, and thereafter an etching process is performed such that the gate electrode is divided into the gate electrodes 150A-150C.

One or more of the gate electrodes 150A-150C, 152A-152C, 156A-156C, 158A-158C are coupled to other circuitry of the semiconductor device 100 by the corresponding gate contact. For example, the gate contacts 218, 220, 222, 224, 226, 228, 230 may be formed on the corresponding gate electrodes 152A-152C, 156A-156C and configured to electrically couple to the gate electrodes 152A-152C, 156A-156C to other circuitry. In some embodiments, the gate contacts 218, 220, 222, 224, 226, 228, 230 overlap the corresponding gate electrodes 152A-152C, 156A-156C and respectively have vertical projections projected on the corresponding gate electrodes 152A-152C, 156A-156C.

The spacers 159, 160, 162, 164, 166, 168, 170, 172 are arranged along sides of the corresponding gate electrodes 150A-150C, 152A-152C, 156A-156C, 158A-158C. For example, the spacers 162 and 164 are arranged along longitudinal sides of the gate electrodes 152A-152C in the Y-direction, and the spacers 166 and 168 are arranged along longitudinal sides of the gate electrodes 156A-156C in the Y-direction. The spacers 159, 160, 162, 164, 166, 168, 170, 172 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 159, 160, 162, 164, 166, 168, 170, 172 have a tapered profile as described herein.

The first capping layers 210, 212, 214, 216 are overlap the corresponding gate electrodes 150A-150C, 152A-152C, 156A-156C, 158A-158C and the corresponding spacers 159, 160, 162, 164, 166, 168, 170, 172. For example, the first capping layer 210 overlaps the gate electrodes 150A-150C and the space 159, 160. The first capping layers 210, 212, 214, 216 overlap the gaps defined by the corresponding gate electrodes 150A-150C, 152A-152C, 156A-156C, 158A-158C as well. For example, a portion of the first capping layer 210 is between a pair of the adjacent gate electrodes 150A, 150B. Example materials of the first capping layers 210, 212, 214, 216 include, but are not limited to, a high-k dielectric layer, an interfacial layer, and/or combinations thereof. For example, the first capping layers 210, 212, 214, 216 may include a nitride based dielectric, a metal oxide dielectric, hafnium oxide (HfO2), tantalum oxide (Ta2O5), titanium oxide (TiO2), zirconium oxide (ZrO2), aluminium aluminum oxide (Al2O3), yttrium oxide (Y2O3), or combinations thereof. In some embodiments, the gate electrodes 150A-150C, 152A-152C, 156A-156C, 158A-158C and the first capping layers 210, 212, 214, 216 extend along the X-direction of FIG. 3, such that the gate electrodes 150A-150C, 152A-152C, 156A-156C, 158A-158C and the first capping layers 210, 212, 214, 216 in view of FIG. 3 are perpendicular to the fins 112, 114, 122, 124, 126, 128, 132, 134, 136, 138, 142, 144.

The contact areas 174, 176, 178, 180, 182, 184, 186, 188, 190 192, 194, 196, 198, 200, 202, 204, 206, 208 overlap the corresponding first, second, third, and fourth active area regions 111, 121, 131, 141. For example, the contact areas 174, 186, 198 overlap the first active area region 111, and the contact areas 176, 178, 188, 190, 200, 202 overlap the second active area region 121. The contact areas 174, 176, 178, 180, 182, 184, 186, 188, 190 192, 194, 196, 198, 200, 202, 204, 206, 208 are configured to electrically couple the underlying source/drains of the corresponding transistors with each other or with other circuitry of the semiconductor device 100. In some embodiments, one or more of the contact areas 174, 176, 178, 180, 182, 184, 186, 188, 190 192, 194, 196, 198, 200, 202, 204, 206, 208 are self-aligned contacts (SAC) having boundaries defined at least partially by boundaries of the spacers 159, 160, 162, 164, 166, 168, 170, 172. In some embodiments, during the formation of the SAC, the first capping layers 210, 212, 214, 216 may serve as contact etch protection layers. In some embodiments, the contact areas 174, 176, 178, 180, 182, 184, 186, 188, 190 192, 194, 196, 198, 200, 202, 204, 206, 208 are rectangular. For example, at least one of the contact areas 174, 176, 178, 180, 182, 184, 186, 188, 190 192, 194, 196, 198, 200, 202, 204, 206, 208 has a slot shape having a pair of longer sides and a pair of shorter sides. In some embodiments, a ratio of a length of the long side to a length of the short side is larger than 2.

Figure 4:
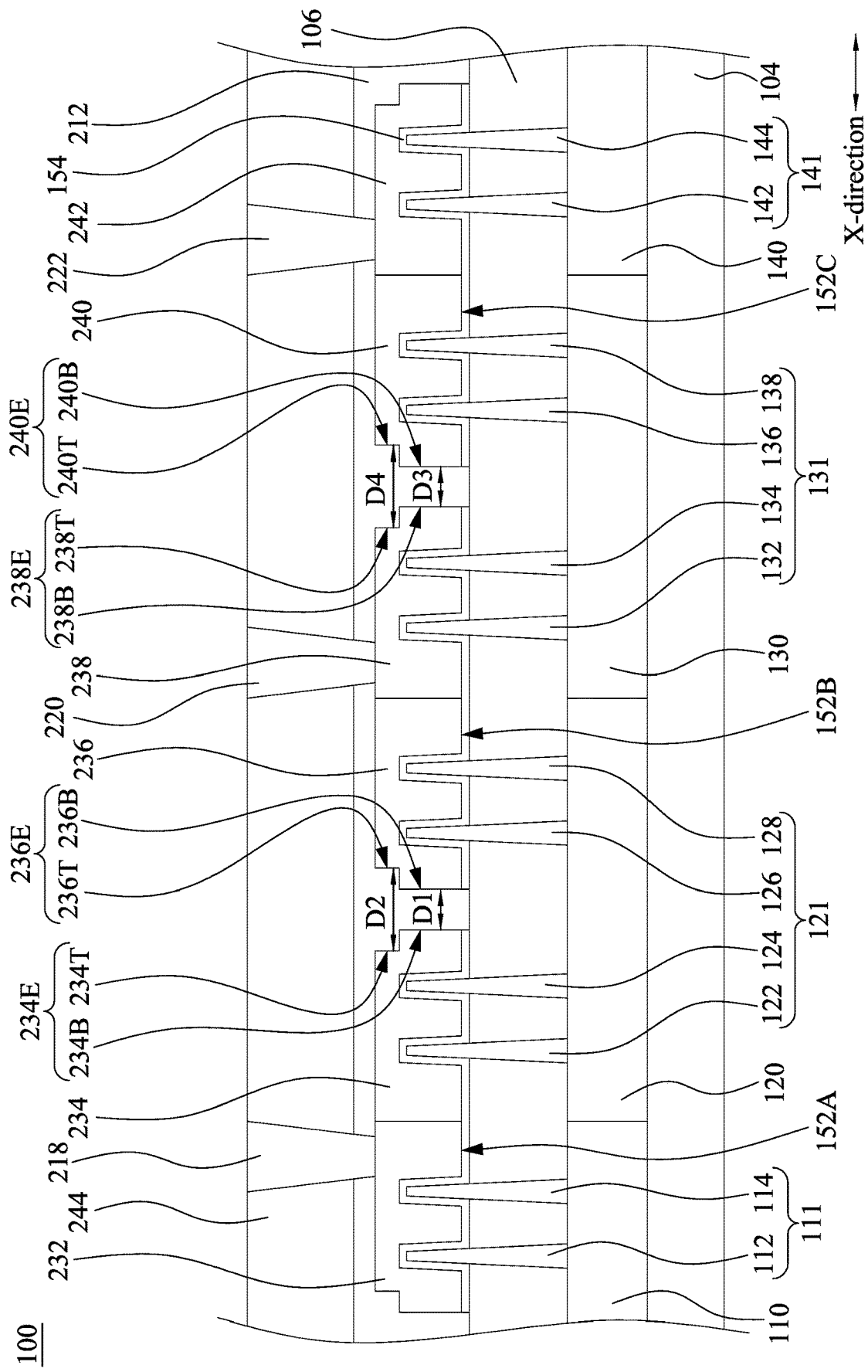
FIG. 4 is a cross-section view taken along line 4-4 in FIG. 3.

Reference is made to FIG. 4, which is a cross-section view taken along line 4-4 in FIG. 3. The structures shown in FIG. 4 can be formed by modelling in a layout as depicted in FIG. 3. For example, physical elements or layers can be formed by using the gate electrode or the gate contact illustrated in FIG. 3 as patterns.

As illustrated in FIG. 4, the semiconductor device 100 comprises a substrate 104 over which various elements of the semiconductor device 100 are formed. The elements of the semiconductor device 100 include active elements and/or passive elements. In at least one embodiment, active elements are arranged in a circuit region of the semiconductor device to provide one or more functions and/or operations intended to be performed by the semiconductor device. In at least one embodiment, the semiconductor device further comprises a non-circuit region, e.g., a sealing region that extends around and protects the circuit region. Examples of active elements include, but are not limited to, transistors and diodes. Examples of transistors are described herein with respect to FIG. 3. Examples of passive elements include, but are not limited to, capacitors, inductors, fuses, and resistors. A plurality of metal layers and via layers are alternatingly formed over the substrate 104 to electrically couple the elements of the semiconductor device 100 with each other and/or with external devices. The substrate 104 comprises, in at least one embodiment, a silicon substrate. The substrate 104 comprises, in at least one embodiment, silicon germanium (SiGe), Gallium arsenic, P-type doped Si, N-type doped Si, or suitable semiconductor materials. For example, semiconductor materials including group III, group IV, and group V elements are within the scope of various embodiments. In some embodiments, the substrate 104 further includes one or more other features, such as various doped regions, a buried layer, and/or an epitaxy (epi) layer. In some embodiments, the substrate 104 comprises a semiconductor on insulator, such as silicon on insulator (SOI). In some embodiments, the substrate 104 includes a doped epi layer, a gradient semiconductor layer, and/or a semiconductor layer overlying another semiconductor layer of a different type such as a silicon layer on a silicon germanium layer. The semiconductor device 100 further comprises one or more well regions over the substrate 104. In the example configuration in FIG. 4, the p-well regions 110, 130 and the n-well regions 120, 140 are over the substrate 104, as described with respect to FIG. 3.

The semiconductor device 100 further comprises one or more isolation structures over and around the well regions 110, 120, 130, 140. In the example configuration in FIG. 4, the semiconductor device 100 further comprises an isolation structure 106 over the well regions 110, 120, 130, 140. The isolation structure 106 electrically isolate various elements of the semiconductor device 100 from each other. For example, the isolation structure 106 electrically isolates the fins 122, 124, 126, 128 in the second active area region 121 from the fins 132, 134, 136, 138 in the third active area region 131. In some embodiments, the isolation structure 106 may have a thickness less than at least one of the fins 112, 114, 122, 124, 126, 128, 132, 134, 136, 138, 142, 144. In some embodiments, outside the cross-section shown in FIG. 4, the isolation structure 106 may include regions where the thickness thereof is higher than at least one of the corresponding fins 112, 114, 122, 124, 126, 128, 132, 134, 136, 138, 142, 144. In at least one embodiment, the isolation structure 106 comprises one or more shallow trench isolation (STI) regions. Example materials of the STI regions include, but are not limited to, silicon oxide, silicon nitride, silicon oxynitride, fluoride-doped silicate, and/or any other low k dielectric materials. In some embodiments, the STI thickness is from 50 nm to 200 nm.

In the example configuration in FIG. 4, the gate electrode 152A wraps over the fins 112, 114, 122, 124, the gate electrode 152B wraps over the fins 126, 128, 132, 134, the gate electrode 152C wraps over the fins 136, 138, 142, 144 in corresponding regions of the first, second, third, and fourth active area regions 111, 121, 131, 141. To electrically isolate the gate electrodes 152A-152C from the fins 112, 114, 122, 124, 126, 128, 132, 134, 136, 138, 142, 144, a gate dielectric layer 154 is arranged under and around the gate electrodes 152A-152C, in which the fins 112, 114, 122, 124, 126, 128, 132, 134, 136, 138, 142, 144 are covered by the gate dielectric layer 154. Example materials of the gate dielectric layer 154 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In at least one embodiment, a gate dielectric layer includes multi-layer structure of, for example, $SiO_2$ with a high-k dielectric, or SiON with a high-k dielectric.

In the example configuration in FIG. 4, the gate electrodes 152A-152C are wrapped over the fins 112, 114, 122, 124, 126, 128, 132, 134, 136, 138, 142, 144, and include corresponding a first conductive gate material over the p-well regions 110, 130 and a second conductive gate material over the n-well regions 120, 140. In at least one embodiment, the conductive gate materials include the same conductive material. In at least one embodiment, the conductive gate materials include different conductive materials. In at least one embodiment, the conductive material or materials of at least one of the conductive gate materials is/are selected in accordance with the type of device or transistor.

For example, the gate electrodes 152A-152C serving as CMOSFET gate electrodes may include corresponding work function metal layers. For example, the gate electrode 152A includes an N-type work function metal layer 232 and a P-type work function metal layer 234, the gate electrode 152B includes a P-type work function metal layer 236 and an N-type work function metal layer 238, and the gate electrode 152C includes an N-type work function metal layer 240 and a P-type work function metal layer 242. The N-type work function metal layers 232, 238, 240 are formed over the corresponding p-well regions 110, 130 for forming at least one NMOS over the p-well region 110, 130, and the P-type work function metal layers 234, 236, 242 are formed over the corresponding n-well regions 120, 140 for forming at least one PMOS over the n-well region 120, 140. In some embodiments, at least one of the N-type work function metal layers 232, 238, 240 comprises a metal material that is titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), or tantalum carbon nitride (TaCN). In some embodiments, at least one of the P-type work function metal layers 234, 236, 242 comprises a metal material that is titanium nitride (TiN) or tantalum nitride (TaN).

In at least one embodiment, the gate electrodes 152A-152C may include at least one contact layer over the corresponding work function metal layer to have a low contact resistance. Example materials of the contact layer include, but are not limited to, polysilicon with silicide, refractory materials such as TiN, TaN, TiW, and TiAl, suitable Ti containing work function materials, suitable Ta containing work function materials, suitable Al containing work function materials, suitable W containing work function materials, suitable Cu containing work function materials, and suitable N containing work function materials.

The N-type work function metal layers 232, 238, 240 and the P-type work function metal layers 234, 236, 242 are isolated from the fins 112, 114, 122, 124, 126, 128, 132, 134, 136, 138, 142, 144 by the gate dielectric layer 154 over the p-well regions 110, 130 and the n-well regions 120, 140. In at least one embodiment, the gate dielectric layer 154 has a first portion over the p-well regions 110, 130 and a second portion over the n-well regions 120, 140. In some embodiments, the first and second portions of the gate dielectric layer 154 include the same dielectric material. In some embodiments, the first and second portions of the gate dielectric layer 154 include different dielectric materials. In at least one embodiment, at least one of the first and second portions of the gate dielectric layer 154 includes one or more of $HfO_2$, $Ta_2O_5$ and $Al_2O_3$.

In some embodiments, the gate electrode 152A extends continuously from the p-well region 110 to the n-well region 120, and the N-type work function metal layer 232 is in contact with the P-type work function metal layer 234. In some embodiments, the gate electrode 152B extends continuously from the n-well region 120 to the p-well region 130, and the P-type work function metal layer 236 is in contact with the N-type work function metal layer 238. In some embodiments, the gate electrode 152C extends continuously from the p-well region 130 to the n-well region 140, and the N-type work function metal layer 240 is in contact with the P-type work function metal layer 242. As described previously, a pair of adjacent gate electrode 152A-152C arranged along the X-direction in FIG. 4 may define a gap therebetween. For example, the P-type work function metal layers 234, 236 define a gap therebetween, and the N-type work function metal layers 238, 240 define a gap therebetween. In some embodiments, the gaps can be formed by the etching process which is performed to cut the gate electrode, and the etching process includes photolithography and etching processes.

In some embodiments, the etching process includes an anisotropic etch step and an isotropic etch step, such that at least one of the N-type work function metal layers 232, 238, 240 and the P-type work function metal layers 234, 236, 242 has an end portion in a recess shape. For example, the P-type work function metal layers 234, 236 respectively have end portions 234E, 236E between the fins 124, 126, and the N-type work function metal layers 238, 240 respectively have end portions 238E, 240E between the fins 134, 136.

Each of the end portions 234E, 236E of the P-type work function metal layers 234, 236 has a bottom sidewall 234B, 236B and a top sidewall 234T, 236T, and a distance D1 from the bottom sidewall 234B of the P-type work function metal layer 234 to the bottom sidewall 236B of the P-type work function metal layer 236 is less than a distance D2 from the top sidewall 234T of the P-type work function metal layer 234 to the top sidewall 236T of the P-type work function metal layer 236. Since the distance D1 is less than the distance D2, each of the end portions 234E, 236E of the P-type work function metal layers 234, 236 has a notched profile and can be referred to as a notched corner.

Similarly, Each of the end portions 238E, 240E of the N-type work function metal layers 238, 240 has a bottom sidewall 238B, 240B and a top sidewall 238T, 240T, and a distance D3 from the bottom sidewall 238B of the N-type work function metal layer 238 to the bottom sidewall 240B of the N-type work function metal layer 240 is less than a distance D4 from the top sidewall 238T of the N-type work function metal layer 238 to the top sidewall 240T of the N-type work function metal layer 240. Since the distance D3 is less than the distance D4, each of the end portions 238E, 240E of the N-type work function metal layers 238, 240 has a notched profile and can be referred to as a notched corner.

In at least one embodiment, the first work function layer, the first contact layer and the first gate dielectric layer configure a gate stack structure. Examples of gate stack structures include, but are not limited to, a metals/high-K dielectric structure, an Al/refractory metals/high-K dielectric structure, a W/refractory metals/high-K dielectric structure, a Cu/refractory metals/high-K dielectric structure, and a silicide/high-K dielectric structure. In at least one embodiment, the gate stack structure includes a $Si_3N_4$/metals/high-K dielectric structure in which the metals are selected from the group consisting of Al/refractory metals, W/refractory metals, Cu/refractory metals, silicide, and combinations thereof.

In some embodiments, the first capping layer 212 is formed atop the gate electrodes 152A-152C to serve as a protection layer. For example, the first capping layer 212 can protect underlying portions of the gate electrode 152 against a subsequent self-aligned process. In some embodiments, some portions of the first capping layer 212 are located in the gaps of the gate electrode 152A-152C and in contact with the isolation structure 106 through the gaps. In some embodiments, some portions of the first capping layer 212 are between the N-type work function metal layers or between the P-type work function metal layers. In the example configuration in FIG. 4, a first portion of the first capping layer 212 is between the P-type work function metal layers 234, 236 and in contact with the P-type work function metal layers 234, 236, and a second portion of the first capping layer 212 is between the N-type work function metal layers 238, 240 and in contact with the N-type work function metal layers 238, 240.

The first portion of the first capping layer 212 has a bottom between the bottom sidewalls 234B and 234B and a top between the top sidewalls 234T and 236T. In some embodiments, the P-type work function metal layer 234 has a connecting surface extending from the bottom sidewall 234B to the top sidewall 234T, and the P-type work function metal layer 236 has a connecting surface extending from the bottom sidewall 236B to the top sidewall 236T. In some embodiments, the connecting surfaces are non-parallel with the corresponding top and bottom sidewalls 234T, 236T, 234B, 236B. The top of the first portion of the first capping layer 212 is above and in contact with the connecting surfaces of the P-type work function metal layers 234, 236. In some embodiments, the top of the first portion of the first capping layer 212 is wider than the bottom of the first portion of the first capping layer 212 (i.e., the bottom of the first portion of the first capping layer 212 is narrower than the top of the first portion of the first capping layer 212). In some embodiment, at least one of the connecting surfaces of the P-type work function metal layers 234, 236 may serve as a bottom of the notched corner.

Similarly, the second portion of the first capping layer 212 has a bottom between the bottom sidewalls 238B and 238B and a top between the top sidewalls 240T and 240T. In some embodiments, the N-type work function metal layer 238 has a connecting surface extending from the bottom sidewall 238B to the top sidewall 238T, and the N-type work function metal layer 240 has a connecting surface extending from the bottom sidewall 240B to the top sidewall 240T. In some embodiments, the connecting surfaces are non-parallel with the corresponding top and bottom sidewalls 238T, 240T, 238B, 240B. The top of the second portion of the first capping layer 212 is above and in contact with the connecting surfaces of the N-type work function metal layers 238, 240. In some embodiments, the top of the second portion of the first capping layer 212 is wider than the bottom of the second portion of the first capping layer 212. In some embodiment, at least one of the connecting surfaces of the N-type work function metal layers 238, 240 may serve as a bottom of the notched corner.

In some embodiments, the first capping layer 212 has a thickness thicker than channel regions of the fins 112, 114, 122, 124, 126, 128, 132, 134, 136, 138, 142, 144. In some embodiments, the first capping layer 212 has the thickness in a range from 2 nm to 60 nm. In some embodiments, the first capping layer 212 has a top surface facing away from the isolation structure 106, and the top surface of the first capping layer 212 is in a position higher than the channel regions of the fins 112, 114, 122, 124, 126, 128, 132, 134, 136, 138, 142, 144. In some embodiments, a portion of the first capping layer 212 above the connecting surface (e.g., one of the connecting surfaces of the P-type and N-type work function metal layers) is thicker than the channel region of the fins 112, 114, 122, 124, 126, 128, 132, 134, 136, 138, 142, 144. In some embodiments, a portion of the first capping layer 212 above the connecting surface (e.g., one of the connecting surfaces of the P-type and N-type work function metal layers) has a thickness greater than 2 nm.

The semiconductor device 100 further comprises an interlayer dielectric (ILD) layer over the isolation structure. In the example configuration in FIG. 4, the semiconductor device 100 comprises an ILD layer 244 over the isolation structure 106, the gate electrodes 152A-152C, and the first capping layers 212. Example materials of the ILD layer 244 include, but are not limited to, $SiN_x$, $SiO_x$, SiON, SiC, SiBN, SiCBN, or combinations thereof. In some embodiments, the ILD layer 244 includes an oxide based material and has dielectric constant less than 4. As illustrated in FIG. 4, the ILD layer 244 embeds therein the gate electrodes 152A-152C and the first capping layers 212.

In the example configuration in FIG. 4, the gate contacts 218, 220, 222 are above the corresponding gate electrodes 152A-152C and through the first capping layer 212 and the ILD layer 244. For example, bottoms of the gate contacts 218, 220, 222 are surrounded by the first capping layer 212, and tops of the gate contacts 218, 220, 222 are surrounded by the ILD layer 244. Example materials of the gate contacts 218, 220, 222 include, but are not limited to, Ti, TiN, TaN, Co, Ru, Pt, W, Al, Cu, or combinations thereof. In some embodiments, the gate contacts 218, 220, 222 comprise multiple metal materials.

Figure 5:
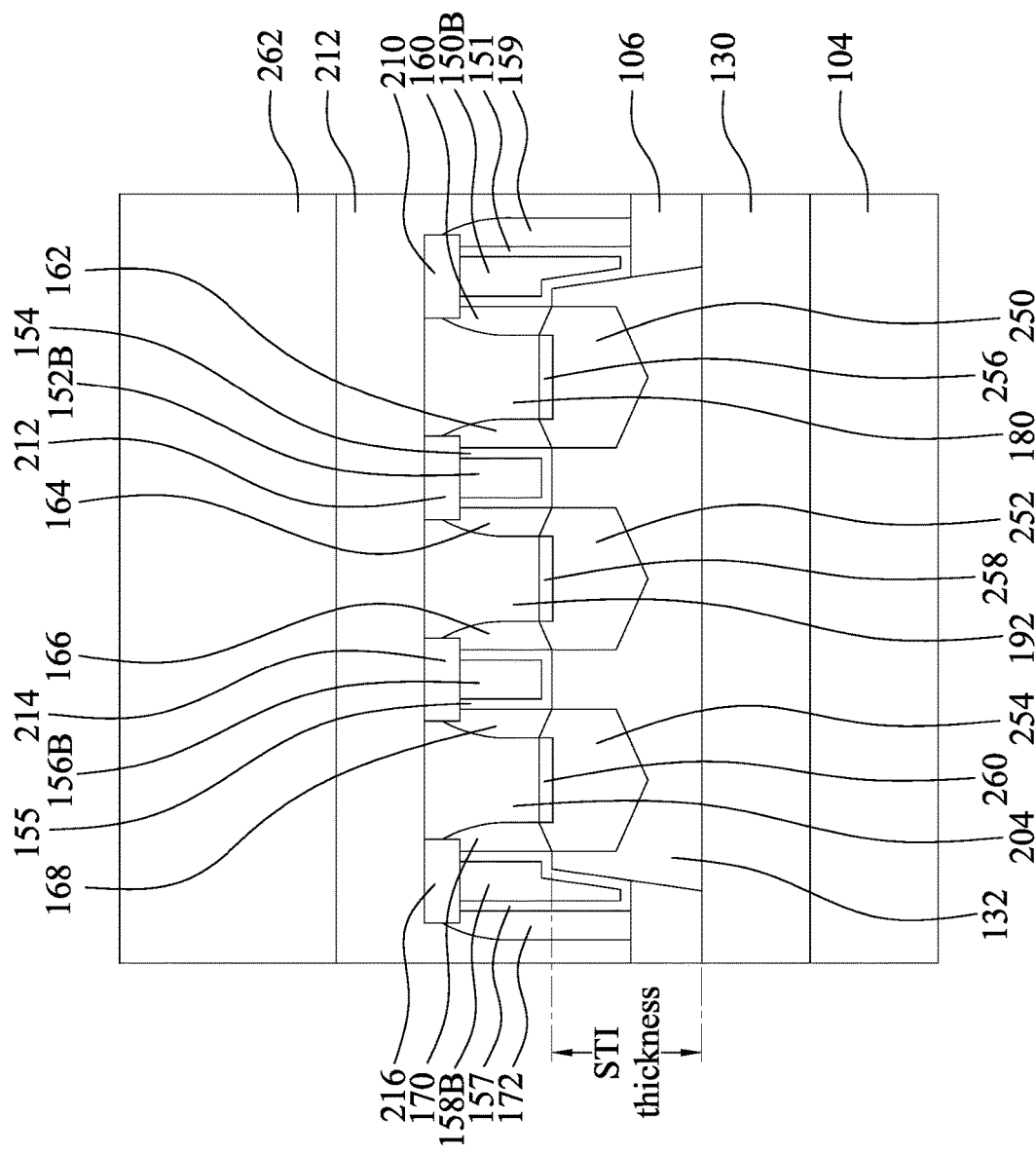
FIGS. 5 and 6 re cross-section views of the semiconductor device.
Figure 6:
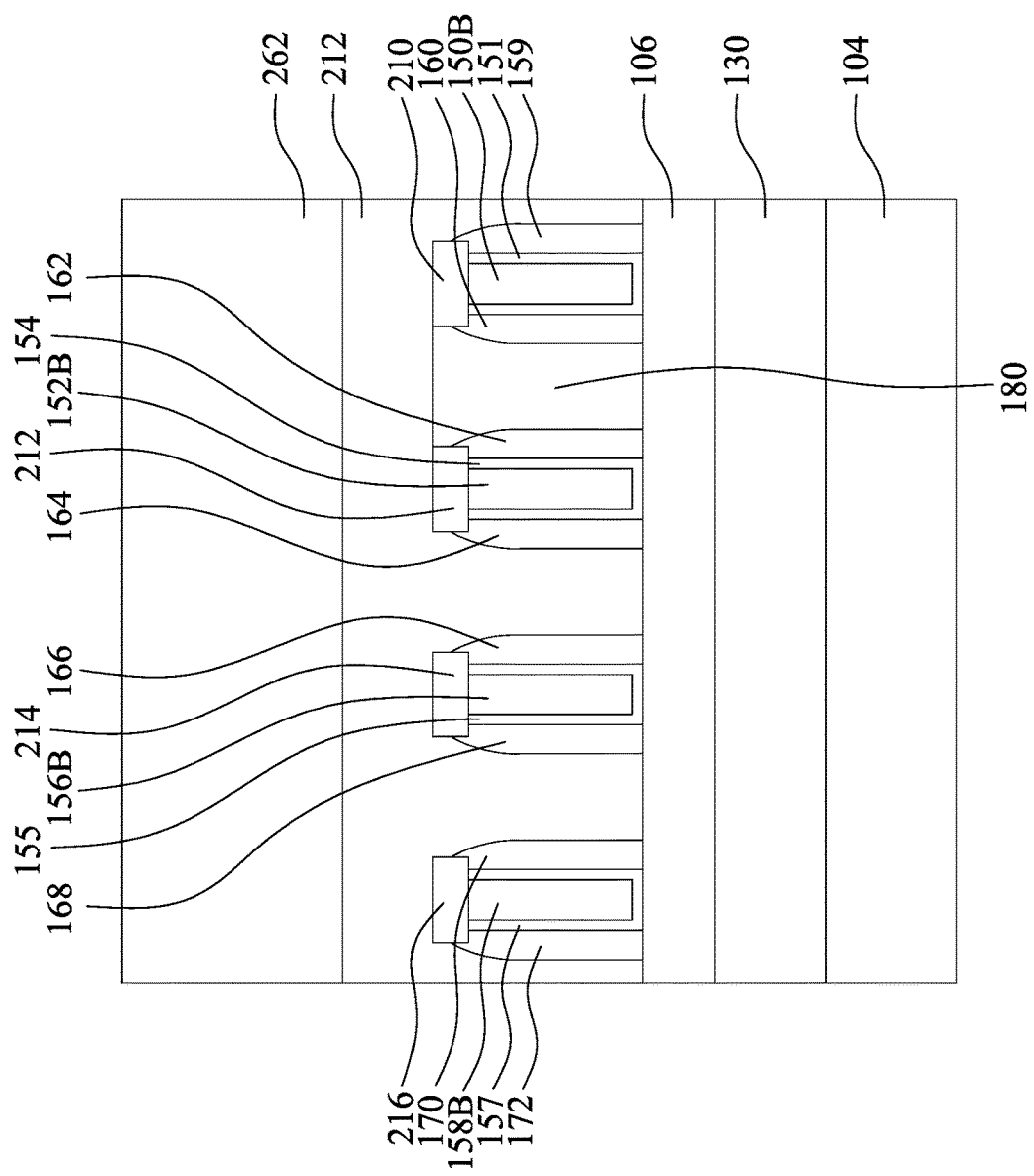

Reference is made to FIGS. 5 and 6 which are cross-section views of the semiconductor device 100. The cross-section view in FIG. 5 is taken along line 5-5 in FIG. 3. The cross-section view in FIG. 6 is taken along line 6-6 in FIG. 3. The configuration of the semiconductor device 100 is described herein with respect to both FIG. 5 and FIG. 6. The structures shown in FIGS. 5 and 6 can be formed by modelling in a layout as depicted in FIG. 3. For example, physical elements or layers can be formed by using the gate electrode or the gate contact illustrated in FIG. 3 as patterns.

As illustrated in FIGS. 5 and 6, the semiconductor device 100 comprises the substrate 104, the p-well region 130, the isolation structure 106 as previously described. In the cross-section in FIG. 5, the isolation structure 106 has a thickness less than the fin 126; however, outside the cross-section shown in FIG. 5, the isolation structure 106 includes regions where the thickness of the isolation structure 106 is higher, as indicated by the arrow designated with "STI thickness" in FIG. 5. In the example configuration in FIGS. 5 and 6, the gate electrodes 150B, 152B, 156B, 158B and the corresponding spacers 159, 160, 162, 164, 166, 168, 170, 172 are over the isolation structure 106. Other arrangements are within the scope of various embodiments. For example, in one or more embodiments, the gate electrodes 150B, 152B, 156B, 158B and/or one or more of the corresponding spacers 159, 160, 162, 164, 166, 168, 170, 172 are partially embedded in the isolation structure 106.

The semiconductor device 100 further comprises gate dielectric layers. In the example configuration in FIGS. 5 and 6, to electrically isolate the gate electrodes 150B, 152B, 156B, 158B from the fin 132, gate dielectric layers 151, 154, 155, 157 are arranged under and around the corresponding gate electrodes 150B, 152B, 156B, 158B. The spacers 159, 160, 162, 164, 166, 168, 170, 172 are over opposite sides of the corresponding gate dielectric layers 151, 154, 155, 157. Example materials of the gate dielectric layers 151, 154, 155, 157 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In at least one embodiment, a first gate dielectric layer includes multi-layer structure of, for example, $SiO_2$ with a high-k dielectric, or SiON with a high-k dielectric.

The first capping layers 210, 212, 214, 216 are over the corresponding gate electrodes 150B, 152B, 156B, 158B. In some embodiments, an etch back process is performed prior to the formation of the first capping layers 210, 212, 214, 216. In some embodiments, after performing the anisotropic etch step and the isotropic etch step, the gate electrodes 150B, 152B, 156B, 158B have the recess-shaped end portions, and then an etch back process is performed, so as to remove some portions of the gate electrodes 150B, 152B, 156B, 158B and the spacers 159, 160, 162, 164, 166, 168, 170, 172. With the etch back process, the gate electrodes 150B, 152B, 156B, 158B and the spacers 159, 160, 162, 164, 166, 168, 170, 172 are collectively recessed to form recesses atop. Next, the first capping layers 210, 212, 214, 216 are formed above the corresponding gate electrodes 150B, 152B, 156B, 158B and the corresponding spacers 159, 160, 162, 164, 166, 168, 170, 172. Since the gate electrodes 150B, 152B, 156B, 158B and the spacers 159, 160, 162, 164, 166, 168, 170, 172 are collectively recessed, the first capping layers 210, 212, 214, 216 are respectively within the recesses of the corresponding gate electrodes 150B, 152B, 156B, 158B and the corresponding spacers 159, 160, 162, 164, 166, 168, 170, 172. For example, the first capping layer 212 is formed within the recess collectively defined by the gate electrode 152, the spacer 162, 164, and the gate dielectric layer 154. In some embodiment, the first capping layer 212 has a bottom surface in contact with the gate electrode 152, the spacer 162, 164, and the gate dielectric layer 154 and a pair of sidewalls in contact with spacer 162, 164.

In the cross-section in FIG. 5, the source/drains 250, 252, 254 are arranged between adjacent gate electrodes 150B, 152B, 156B, 158B. In one or more embodiments, portions of the fin 132 between the adjacent spacers are recessed to form S/D cavities having bottom surfaces lower than the top surface of the fin 132. After the formation of the S/D cavities, the source/drains 250, 252, 254 are produced by epi-growing a strained material in the S/D cavities. In at least one embodiment, the lattice constant of the strained material is different than the lattice constant of the substrate 104. Thus, channel regions of the semiconductor device 100 are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the PMOS device. Examples of the strained material include, but are not limited to, SiGe, SiGeC, SiC, GeSn, SiGeSn, SiP, SiCP and other suitable materials. In at least one embodiment, the strained material for a PMOS device comprises SiGe, SiGeC, Ge, Si, or a combination thereof. In at least one embodiment, the strained material for an NMOS device comprises SiC, SiP, SiCP, Si, or a combination thereof.

Contact plugs are in the corresponding contact areas 180, 192, 204. For the sake of simplicity, the contact plugs are designated by the same reference numerals of the corresponding contact areas. In the example configuration in FIG. 5, three contact plugs 180, 192, 204 are above the fin 132. In the example configuration in FIG. 6, the contact plug 180 is above the p-well region 130 and between the gate electrodes 150B, 152B. Example materials of the contact plugs 180, 192, 204 include, but are not limited to, Ti, TiN, TaN, Co, Ru, Pt, W, Al, Cu, or combinations thereof. In some embodiments, at least one of the contact plugs 180, 192, 204 comprises multiple metal materials. In some embodiment, the contact plugs 180, 192, 204 are self-aligned contact plugs formed by a self-aligned process. When forming the contact plugs 180, 192, 204, a metal layer is deposited over the S/D regions (e.g., the source/drains 250, 252, 254), thermally treated, and then planarized. In some embodiments, the metal layer is planarized by a planarization process including at least one of chemical mechanical polish (CMP) and an etch back step. During the self-aligned process, the spacers 159, 160, 162, 164, 166, 168, 170, 172 and the first capping layers 210, 212, 214, 216 may collectively serve as a mask layer to protect the underlying layers or elements. In some embodiments, silicide regions 256, 258, 260 may be formed between the source/drains 250, 252, 254 and the contact plugs 180, 192, 204. In some embodiments, at least one metal layer is formed on the corresponding source/drains 250, 252, 254, and then it may cause a reaction between the underlying silicon and the metal material of the metal layer to form the silicide regions 256, 258, 260. In some embodiments, the silicide regions 256, 258, 260 include a material selected from titanium silicide, cobalt silicide, nickel silicide, platinum silicide, erbium silicide, or palladium silicide. After the formation of the contact plugs 180, 192, 204, top surfaces of the contact plugs 180, 182, 192, 204 are level with top surfaces of the first capping layers 210, 212, 214, 216.

Since the contact plugs 180, 192, 204 are formed by the self-aligned process, there is a risk of the contact plugs 180, 192, 204 in contact with the underlying gate electrodes. Because the gate electrodes 150B, 152B, 156B, 158B have recess-shaped end portions (see FIG. 4), the risk of the contact plugs 180, 192, 204 in contact with margins of the underlying gate electrodes 150B, 152B, 156B, 158B is reduced. For example, under a situation involving with that the contact plug 180 overlaps the corresponding spacer 162 and thus is close to the end portion of the gate electrode 152B, the end portion (see FIG. 4) of the gate electrode 152B is recessed away from the contact plug 180, and therefore a risk of the contact plug 180 in contact with the margin of the underlying gate electrode 152B is reduced. Moreover, the end portion (see FIG. 4) of the gate electrode 152B is separated from the contact plug 180 by the first capping layer 212, such that the contact plug 180 is isolated from the margin of the underlying gate electrode, so as to avoid accidental short circuiting phenomena.

Accordingly, under the risk of the contact plugs 180, 192, 204 in contact with the margins of the underlying gate electrodes is reduced, a distance between the adjacent end portions of the gate electrode can be controlled. For example, as illustrated in FIG. 4, the distance D1 can be narrowed, so as to increase a chip density of the semiconductor device 100. In some embodiments, the distance D1 illustrated in FIG. 4 is in a range from 2 nm to 50 nm. As such, a contact/poly pitch (CPP) scaling ratio in the semiconductor device 100 and a reliability of the semiconductor device 100 increase as well. Moreover, after the electrodes 150B, 152B, 156B, 158B are recessed to form the recess-shaped end portions, capacitance coupled by a pair of the adjacent end portions is reduced.

As illustrated in FIGS. 5 and 6, after the formation of the contact plugs 180, 192, 204, the ILD layer 212 can be formed over the isolation structure 106, the gate electrodes 150B, 152B, 156B, 158B, the first capping layers 210, 212, 214, 216, and the contact plugs 180, 192, 204. Example materials of the ILD layer 212 include, but are not limited to, $SiN_x$, $SiO_x$, SiON, SiC, SiBN, SiCBN, or combinations thereof. The ILD layer 212 embeds therein the gate electrodes 150B, 152B, 156B, 158B, and/or the corresponding spacers 159, 160, 162, 164, 166, 168, 170, 172. The ILD layer 212 further embeds therein the fins 112, 114, 122, 124, 126, 128, 132, 134, 136, 138, 142, 144. In some embodiments, the ILD layer 212 includes a first portion and a second portion over the first portion. The first portion of the ILD layer 212 is formed prior to the formation of the contact plugs 180, 192, 204 and the second portion of the ILD layer 212 is formed after the formation of the contact plugs 180, 192, 204, so as to embed therein the contact plugs 180, 192, 204. In some embodiments, the semiconductor device 100 may further comprise an intermetal dielectric (IMD) layer 262 above the ILD layer 212, and the IMD layer 262 may embed therein S/D via.

Figure 7:
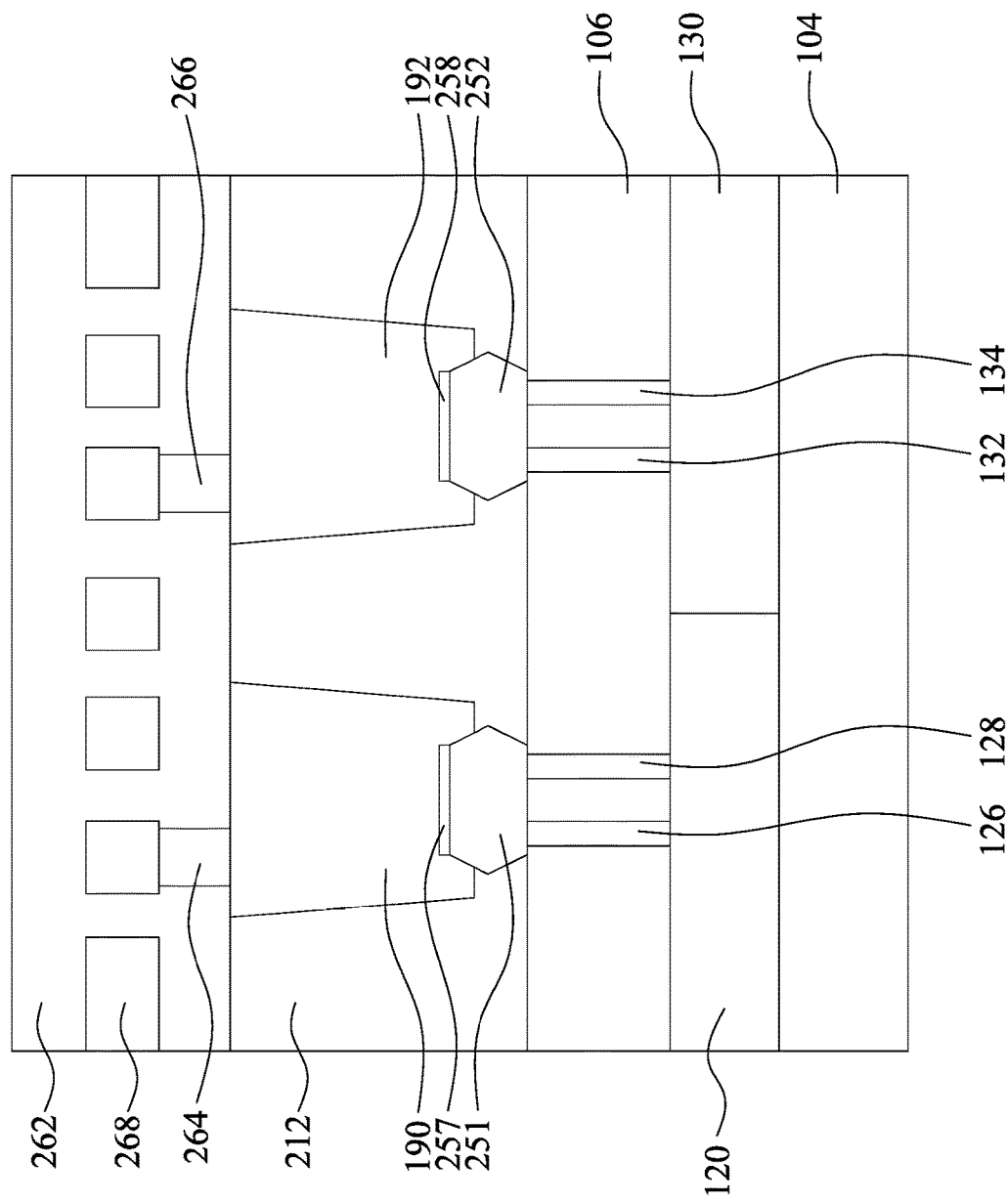
FIG. 7 is a cross-section view of the semiconductor device taken along the S/D region in FIG. 3.

Reference is made to FIG. 7 which is a cross-section view of the semiconductor device 100 taken along the S/D region in FIG. 3. The structure shown in FIG. 7 can be formed by modelling in a layout as depicted in FIG. 3. As illustrated in FIG. 7, the semiconductor device 100 comprises the substrate 104, the n-well region 120, the p-well region 130, the isolation structure 106, the fins 126, 128, 132, 134, and the ILD layer 212, the source/drain 252, and the silicide region 258 as previously described. The semiconductor device 100 further comprises a source/drain 251 and a silicide region 257. In some embodiments, the source/drains 251 is epitaxially grown from the fins 126, 128, and the source/drains 252 is epitaxially grown from the fins 132, 134. Similarly, the silicide regions 257, 258 may be formed on the source/drains 251, 252. Many aspects of the source/drains are the same as or similar to those of the source/drains as depicted in FIG. 5, and thus the detailed explanation may be omitted. The semiconductor device 100 further comprises the contact plugs 190, 192. For the sake of simplicity, the contact plugs are designated by the same reference numerals of the corresponding contact areas illustrated in FIG. 3. Many aspects of the contact plugs are the same as or similar to those of the contact plugs as depicted in FIGS. 5 and 6, and thus the detailed explanation may be omitted.

In some embodiments, the semiconductor device 100 further comprises S/D vias 264, 266 and a conductive layer 268 above the S/D vias 264, 266. The S/D vias 264, 266 are respectively electrically coupled to the contact plugs 190, 192, such that the S/D vias 264, 266 can be configured to electrically couple to the contact plugs 190, 192 to other circuitry. For example, the conductive layer 268 can serve as a first interconnection layer of the semiconductor device 100, and the contact plugs 190, 192 can be electrically couple to conductive layer 268 through the S/D vias 264, 266. In some embodiments, the IMD layer 262 above the ILD layer 212 embeds therein the S/D vias 264, 266 and the conductive layer 268.

FIGS. 8-11 illustrate various processes at various stages of manufacturing a semiconductor device 100 in accordance with some embodiments of the present disclosure. It is understood that additional operations can be provided before, during, and after the processes shown by FIGS. 8-11, and some of the operations described below can be replaced or eliminated, for additional embodiments of the method. The order of the operations/processes may be interchangeable. In the example configurations described with respect to FIGS. 8-11, the semiconductor device comprises FinFET devices. Other arrangements, such as planar MOS devices, are within the scope of various embodiments.

Figure 8:
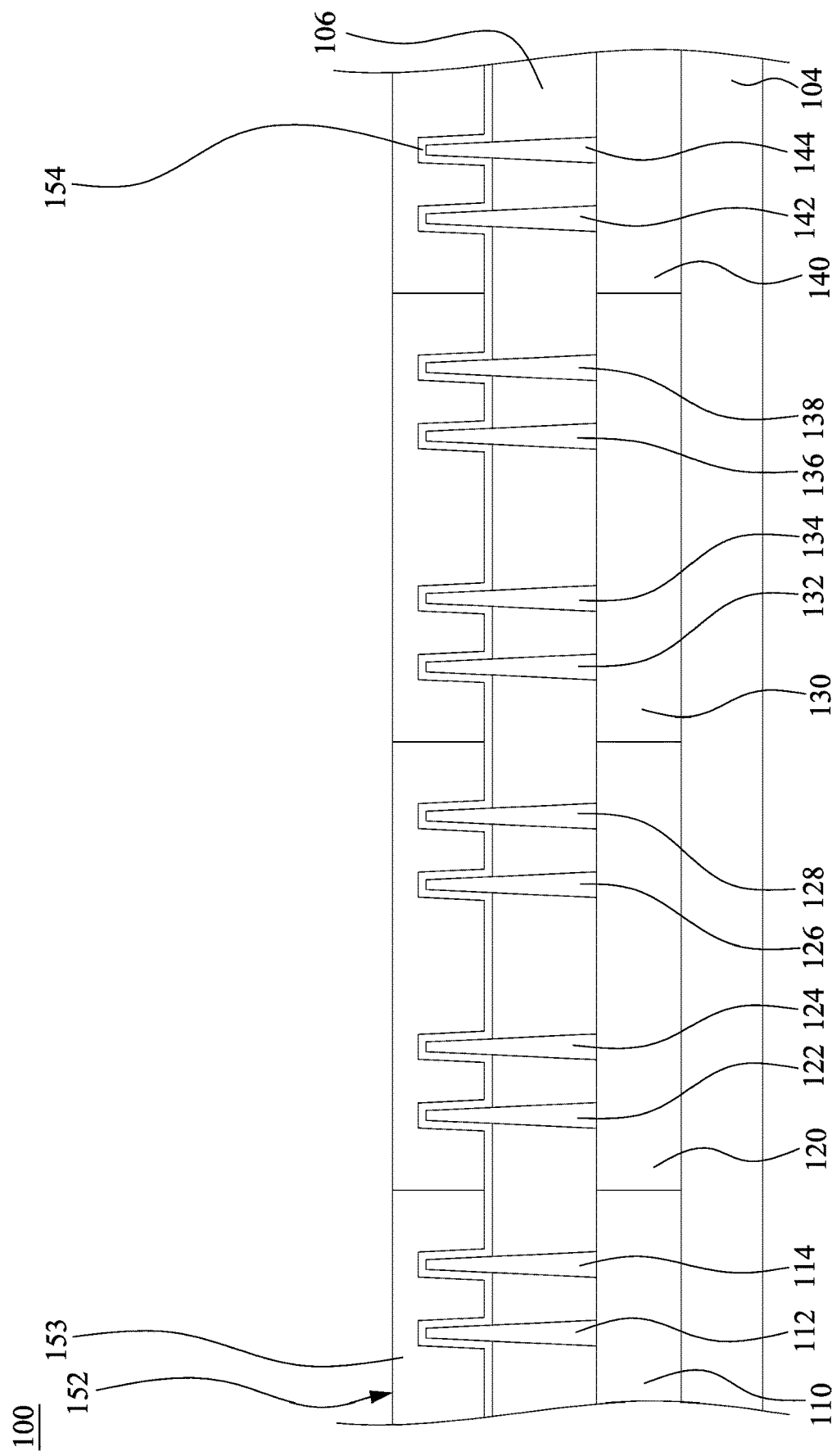
FIGS. 8-11 illustrate various processes at various stages of manufacturing a semiconductor device in accordance with some embodiments of the present disclosure.

As illustrated in FIG. 8, p-well regions 110, 130 and n-well regions and are formed on a substrate 104. In some embodiments, the p-well regions 110, 130 and n-well regions are formed by doping the substrate 104 with corresponding p-type and n-type dopants by ion implantation. Example p-type dopants include, but are not limited to, boron or $BF_2$. Example N-type dopants include, but are not limited to, phosphorus and arsenic.

A plurality of fins are formed over the N-type well region and P-type well region. As shown in FIG. 8, fins 112, 114 are formed over the p-well region 110, fins 122, 124, 126, 128 are formed over the n-well region 120, fins 132, 134, 136, 138 are formed over the p-well region 130, fins 142, 144 are formed over the n-well region 140. Example materials of the fins 112, 114, 122-128, 132-138, 142, 144 include, but are not limited to, silicon, germanium or compound semiconductor. In certain embodiments, the fins 122-128, 142, 144 are formed of SiGe (for strain effect enhancement), and the fins 112, 114, 132-138 are formed of a non-germanium-containing material, for example, Si.

The fins 112, 114, 122-128, 132-138, 142, 144 are formed by one or more suitable process including, but not limited to, deposition, photolithography, and/or etching processes. In an example, the fins are formed by patterning and etching a portion of the silicon substrate 104. In another example, the fins are formed by patterning and etching a silicon layer deposited overlying an insulator layer (for example, an upper silicon layer of a silicon-insulator-silicon stack of an SOI substrate).

An isolation structure 106 is formed over the substrate 104 to define and electrically isolate the fins. In some embodiments, the isolation structure 106 includes shallow trench isolation (STI) regions. Example materials of the isolation structure 106 include, but are not limited to, silicon oxide, silicon nitride, silicon oxynitride, fluoride-doped silicate glass (FSG), a low-K dielectric material, and/or combinations thereof. In an example, the formation of the isolation structure 106 includes filling trenches between the fins, for example, by a chemical vapor deposition (CVD) process, with a dielectric material. In some embodiments, the filled trench has a multi-layer structure, such as a thermal oxide liner layer filled with silicon nitride or silicon oxide.

In some embodiments, a p-type species doped process and an n-type species doped process are performed after the formation of the isolation structure 106. The p-type species doped process comprises a p-well lithography patterning, a p-well doped formation and a p-type channel doping for n-type devices, such as NMOSFETs. The n-type species doped process comprises an n-well lithography pattering, an n-well doped formation and an n-type channel doping for p-type devices, such as PMOSFETs.

A gate electrode 152 and a gate dielectric layer 154 are formed over the substrate 104, crossing the fins. The gate dielectric layer 154 is formed to isolate the fins 112, 114, 122-128, 132-138, 142, 144 from the gate electrode 152 across the fins 112, 114, 122-128, 132-138, 142, 144. In some embodiments, the gate electrode 152 includes a plurality of work function metal layers 153. In some embodiments, the work function metal layers 153 includes N-type work function metal layers over the n-well regions 110, 130 and P-type work function metal layers over the n-well regions 120, 140.

Figure 9:
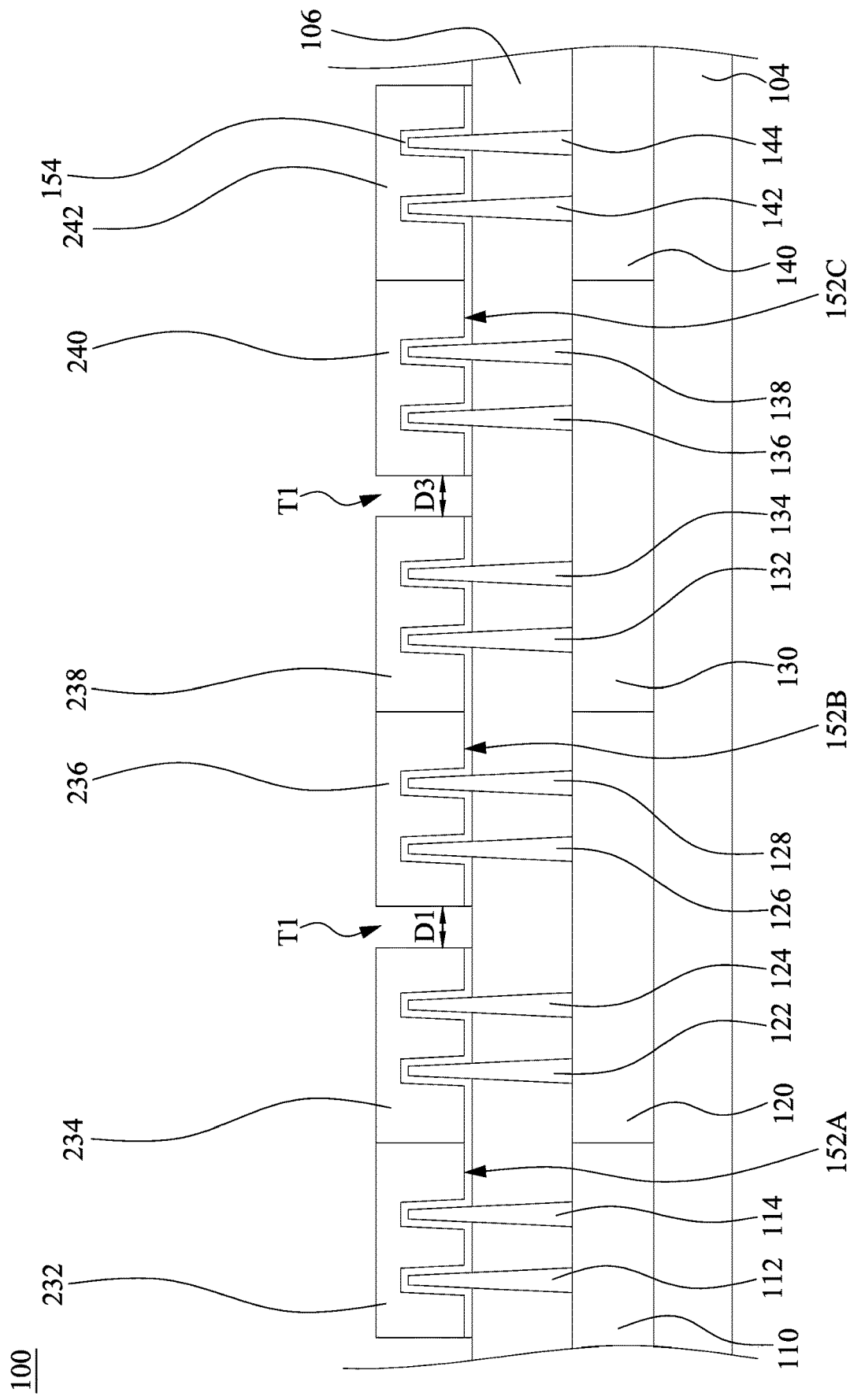

Reference is made to FIG. 9. A first etching step is performed to break the gate electrode 152 (see FIG. 8) into a plurality of gate electrodes 152A, 152B, 152C. In some embodiments, the first etching step is an anisotropic etching. After the anisotropic etching step, the gate electrode 152 (see FIG. 8) is divided into the gate electrodes 152A, 152B, 152C. For example, after the anisotropic etching step, the gate electrode 152A includes a N-type work function metal layer 232 and a P-type work function metal layer 234, the gate electrode 152B includes a P-type work function metal layer 236 and an N-type work function metal layer 238, and the gate electrode 152C includes an N-type work function metal layer 240 and a P-type work function metal layer 242 are formed. In some embodiments, the N-type work function metal layers 232, 238, 240 are over the corresponding p-well regions 110, 130, and the P-type work function metal layers 234, 236, 242 are over the corresponding n-well regions 120, 140. In some embodiments, a plurality of first trenches T1 (or can be referred to as first openings) are formed by the anisotropic etching step, such that the adjacent gate electrodes 152A-152C are separated from each other by the first trenches T1. In some embodiments, during the anisotropic etching step, some portion of the gate electrode 152 (see FIG. 8) and the gate dielectric layer 154 are removed to form the first trenches T1, and the isolation structure 106 is exposed from the first trenches T1. The first trenches T1 are between the corresponding work function metal layers. For example, the first trench T1 is between the P-type work function metal layers 234, 236, and a width of the first trench T1 may be equal to a distance D1 from the P-type work function metal layer 234 to the P-type work function metal layer 236.

Figure 10:
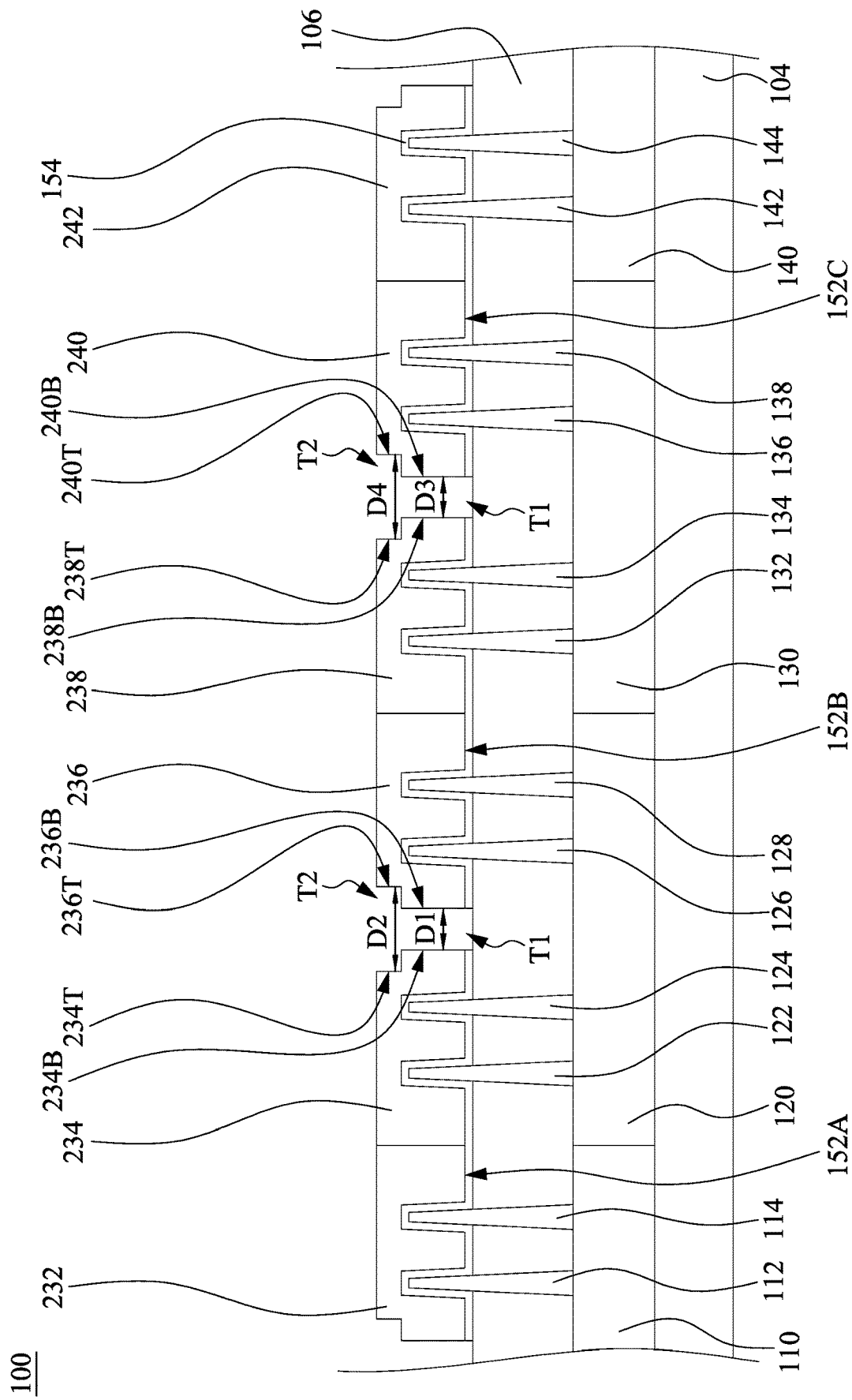

Reference is made to FIG. 10. A second etching step is performed to remove some portion of the gate electrodes 152A-152C such that a plurality of stepped holes are formed. In some embodiments, the second etching step is an isotropic etching. After the isotropic etching step, a plurality of second trenches T2 (or can be referred to as second openings) are formed on the first trenched T1. In some embodiments, during the isotropic etching step, some portion of the gate electrodes 152A-152C are removed and tops of the first trenches T1 are widened, so as to form the second trenches T2. In some embodiments, the second trenches T2 are in communication with the corresponding first trenches T1, such that the first trenches T1 and the second trenches T2 may collectively serve as a plurality of stepped holes. In some embodiments, a pair of the adjacent gate electrodes of the gate electrodes 152A-152C are separated from each other by the stepped holes.

In some embodiments, the first trenches T1 are defined by bottom sidewalls of the work function metal layers, and the second trenches T2 are defined by top sidewalls of the work function metal layers. For example, bottom sidewalls 234B, 236B of the P-type work function metal layers 234, 236 can define the first trench T1 therebetween, and bottom sidewalls 238B, 240B of the N-type work function metal layers 238, 240 can define the first trench T1 therebetween. Top sidewalls 234T, 236T of the P-type work function metal layers 234, 236 can define the second trench T2 therebetween, and bottom sidewalls 238T, 240T of the N-type work function metal layers 238, 240 can define the second trench T2 therebetween. A width of at least one of the second trench T2 can be defined by a pair of adjacent top sidewalls of the work function metal layers. For example, a width of the second trench T2 may be equal to a distance D2 from the top sidewall 234T of the P-type work function metal layers 234 to the top sidewall 236T of the P-type work function metal layer 236, and the width of the second trench T2 is greater than the width of the first trench T1.

Figure 11:
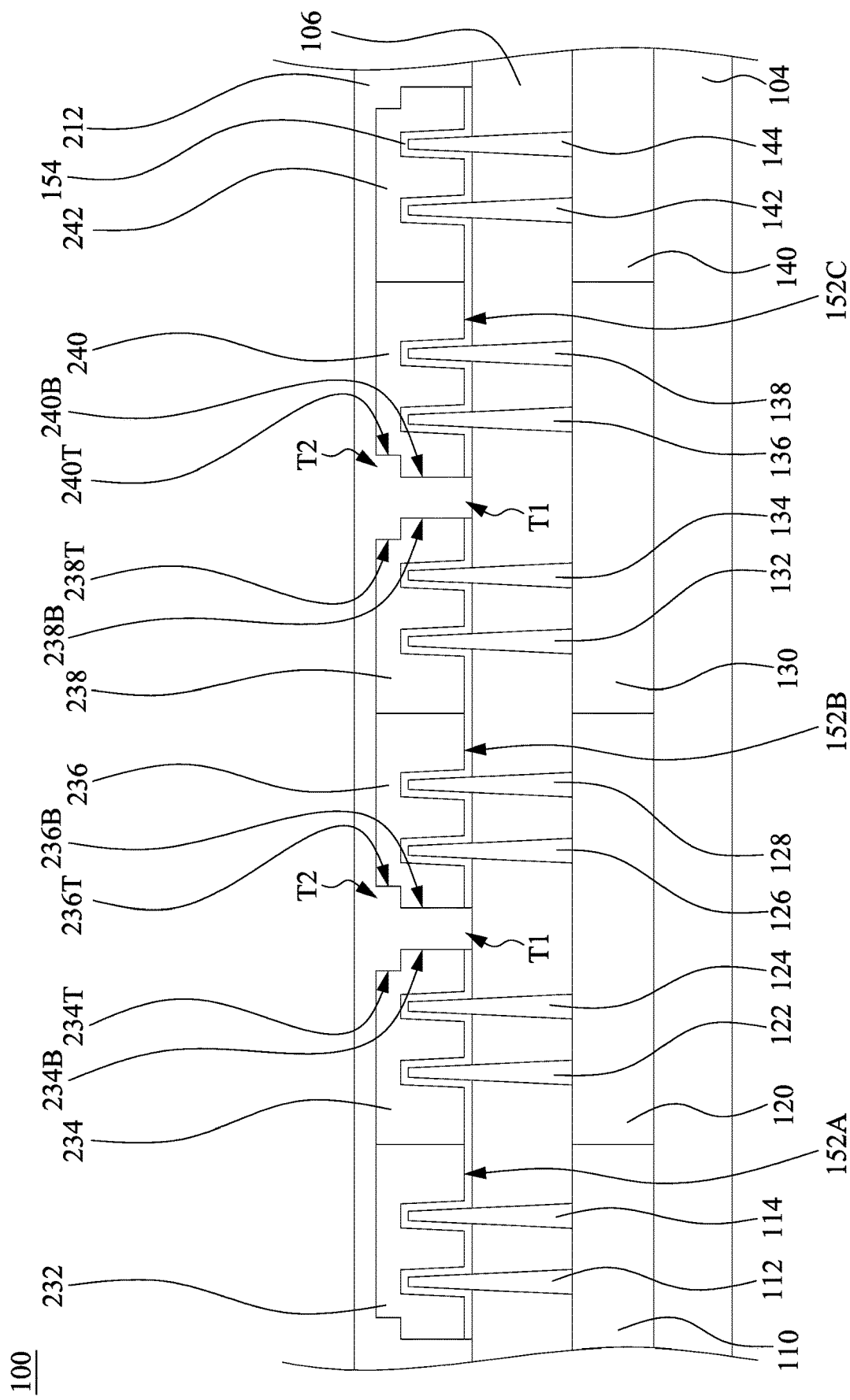

Reference is made to FIG. 11. A capping layer 212 is formed to cover the gate electrodes 152A-152C and the isolation structure 106. The capping layer 212 can be formed by suitable deposition techniques, such as a chemical vapor deposition (CVD) process. In some embodiments, the formation of the capping layer 212 includes filling first and second trenches T1, T2 with a dielectric material. In some embodiments, after filling the dielectric material, a planarization process such as chemical mechanical polish (CMP) can be performed to remove the excess the capping layer 212. Example materials of the first capping layer 212 include, but are not limited to, a high-k dielectric layer, an interfacial layer, and/or combinations thereof. In some embodiments, the capping layer 212 may include a nitride based dielectric, a metal oxide dielectric, hafnium oxide (HfO2), tantalum oxide (Ta2O5), titanium oxide (TiO2), zirconium oxide (ZrO2), aluminum oxide (Al2O3), yttrium oxide (Y2O3), or combinations thereof.

Afterward, an ILD layer is deposited over the capping layer 212 and a plurality of gate contacts are formed in the ILD layer, as the resulting structure shown in FIG. 4. For example, as shown in FIG. 4, the ILD layer 244 is formed to cover the capping layer 212. Example materials of the ILD layer 244 include, but are not limited to, silicon oxide, spin-on glass (SOG), fluorinated silica glass (FSG), carbon doped silicon oxide, other suitable dielectric materials, and/or combinations thereof. In some embodiments, the ILD layer 244 is formed by a high density plasma (HDP) process. Thereafter, a plurality of gate contact holes are formed in the ILD layer 244. In some embodiments, a layer of photoresist (PR) is applied to a top surface of the ILD layer 244, and the PR is patterned using, for example, suitable lithography processes. An etching process is performed to the ILD layer 244 using the patterned PR as an etching mask, resulting in the gate contact holes over the gate electrodes 152A-152C. After the gate contact holes are formed, some portions of the gate electrodes 152A-152C are exposed, and the gate contacts 218, 220, 222 can be formed by depositing a metal layer in the gate contact holes, followed by performing a CMP process to remove excess metal outside the gate contact holes. In some embodiments, the metal layer may include aluminum (Al), tungsten (W), cobalt (Co), copper (Cu), or combinations thereof, and may be deposited by CVD, PVD, plating, and/or other suitable processes.

Figure 12:
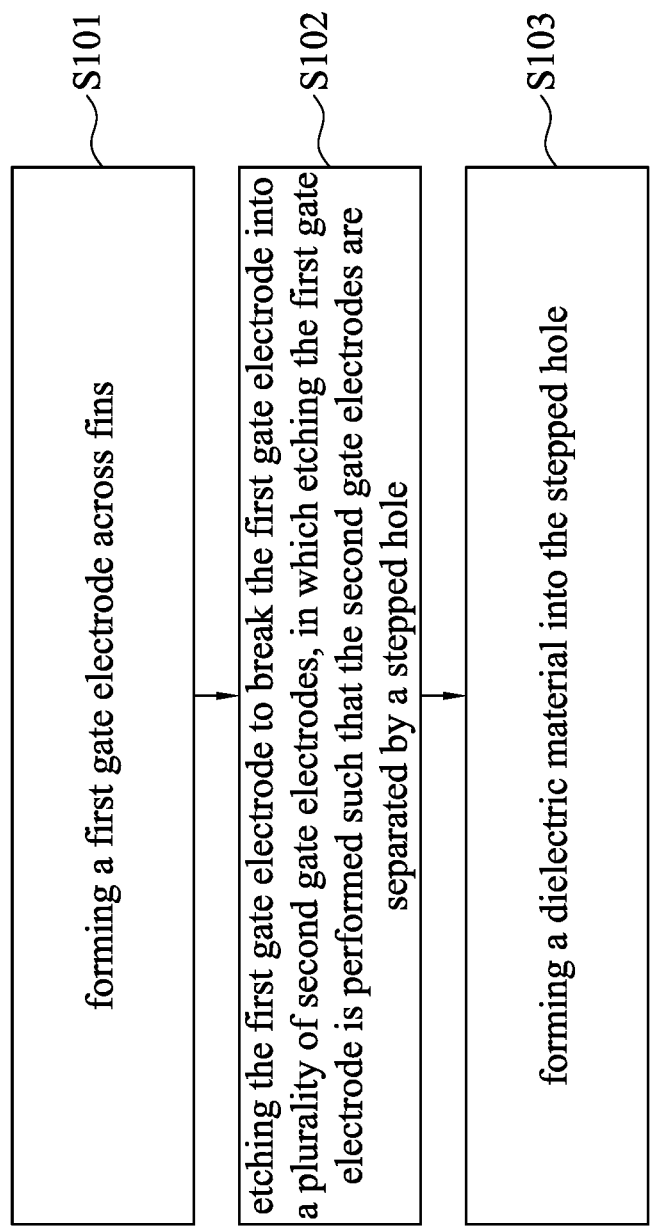
FIG. 12 is a flow chart of a method of manufacturing a semiconductor device, in accordance with some embodiments.

FIG. 12 is a flow chart of a method of manufacturing a semiconductor device, in accordance with some embodiments. At operation S101 in FIG. 12, a first gate electrode is formed across fins. For example, as described with respect to FIG. 8, the gate electrode 152 and the gate dielectric layer 154 are formed over the substrate 104, in which the gate electrode 152 and the gate dielectric layer 154 are across the fins 112, 114, 122-128, 132-138, 142, 144. In some embodiments, the gate electrode 152 includes a plurality of work function metal layers 153. In some embodiments, the work function metal layers 153 includes N-type work function metal layers over the n-well regions 110, 130 and P-type work function metal layers over the n-well regions 120, 140.

At operation S102, the first gate electrode is etched to break into a plurality of second gate electrodes, in which etching the first gate electrode is performed such that the second gate electrodes are separated by a stepped hole. For example, as illustrated in FIGS. 9 and 10, some portion of the gate electrode 152 are removed to form the first trenches T1 and thereafter the tops the first trenches T1 are widened to form the second trenches T2 in communication with the corresponding first trenches T1. In some embodiments, the second trenches T2 are wider than the first trenches T1. In some embodiments, the second trenches T2 in communication with the corresponding first trenches T1 may collectively serve as the stepped holes to separate the gate electrodes 152A-152C. At operation S104, a dielectric material is formed into the stepped hole. For example, as described with respect to FIG. 11, the capping layer 212 made of a dielectric material is formed to cover the gate electrode 152 and the isolation structure 106, and the first and second trenches T1, T2 are filled with the capping layer 212.

Figure 13:
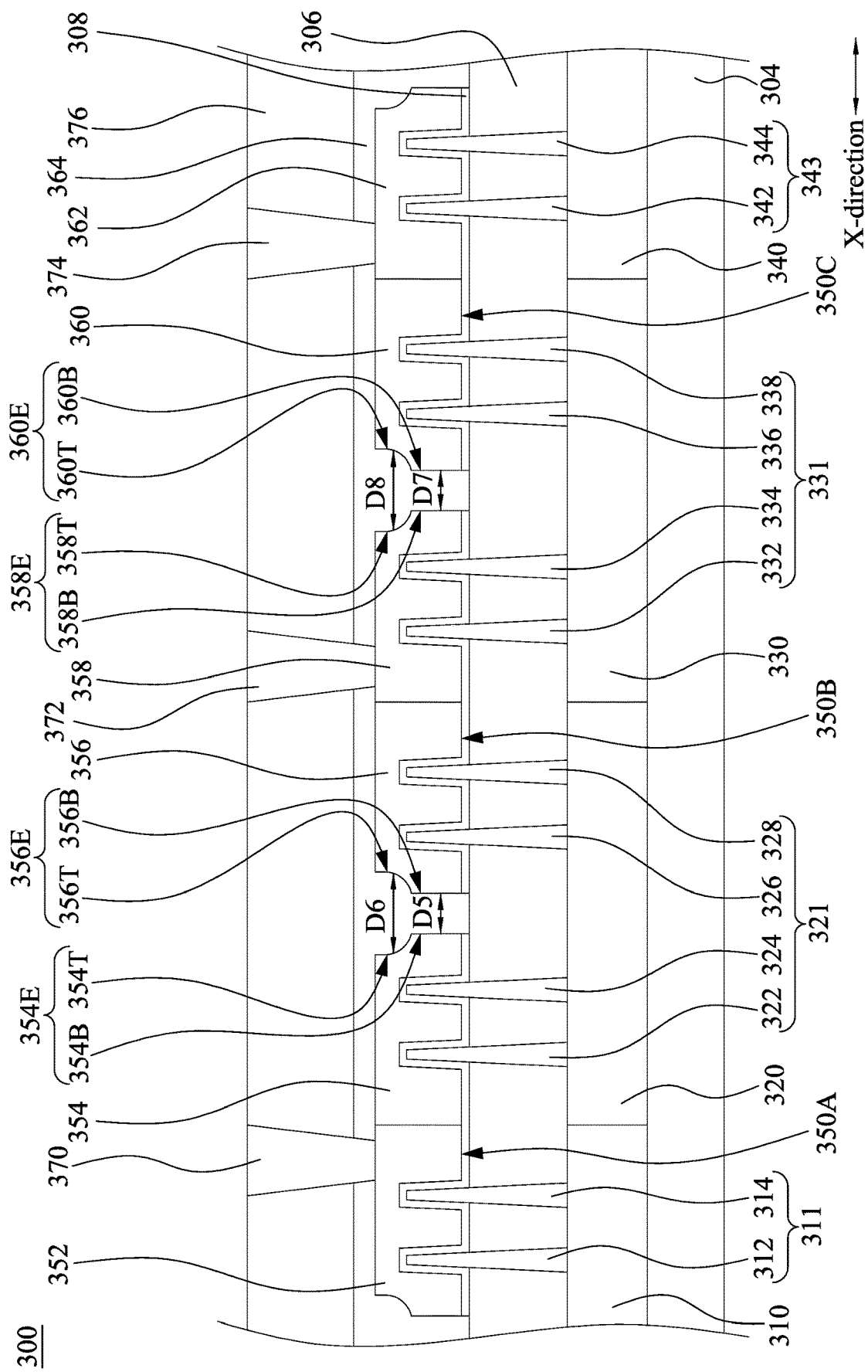
FIG. 13 illustrates a cross-section view of a semiconductor device according to some embodiments of the disclosure.

Reference is made to FIG. 13, which illustrates a cross-section view of a semiconductor device 300 according to some embodiments of the disclosure. Many aspects of the semiconductor device 300 are the same as or similar to those of the semiconductor device 100 as depicted in FIG. 4. For example, the semiconductor device 300 includes a first active area region 311 with fins 312, 314, a second active area region 321 with fins 322, 324, 326, 328, a third active area region 331 with fins 332, 334, 336, 338, a fourth active area region 341 with fins 342, 344, p-well regions 310, 330, n-well regions 320, 340, an isolation structure 306, a gate dielectric layer 308, a first capping layer 364, gate contacts 370, 372, 374, and an ILD layer 376, and thus the detailed explanation may be omitted. Different from the semiconductor device 100, the semiconductor device 300 includes gate electrodes 350A, 350B, 350C having curved end portions 354E, 356E, 358E, 360E different than the end portions 234E, 236E, 238E, 240E illustrated in FIG. 4.

The gate electrodes 350A, 350B, 350C serving as CMOS-FET gate electrodes includes N-type work function metal layers and P-type work function metal layers. For example, the gate electrode 350A includes an N-type work function metal layer 352 and a P-type work function metal layer 354, the gate electrode 350B includes a P-type work function metal layer 356 and an N-type work function metal layer 358, and the gate electrode 350C includes an N-type work function metal layer 360 and a P-type work function metal layer 362. The N-type work function metal layers 352, 358, 360 are formed over the corresponding p-well regions 310, 330 for forming at least one NMOS over the p-well region 310, 330, and the P-type work function metal layers 354, 356, 362 are formed over the corresponding n-well regions 320, 340 for forming at least one PMOS over the n-well region 320, 340. Many aspects of the gate electrodes 350A-350C including the N-type work function metal layers 352, 358, 360 and the P-type work function metal layers 354, 356, 362 are the same as or similar to those of the gate electrodes 152A-152C as depicted in FIG. 4, and thus the detailed explanation may be omitted.

In the example configuration in FIG. 13, a pair of the adjacent gate electrodes 350A-350C define a gap therebetween. For example, the P-type work function metal layers 354, 356 define a gap therebetween, and the N-type work function metal layers 358, 360 define a gap therebetween. In some embodiments, the gaps can be formed by a pattern process including photolithography and etching processes. In some embodiments, the etching process includes an anisotropic etch step and an isotropic etch step, such that at least one of the N-type work function metal layers 352, 358, 360 and the P-type work function metal layers 354, 356, 362 has an end portion in a curved shape.

For example, the P-type work function metal layers 354, 356 respectively have end portions 354E, 356E between the fins 324, 326. Each of the end portions 354E, 356E of the P-type work function metal layers 354, 356 has a bottom sidewall 354B, 356B and a top sidewall 354T, 356T. In some embodiments, the bottom sidewall 354B of the end portion of the P-type work function metal layer 354 has a profile different than a profile of the top sidewall 354T of the end portion of the P-type work function metal layer 354. In some embodiments, the bottom sidewall 354B of the end portion 354E of the P-type work function metal layer 354 can be referred to as a vertical surface, and the top sidewall 354T of the end portion 354E of the P-type work function metal layer 354 can be referred to as a curved surface connecting to the bottom sidewall 354B. In some embodiments, the bottom sidewall 356B of the end portion 356E of the P-type work function metal layer 356 has a profile different than a profile of the top sidewall 356T of the end portion 356E of the P-type work function metal layer 356. In some embodiments, a distance D5 from the bottom sidewall 354B of the P-type work function metal layer 354 to the bottom sidewall 356B of the P-type work function metal layer 356 is less than a distance D6 from the top sidewall 354T of the P-type work function metal layer 354 to the top sidewall 356T of the P-type work function metal layer 356. In some embodiments, a distance between the top sidewall 354T of the P-type work function metal layer 354 and the top sidewall 356T of the P-type work function metal layer 356 increases along an upward direction of FIG. 13 (i.e., the upward direction of FIG. 13 is parallel to a direction from the substrate 304 toward the gate electrode 350). Since the distance D5 is less than the distance D6, each of the end portions 354E, 356E of the P-type work function metal layers 354, 356 has a notched profile and can be referred to as a notched corner.

Similarly, the N-type work function metal layers 358, 360 respectively have end portions 358E, 360E between the fins 334, 336. Each of the end portions 358E, 360E of the N-type work function metal layers 358, 360 has a bottom sidewall 358B, 360B and a top sidewall 358T, 360T. In some embodiments, the bottom sidewall 358B of the end portion 358E of the N-type work function metal layer 358 has a profile different than a profile of the top sidewall 358T of the end portion 358E of the N-type work function metal layer 358. In some embodiments, the bottom sidewall 360B of the end portion 360E of the N-type work function metal layer 360 can be referred to as a vertical surface, and the top sidewall 360T of the end portion 360E of the N-type work function metal layer 360 can be referred to as a curved surface connecting to the bottom sidewall 360B. In some embodiments, a distance D7 from the bottom sidewall 358B of the N-type work function metal layer 358 to the bottom sidewall 360B of the N-type work function metal layer 360 is less than a distance D8 from the top sidewall 358T of the N-type work function metal layer 358 to the top sidewall 360T of the N-type work function metal layer 360. In some embodiments, a distance between the top sidewall 358T of the N-type work function metal layer 358 and the top sidewall 360T of the N-type work function metal layer 360 increases along an upward direction of FIG. 13 (i.e., the upward direction of FIG. 13 is parallel to a direction from the substrate 304 toward the gate electrode 350). Since the distance D7 is less than the distance D8, each of the end portions 358E, 360E of the N-type work function metal layers 358, 360 has a notched profile and can be referred to as a notched corner.

The first capping layer 364 formed atop the gate electrodes 350A-350C to serve as a protection layer, such that the first capping layer 364 can protect underlying portions of the gate electrodes 350A-350C against a subsequent self-aligned process. In some embodiments, some portions of the first capping layer 364 are located in the gaps of the gate electrodes 350A-350C and in contact with the isolation structure 306 through the gaps. In some embodiments, some portions of the first capping layer 364 are between the N-type work function metal layers or between the P-type work function metal layers. In the example configuration in FIG. 13, a first portion of the first capping layer 364 is between the P-type work function metal layers 354, 356 and in contact with the P-type work function metal layers 354, 356, and a second portion of the first capping layer 364 is between the N-type work function metal layers 358, 360 and in contact with the N-type work function metal layers 358, 360.

The first portion of the first capping layer 364 has a bottom between the bottom sidewalls 354B and 354B and a top between the top sidewalls 354T and 356T. The top of the first portion of the first capping layer 364 is above the bottom of the first portion of the first capping layer 364 and is collectively received by the top sidewalls 354T and 356T. Accordingly, the top of the first portion of the first capping layer 364 has a curved surface, and an interface between the top of the first portion of the first capping layer 364 and each of the top sidewalls 354T and 356T is curved as well. In some embodiments, the first portion of the first capping layer 364 and each of the end portions 354E, 356E forms an interface, and the interface has a curved segment and a bottom segment extending from a bottom of the curved segment. Similarly, the second portion of the first capping layer 364 has a bottom between the bottom sidewalls 358B and 358B and a top between the top sidewalls 360T and 360T. The top of the second portion of the first capping layer 364 is above the bottom of the second portion of the first capping layer 364 and is collectively received by the top sidewalls 358T and 360T. Accordingly, the top of the second portion of the first capping layer 364 is curved, and an interface between the top of the second portion of the first capping layer 364 and each of the top sidewalls 358T and 360T is curved as well. In some embodiments, the second portion of the first capping layer 364 and each of the end portions 358E, 360E forms an interface, and the interface has a curved segment and a bottom segment extending from a bottom of the curved segment. In some embodiments, the first capping layer 364 has a thickness thicker than channel regions of the fins. In some embodiments, first capping layer 364 has the thickness in a range from 2 nm to 60 nm. Such arrangement (e.g., modifying the end portions of the gate electrode to be curved) may be advantageous to make the process more flexible, thereby improving yield of the semiconductor device 300.

In the example configuration in FIG. 13, the gate contacts 370, 372, 374 are above the gate electrodes 350A-350C and are surrounded by the first capping layer 364 and the ILD layer 376. For example, bottoms of the gate contacts 370, 372, 374 are surrounded by the first capping layer 364, and tops of the gate contacts 370, 372, 374 are surrounded by the ILD layer 376. Example materials of the gate contacts 370, 372, 374 include, but are not limited to, Ti, TiN, TaN, Co, Ru, Pt, W, Al, Cu, or combinations thereof.

Figure 14:
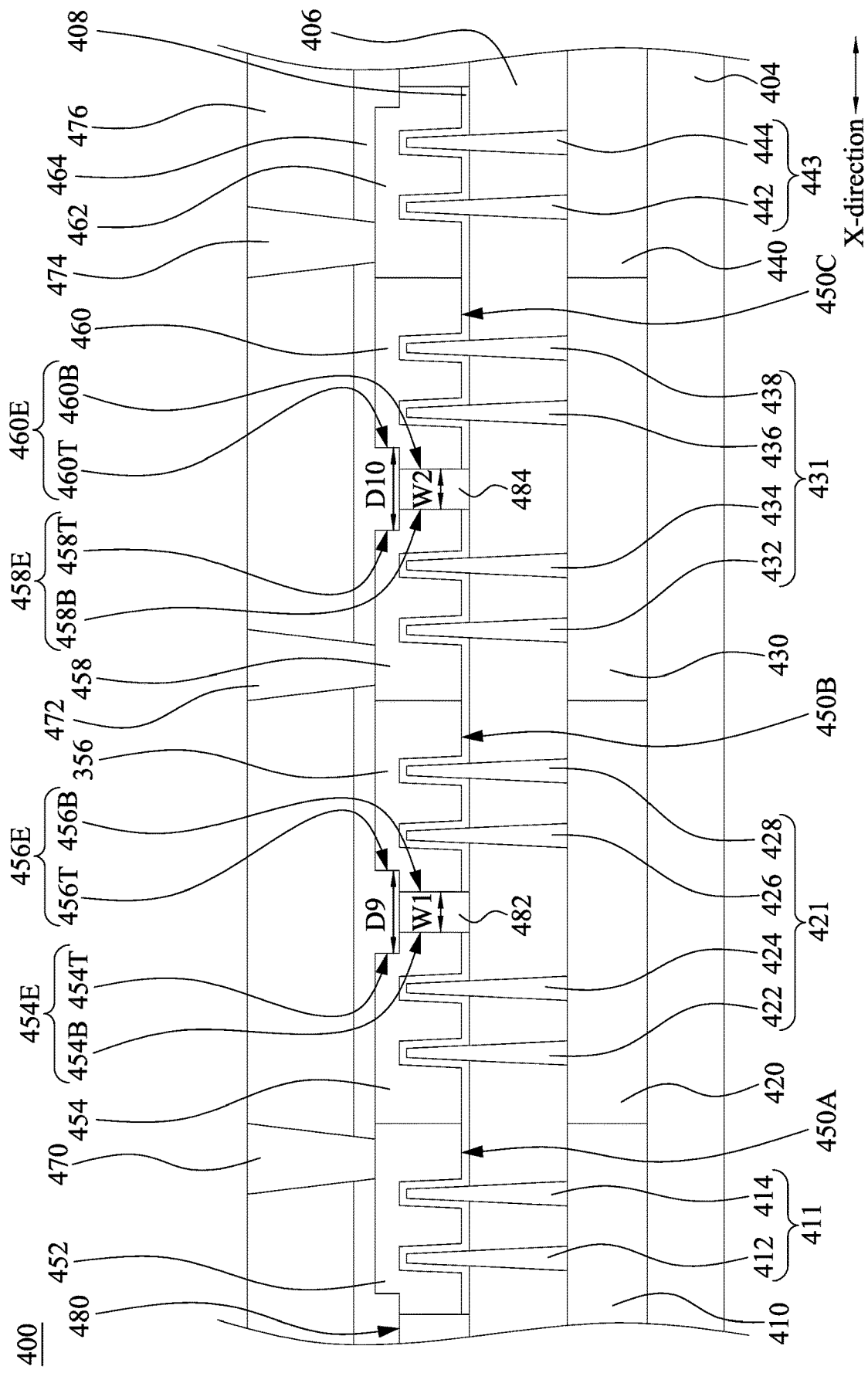
FIG. 14 illustrates a cross-section view of a semiconductor device according to some embodiments of the disclosure.

Reference is made to FIG. 14, which illustrates a cross-section view of a semiconductor device 400 according to some embodiments of the disclosure. Many aspects of the semiconductor device 400 are the same as or similar to those of the semiconductor device 100 as depicted in FIG. 4. For example, the semiconductor device 400 includes a first active area region 411 with fins 412, 414, a second active area region 421 with fins 422, 424, 426, 428, a third active area region 431 with fins 432, 434, 436, 438, a fourth active area region 441 with fins 442, 444, p-well regions 410, 430, n-well regions 420, 440, an isolation structure 406, a gate dielectric layer 408, a first capping layer 464, gate contacts 470, 472, 474, and an ILD layer 476, and thus the detailed explanation may be omitted. Different from the semiconductor device 100, the semiconductor device 400 includes a second capping layer 480 between the isolation structure 406 and the first capping layer 464.

The semiconductor device 400 includes gate electrodes 450A, 450B, 450C serving as CMOSFET gate electrodes and including N-type work function metal layers and P-type work function metal layers. For example, the gate electrode 450A includes an N-type work function metal layer 452 and a P-type work function metal layer 454, the gate electrode 450B includes a P-type work function metal layer 456 and an N-type work function metal layer 458, and the gate electrode 450C includes an N-type work function metal layer 460 and a P-type work function metal layer 462. The N-type work function metal layers 452, 458, 460 are formed over the corresponding p-well regions 410, 430 for forming at least one NMOS over the p-well region 410, 430, and the P-type work function metal layers 454, 456, 462 are formed over the corresponding n-well regions 420, 440 for forming at least one PMOS over the n-well region 420, 440. Many aspects of the gate electrodes 450A-450C including the N-type work function metal layers 452, 458, 460 and the P-type work function metal layers 454, 456, 462 are the same as or similar to those of the gate electrodes 152A-152C as depicted in FIG. 4, and thus the detailed explanation may be omitted.

In the example configuration in FIG. 14, a pair of the adjacent gate electrodes 450A-450C define a gap therebetween. For example, the P-type work function metal layers 454, 456 define a gap therebetween, and the N-type work function metal layers 458, 460 define a gap therebetween. In some embodiments, the gaps can be formed by a pattern process including photolithography and etching processes. In some embodiments, the etching process includes an anisotropic etch step and an isotropic etch step, such that at least one of the N-type work function metal layers 452, 458, 460 and the P-type work function metal layers 454, 456, 462 has an end portion in a recess shape.

For example, the P-type work function metal layers 454, 456 respectively have end portions 454E, 456E between the fins 424, 426. Each of the end portions 454E, 456E of the P-type work function metal layers 454, 456 has a bottom sidewall 454B, 456B and a top sidewall 454T, 456T. The top sidewalls 454T, 456T are above the corresponding bottom sidewalls 454B, 456B. The end portion 454E of the P-type work function metal layer 454 has a connecting surface extending from the bottom sidewall 454B to the top sidewall 454T, and the end portion 456E of the P-type work function metal layer 456 has a connecting surface extending from the bottom sidewall 456B to the top sidewall 456T. A distance from the top sidewall 454T of the P-type work function metal layer 454 to the top sidewall 456T of the P-type work function metal layer 456 is labelled as D9. Similarly, the N-type work function metal layers 458, 460 respectively have end portions 458E, 460E between the fins 434, 436. Each of the end portions 458E, 460E of the N-type work function metal layers 458, 460 has a bottom sidewall 458B, 460B and a top sidewall 458T, 460T. The top sidewalls 458T, 460T are above the corresponding bottom sidewalls 458B, 460B. The end portion 458E of the N-type work function metal layer 458 has a connecting surface extending from the bottom sidewall 458B to the top sidewall 458T, and the end portion 460E of the N-type work function metal layer 460 has a connecting surface extending from the bottom sidewall 460B to the top sidewall 460T. A distance from the top sidewall 458T of the N-type work function metal layer 458 to the top sidewall 460T of the N-type work function metal layer 460 is labelled as D10. Each of the end portions 454E, 456E, 458E, 460E of the P-type work function metal layers 454, 456 and the N-type work function metal layers 458, 460 has a notched profile and can be referred to as a notched corner.

The first capping layer 464 formed atop the gate electrodes 450A-450C to serve as a protection layer, such that the first capping layer 464 can protect underlying portions of the gate electrodes 450A-450C against a subsequent self-aligned process. In some embodiments, some portions of the first capping layer 464 are located in the gaps of the gate electrodes 450A-450C. In some embodiments, some portions of the first capping layer 464 are between the N-type work function metal layers or between the P-type work function metal layers. In the example configuration in FIG. 14, a first portion of the first capping layer 464 is between the top sidewalls 454T, 456T of the end portions 454E, 456E of the P-type work function metal layers 454, 456, and a second portion of the first capping layer 464 is between the top sidewalls 458T, 460T of the end portions 458E, 460E of the N-type work function metal layers 458, 460. Furthermore, the first capping layer 464 is in contact with the connecting surfaces of the P-type and N-type work function metal layers 454, 456, 458, 460.

The second capping layer 480 between the isolation structure 406 and the first capping layer 464 includes a plurality of portions in the gaps defined by the gate electrodes 450A-450C. For example, a first portion 482 of the second capping layer 480 is within the gap defined by the bottom sidewalls 454B, 456B of the end portions 454E, 456E of the P-type work function metal layers 454, 456 and has a width W1 less than the distance D9. Similarly, a second portion 484 of the second capping layer 480 is within the gap defined by the bottom sidewalls 458B, 460B of the end portions 458E, 460E of the N-type work function metal layers 458, 460 and has a width W2 less than the distance D10. In some embodiments, an entirety of the first capping layer 464 is separated from the isolation structure 406 by the second capping layer 480. Example materials of the second capping layer 480 include, but are not limited to, a high-k dielectric layer, an interfacial layer, and/or combinations thereof. For example, the second capping layer 480 may include, a nitride based dielectric, a metal oxide dielectric, silicon nitride (Si3N4), hafnium oxide (HfO2), tantalum oxide (Ta2O5), titanium oxide (TiO2), zirconium oxide (ZrO2), aluminum oxide (Al2O3), yttrium oxide (Y2O3), or combinations thereof. In some embodiments, the portions of the second capping layer 480 are covered by the first capping layer 464. For example, the first and second portions 482, 484 are covered by the first capping layer 464, and the first capping layer 464 has a portion wider than at least one of the first and second portions 482, 484 of the second capping layer 480. In some embodiments, the first and second capping layers 464, 480 may include different materials. In some embodiments, the second capping layer 480 has a dielectric constant lower than a dielectric constant of the first dielectric layer 464.

In some embodiments, the formation of the second capping layer 480 is performed after a first etch step and prior to a second etch step. For example, after the formation of the gate electrodes 450A-450C, the first etch step is performed to cut a gate electrode and to form the bottom sidewalls 454B, 456B, 458B, 460B, and then the second capping layer 480 is form to fill the gaps defined by the bottom sidewalls 454B, 456B, 458B, 460B. After the formation of the second capping layer 480, the second etch step is performed to remove some portion of the gate electrodes 450A-450C above the second capping layer 480, such that the recess-shaped end portions 454E, 456E, 458E, 460E of the gate electrodes 450A-450C are formed. In some embodiments, the first etch step is an anisotropic etch step, and the second etch step is an isotropic etch step. The first capping layer 464 is then formed atop the gate electrodes 450A-450C, so as to cover the second capping layer 480 and the recess-shaped end portions of the gate electrodes 450A-450C. Such processes may be advantageous to make the process more flexible, thereby improving yield of the semiconductor device 400.

In the example configuration in FIG. 14, the gate contacts 470, 472, 474 are above the gate electrodes 450A-450C and are surrounded by the first capping layer 464 and the ILD layer 476. For example, bottoms of the gate contacts 470, 472, 474 are surrounded by the first capping layer 464, and tops of the gate contacts 470, 472, 474 are surrounded by the ILD layer 476. Example materials of the gate contacts 470, 472, 474 include, but are not limited to, Ti, TiN, TaN, Co, Ru, Pt, W, Al, Cu, or combinations thereof.

Figure 15:
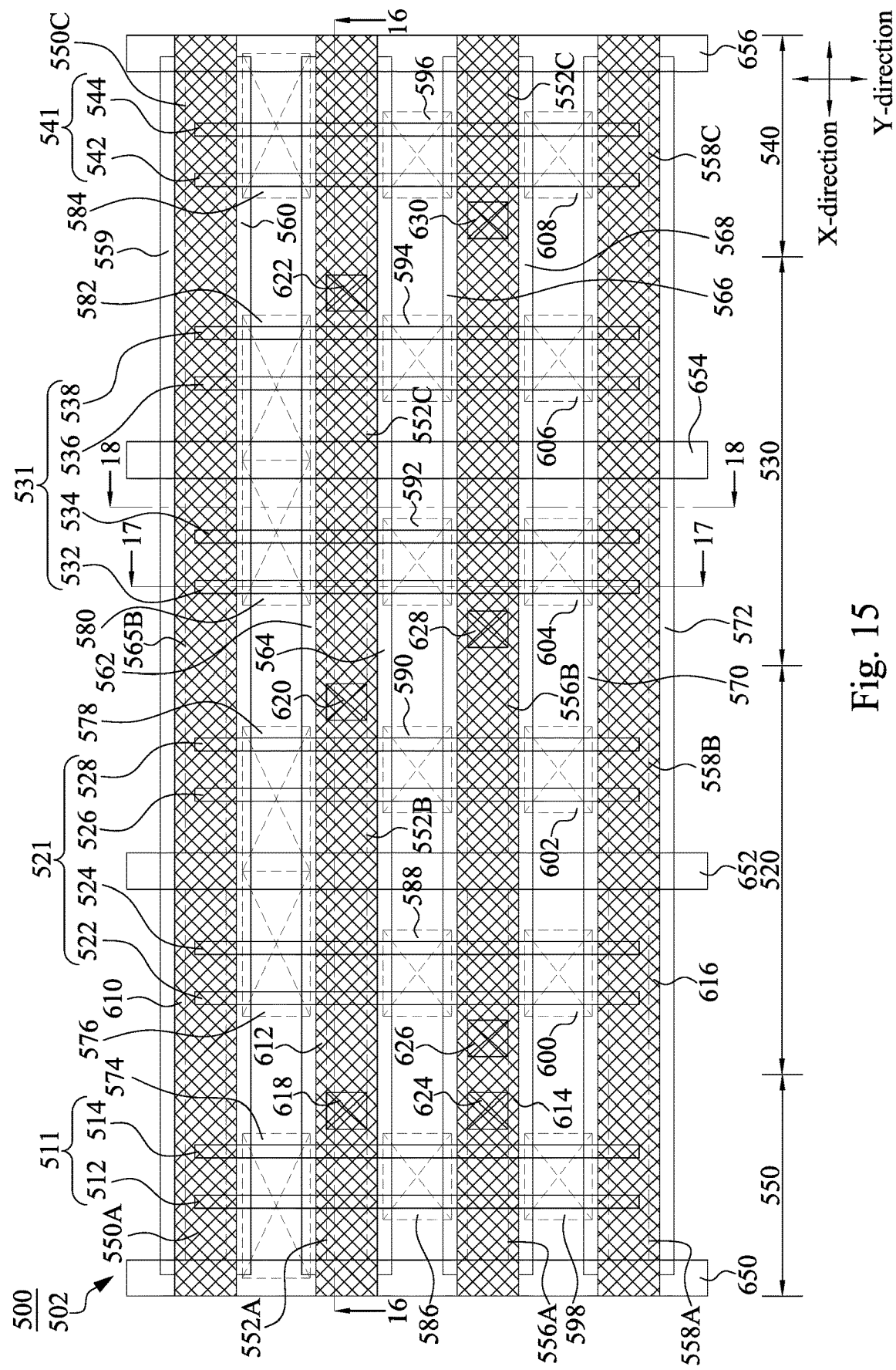
FIG. 15 illustrates a top view of a layout corresponding to a circuit of a semiconductor device according to some embodiments of the present disclosure.

Reference is made to FIG. 15, which illustrates a top view of a layout corresponding to a circuit 502 of a semiconductor device 500 according to some embodiments of the present disclosure. Many aspects of the circuit 502 are the same as or similar to those of the circuit 102 of the semiconductor device 100 as depicted in FIG. 3. For example, the circuit 502 includes a first active area region 511 with fins 512, 514, a second active area region 521 with fins 522, 524, 526, 528, a third active area region 531 with fins 532, 534, 536, 538, a fourth active area region 541 with fins 542, 544, a plurality of gate electrodes 550A, 550, 550C, 552A, 552B, 552C, 556A, 556B, 556C, 558A, 558B, 558C, a plurality of spacers 559, 560, 562, 564, 566, 568, 570, 572, a plurality of contact areas 574, 576, 578, 580, 582, 584, 586, 588, 590, 592, 594, 596, 598, 600, 602, 604, 606, 608, a plurality of first capping layers 610, 612, 614, 616, and a plurality of gate contacts 618, 620, 622, 624, 626, 628, 630, and thus the detailed explanation may be omitted.

Different from the circuit 102 of the semiconductor device 100, the circuit 502 of the semiconductor device 500 further includes a plurality of dielectric fins 650, 652, 654, 656 arranged along a X-direction of the layout illustrated in FIG. 15 and extending along a Y-direction of the layout illustrated in FIG. 15. The dielectric fins 650, 652, 654, 656 overlap the gate electrodes 550A-550C, 552A-552C, 556A-556C, 558A-558C, the spacers 559, 560, 562, 564, 566, 568, 570, 572, and the first capping layers 610, 612, 614, 616. In some embodiments, the dielectric fins 650, 652, 654, 656 can be formed by a single dielectric material or by multiple dielectric materials in a combination. Example materials of the dielectric fins 650, 652, 654, 656 include, but are not limited to, a high-k dielectric layer, an interfacial layer, and/or combinations thereof. For example, the dielectric fins 650, 652, 654, 656 may include a nitride based dielectric, a metal oxide dielectric, hafnium oxide (HfO2), tantalum oxide (Ta2O5), titanium oxide (TiO2), zirconium oxide (ZrO2), aluminum oxide (Al2O3), yttrium oxide (Y2O3), or combinations thereof.

Figure 16:
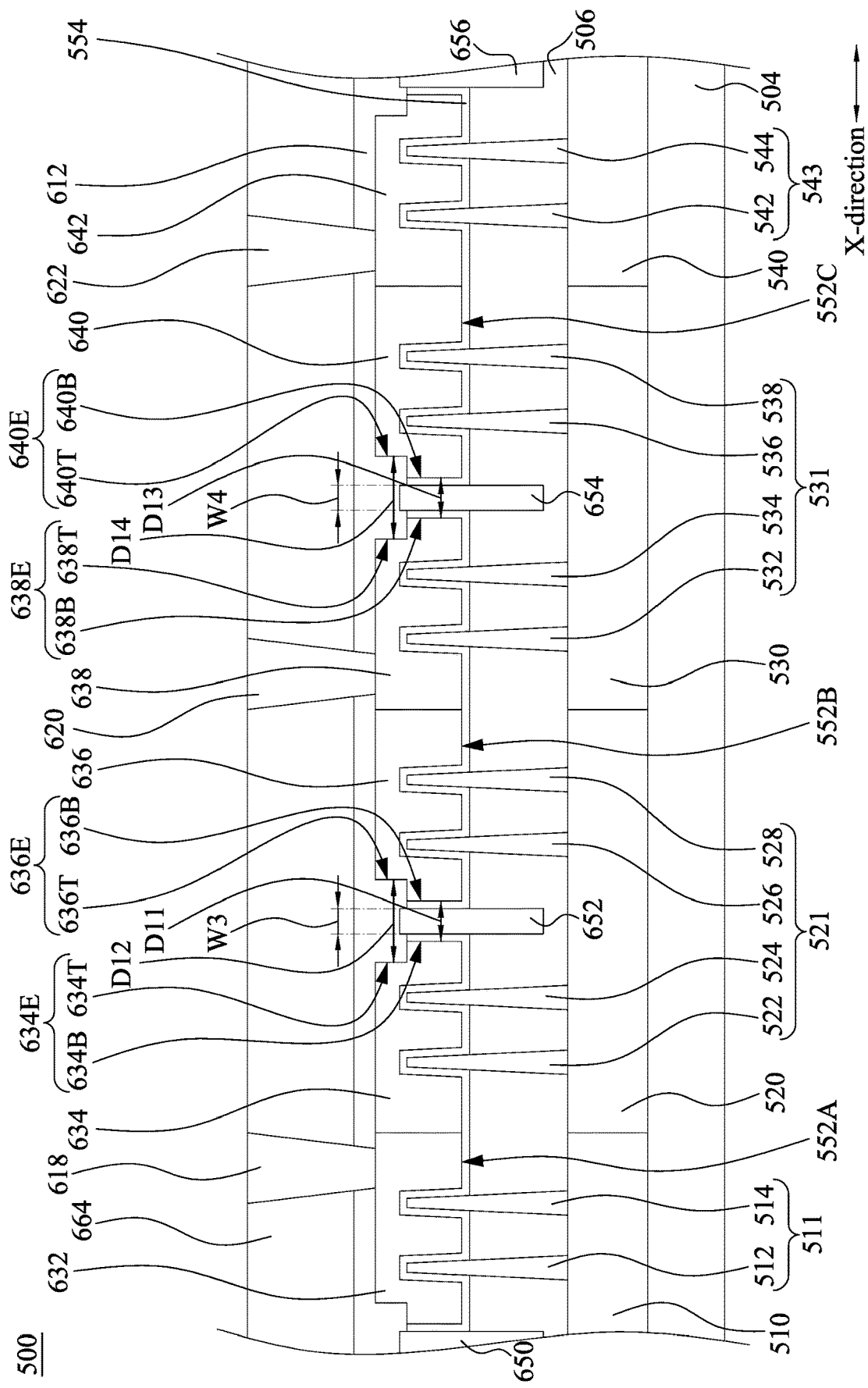
FIG. 16 is a cross-section view taken along line 16-16 in FIG. 15.

Reference is made to FIG. 16, which is a cross-section view taken along line 16-16 in FIG. 15. The structures shown in FIG. 16 can be formed by modelling in a layout as depicted in FIG. 15. For example, physical elements or layers can be formed by using the gate electrode or the gate contact illustrated in FIG. 15 as patterns.

Many aspects of the semiconductor device 500 are the same as or similar to those of the semiconductor device 100 as depicted in FIG. 4. For example, the semiconductor device 500 includes a first active area region 511 with fins 512, 514, a second active area region 521 with fins 522, 524, 526, 528, a third active area region 531 with fins 532, 534, 536, 538, a fourth active area region 541 with fins 542, 544, p-well regions 510, 530, n-well regions 520, 540, an isolation structure 506, a gate dielectric layer 554, a first capping layer 612, gate contacts 618, 620, 622, and an ILD layer 644, and thus the detailed explanation may be omitted. Different from the semiconductor device 100 as depicted in FIG. 4, the semiconductor device 500 further includes a plurality of dielectric fins 650, 652, 654, 656 arranged along a X-direction of FIG. 16.

The dielectric fins 650, 652, 654, 656 are between the isolation structure 506 and the first capping layer 612. In some embodiments, at least one of the dielectric fins 650, 652, 654, 656 has a bottom portion surrounded by the isolation structure 506 and a top portion above the bottom portion. Accordingly, at least one of the dielectric fins 650, 652, 654, 656 may protrudes from the isolation structure 506. In some embodiments, the gate dielectric layer 554 adheres to the top portions of the dielectric fins 650, 652, 654, 656. In some embodiments, the dielectric fins 650, 652, 654, 656 are separated from the corresponding p-well and n-well regions 510, 520, 530, 540 by the isolation structure 506. In some embodiments, at least one of the dielectric fins 650, 652, 654, 656 has a top surface facing away from the isolation structure 506 and in a position higher than the fins 512, 514, 522, 524, 526, 528, 532, 534, 536, 538, 542, 544.

In some embodiments, the dielectric fins 650, 652, 654, 656 are formed after the formation of the isolation structure 506 and prior to the formation of the gate dielectric layer 554. In some embodiments, after the fins 512, 514, 522, 524, 526, 528, 532, 534, 536, 538, 542, 544 are formed, the isolation structure 506 can be formed by depositing at least one first dielectric material, such as a oxide-based dielectric material, so as to cover the fins 512, 514, 522, 524, 526, 528, 532, 534, 536, 538, 542, 544. In some embodiments, the depositing is performed by a chemical vapor deposition (CVD) process. During the deposition process, the isolation structure 506 may have different thickness due to a dishing effect, and thus at least one portion of the isolation structure 506 may be in a concave shape. For example, due to the dishing effect, the isolation structure 506 may have a concave between the adjacent fins 524, 526 or between the adjacent fins 534, 536. At least one second dielectric material then can be deposited on the isolation structure 506 to cover the isolation structure 506, in which the second dielectric material is received by the concaves of the isolation structure 506. After depositing the second dielectric material, a planarization process, such as CMP, is performed to remove an excess portion of the second dielectric material until reaching the isolation structure 506, such that the isolation structure 506 is exposed. In some embodiments, after the planarization process, remaining portions of the second dielectric material serve as the dielectric fins 650, 652, 654, 656. In some embodiments, a selective etching process is performed after the planarization process, such that some portions of the remaining isolation structure 506 are removed and the fins 512, 514, 522, 524, 526, 528, 532, 534, 536, 538, 542, 544 are exposed therefrom. In some embodiments, after the portions of the remaining isolation structure 506 are removed by the selective etching process, at least one trench collectively defined by the isolation structure 506 and the corresponding dielectric fins 650, 652, 654, 656 is formed to expose the fins 512, 514, 522, 524, 526, 528, 532, 534, 536, 538, 542, 544, in which the trench may have a depth in a range from about 30 nm to about 80 nm.

The semiconductor device 500 further includes gate electrodes 552A-552C serving as CMOSFET gate electrodes and including N-type work function metal layers 632, 638, 640 and P-type work function metal layers 634, 636, 642. For example, the gate electrode 552A includes an N-type work function metal layer 632 and a P-type work function metal layer 634, the gate electrode 552B includes a P-type work function metal layer 636 and an N-type work function metal layer 638, and the gate electrode 552C includes an N-type work function metal layer 640 and a P-type work function metal layer 642. The N-type work function metal layers 632, 638, 640 are formed over the corresponding p-well regions 510, 530 for forming at least one NMOS over the p-well region 510, 530, and the P-type work function metal layers 634, 636, 642 are formed over the corresponding n-well regions 520, 540 for forming at least one PMOS over the n-well region 520, 540.

In the example configuration in FIG. 16, a pair of the adjacent gate electrodes 552A-552C define a gap therebetween. For example, the P-type work function metal layers 634, 636 define a gap therebetween, and the N-type work function metal layers 638, 640 define a gap therebetween. In some embodiments, the gaps can be formed by the patterning process including photolithography and etching processes. In some embodiments, prior to the patterning process, the dielectric fins 650, 652, 654, 656 are covered by some portions of the gate electrodes 552A-552C, and these portions of the gate electrodes 552A-552C are then removed by performing the patterning process. In some embodiments, the patterning process is performed to remove the portions of the gate electrodes 552A-552C covering the dielectric fins 650, 652, 654, 656 until exposing the dielectric fins 650, 652, 654, 656. Since the patterning process is terminated at the time that the dielectric fins 650, 652, 654, 656 are exposed, the depth of the gaps between a pair of the adjacent work function metal layers can be controlled. Therefore, it can prevent the gate electrodes 552A-552C from removing too much, so as to improve yield of the semiconductor device 500.

After the patterning process, at least one of the N-type work function metal layers 632, 638, 640 and the P-type work function metal layers 634, 636, 642 has an end portion in a recess shape, and at least one of the end portions has a notched profile and can be referred to as a notched corner. For example, the P-type work function metal layers 634, 636 respectively have end portions 634E, 636E between the fins 524, 526. Each of the end portions 634E, 636E of the P-type work function metal layers 634, 636 has a bottom sidewall 634B, 636B and a top sidewall 634T, 636T. The top sidewalls 634T, 636T are above the corresponding bottom sidewalls 634B, 636B. The end portion 634E of the P-type work function metal layer 634 has a connecting surface extending from the bottom sidewall 634B to the top sidewall 634T, and the end portion 636E of the P-type work function metal layer 636 has a connecting surface extending from the bottom sidewall 636B to the top sidewall 636T. In some embodiments, the dielectric fin 652 may protrudes from a space from the bottom sidewalls 634B, 636B, such that the dielectric fin 652 has a top surface in a position higher than the connecting surfaces of the P-type work function metal layers 634, 636. In some embodiments, the dielectric fin 652 has a width W3 less than a distance D11 from the bottom sidewall 634B of the P-type work function metal layer 634 to the bottom sidewall 636B of the P-type work function metal layer 636, and the distance D11 is less than a distance D12 from the top sidewall 634T of the P-type work function metal layer 634 to the top sidewall 636T of the P-type work function metal layer 636. Furthermore, In some embodiments, a distance from the dielectric fin 652 to the bottom sidewall 634B of the P-type work function metal layer 634 is less than a distance from the dielectric fin 652 to the top sidewall 634T of the P-type work function metal layer 634. In some embodiments, a distance from the dielectric fin 652 to the bottom sidewall 636B of the P-type work function metal layer 636 is less than a distance from the dielectric fin 652 to the top sidewall 636T of the P-type work function metal layer 636.

Similarly, the N-type work function metal layers 638, 640 respectively have end portions 638E, 640E between the fins 534, 536. Each of the end portions 638E, 640E of the N-type work function metal layers 638, 640 has a bottom sidewall 638B, 640B and a top sidewall 638T, 640T. The top sidewalls 638T, 640T are above the corresponding bottom sidewalls 638B, 640B. The end portion 638E of the N-type work function metal layer 638 has a connecting surface extending from the bottom sidewall 638B to the top sidewall 638T, and the end portion 640E of the N-type work function metal layer 640 has a connecting surface extending from the bottom sidewall 640B to the top sidewall 640T. In some embodiments, the dielectric fin 654 may protrudes from a space from the bottom sidewalls 638B, 640B, such that the dielectric fin 654 has a top surface in a position higher than the connecting surfaces of the N-type work function metal layers 638, 640. In some embodiments, the dielectric fin 654 has a width W4 less than a distance D13 from the bottom sidewall 638B of the N-type work function metal layer 638 to the bottom sidewall 640B of the N-type work function metal layer 640, and the distance D13 is less than a distance D14 from the top sidewall 638T of the N-type work function metal layer 638 to the top sidewall 640T of the N-type work function metal layer 640. Furthermore, In some embodiments, a distance from the dielectric fin 654 to the bottom sidewall 638B of the N-type work function metal layer 638 is less than a distance from the top sidewall 638T of the N-type work function metal layer 638. In some embodiments, a distance from the dielectric fin 654 to the bottom sidewall 638B of the P-type work function metal layer 638 is less than a distance from the dielectric fin 654 to the top sidewall 638T of the P-type work function metal layer 638.

The first capping layer 612 formed atop the gate electrodes 552A-552C to serve as a protection layer, such that the first capping layer 612 can protect underlying portions of the gate electrodes 552A-552C against a subsequent self-aligned process. In some embodiments, some portions of the first capping layer 612 are located in the gaps of the gate electrodes 552A-552C. In some embodiments, some portions of the first capping layer 612 are between the N-type work function metal layers or between the P-type work function metal layers. In the example configuration in FIG. 16, a first portion of the first capping layer 612 is between the top sidewalls 634T, 636T of the end portions 634E, 636E of the P-type work function metal layers 634, 636 and in contact with the top sidewalls 634T, 636T of the end portions 634E, 636E of the P-type work function metal layers 634, 636, and a second portion of the first capping layer 612 is between the top sidewalls 638T, 640T of the end portions of the N-type work function metal layers 638, 640 and in contact with the top sidewalls 638T, 640T of the end portions of the N-type work function metal layers 638, 640. Furthermore, the first capping layer 612 is in contact with the connecting surfaces of the P-type and N-type work function metal layers 634, 636, 638, 640 and the dielectric fins 650, 652, 654, 656. In some embodiments, the top surface of at least one of the dielectric fins 650, 652, 654, 656 in a position higher than a bottom surface of the first capping layer 612 in contact with the connecting surfaces of the gate electrodes 552A-552C. In some embodiments, the top surface of at least one of the dielectric fins 650, 652, 654, 656 is embedded in the first capping layer 612.

Figure 17:
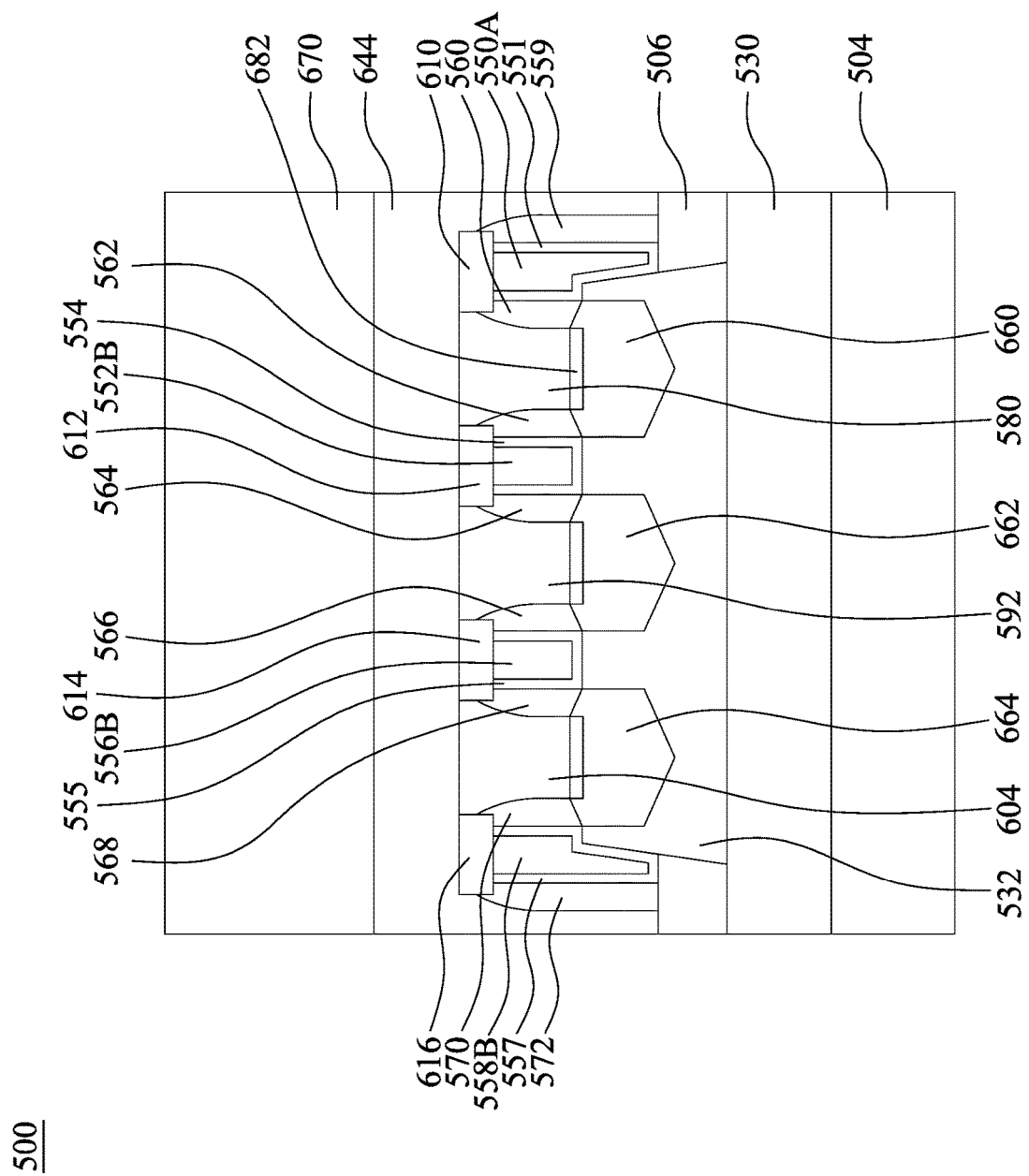
FIGS. 17 and 18 are cross-section views of the semiconductor device.
Figure 18:
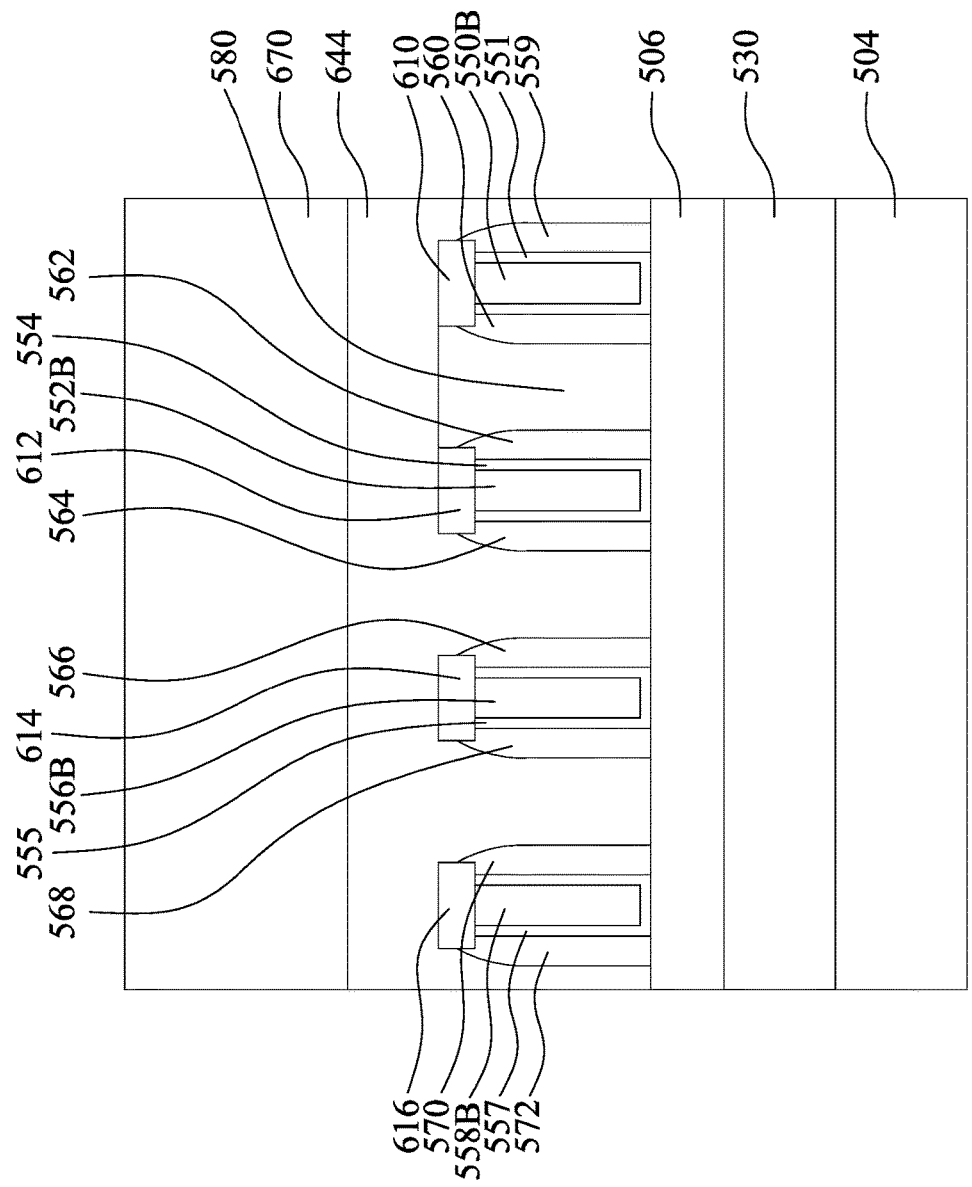

Reference is made to FIGS. 17 and 18 which are cross-section views of the semiconductor device 500. The cross-section view in FIG. 17 is taken along line 17-17 in FIG. 15. The cross-section view in FIG. 18 is taken along line 18-18 in FIG. 15. The configuration of the semiconductor device 500 is described herein with respect to both FIG. 17 and FIG. 18. The structures shown in FIGS. 17 and 18 can be formed by modelling in a layout as depicted in FIG. 15. For example, physical elements or layers can be formed by using the gate electrode or the gate contact illustrated in FIG. 10 as patterns.

Many aspects of the semiconductor device 500 depicted in FIGS. 17 and 18 are the same as or similar to those of the semiconductor device 100 as depicted in FIGS. 5 and 6. For example, the semiconductor device 500 includes the substrate 504, the p-well region 530, the isolation structure 506, the gate electrodes 550B, 552B, 556B, 558B, the contact areas 580, 592, 604, gate dielectric layers 551, 554, 555, 557, the spacers 559, 560, 562, 564, 566, 568, 570, 572, the first capping layers 610, 612, 614, 616, the ILD layer 644, source/drains 660, 662, 664, silicide regions 668, and an IMD layer 670, and thus the detailed explanation may be omitted. In addition, the detailed explanation regarding some of the elements as previously described in FIG. 16 may be omitted as well.

In the example configuration in FIGS. 17 and 18, the gate electrodes 550B, 552B, 556B, 558B and the corresponding spacers 559, 560, 562, 564, 566, 568, 570, 572 are over the isolation structure 506, and the gate dielectric layers 551, 554, 555, 557 gate dielectric layers 551, 554, 555, 557 are arranged under and around the corresponding gate electrodes 550B, 552B, 556B, 558B to electrically isolate the gate electrodes 550B, 552B, 556B, 558B from the fin 532. The first capping layers 610, 612, 614, 616 are over the corresponding gate electrodes 550B, 552B, 556B, 558B. In some embodiments, the first capping layers 610, 612, 614, 616 respectively have bottom surfaces in contact with the corresponding gate electrode 550B, 552B, 556B, 558B, the corresponding spacers 559, 560, 562, 564, 566, 568, 570, 572. In some embodiments, at least one of the first capping layers 610, 612, 614, 616 has a pair of sidewalls in contact with the corresponding spacers. For example, the first capping layer 612 has a pair of sidewalls in contact with the spacer 562, 564. The source/drains 660, 662, 664 are arranged between adjacent gate electrodes 550B, 552B, 556B, 558B, and the silicide regions 668 are formed on the source/drains 660, 662, 664.

Contact plugs are in the corresponding contact areas 580, 592, 604. For the sake of simplicity, the contact plugs are designated by the same reference numerals of the corresponding contact areas. In the example configuration in FIG. 17, the contact plugs 580, 592, 604 are above the fin 532. In the example configuration in FIG. 18, the contact plug 580 is above the well region 530 and between the gate electrodes 550B, 552B. In some embodiment, the contact plugs 580, 592, 604 are self-aligned contact plugs formed by a self-aligned process. In some embodiment, top surfaces of the contact plugs 580, 592, 604 are level with top surfaces of the first capping layers 610, 612, 614, 616. The ILD layer 644 and the IMD layer 670 are formed over the isolation structure 506, the gate electrodes 550B, 552B, 556B, 558B, the first capping layers 610, 612, 614, 616, and the contact plugs 580, 592, 604.

Figure 19:
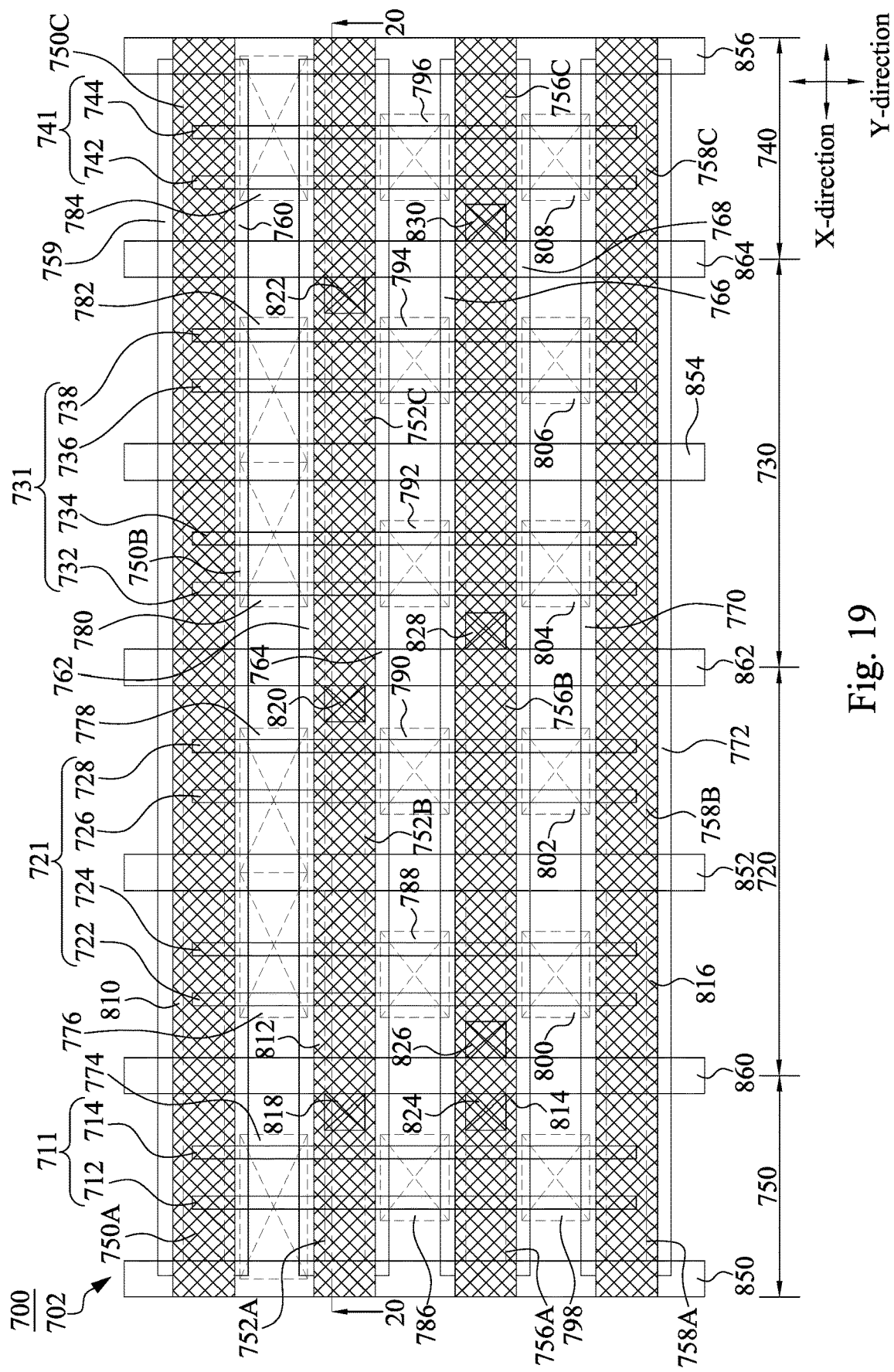
FIG. 19 illustrates a top view of a layout corresponding to a circuit of a semiconductor device according to some embodiments of the present disclosure.

Reference is made to FIG. 19, which illustrates a top view of a layout corresponding to a circuit 702 of a semiconductor device 700 according to some embodiments of the present disclosure. Many aspects of the circuit 702 are the same as or similar to those of the circuit 502 of the semiconductor device 500 as depicted in FIG. 15. For example, the circuit 702 includes a first active area region 711 with fins 712, 714, a second active area region 721 with fins 722, 724, 726, 728, a third active area region 731 with fins 732, 734, 736, 738, a fourth active area region 741 with fins 742, 744, a plurality of gate electrodes 750A, 750B, 750C, 752A, 752B, 752C, 752D, 756A, 756B, 756C, 758A, 758B, 758C, a plurality of spacers 759, 760, 762, 764, 766, 768, 770, 772, a plurality of contact areas 774, 776, 778, 780, 782, 784, 786, 788, 790, 792, 794, 796, 798, 800, 802, 804, 806, 808, a plurality of first capping layers 810, 812, 814, 816, and a plurality of gate contacts 818, 820, 822, 824, 826, 828, 830, and a plurality of dielectric fins 850, 852, 854, 856. The first active area region 711 is within a well region 710 which is a p-well region, the second active area region 721 is within a well region 720 which is an n-well region, the third active area region 731 is within a well region 730 which is a p-well region, and the fourth active area region 741 is within a well region 740 which is an n-well region. The detailed explanation regarding these elements or layers may be omitted.

Different from the circuit 502 of the semiconductor device 500, the circuit 702 of the semiconductor device 700 further includes a plurality of dielectric fins 860, 862, 864 arranged along an X-direction of the layout illustrated in FIG. 19 and extending along a Y-direction of the layout illustrated in FIG. 19. The dielectric fins 860, 862, 864 are parallel with the dielectric fins 850, 852, 854, 856. The dielectric fins 860, 862, 864 overlap the gate electrodes 750A-750C, 752A-752C, 756A-756C, 758A-758C, the spacers 759, 760, 762, 764, 766, 768, 770, 772, and the first capping layers 810, 812, 814, 816. In some embodiments, the dielectric fins 860, 862, 864 can be formed by a single dielectric material or by multiple dielectric materials in a combination. Example materials of the dielectric fins 860, 862, 864 include, but are not limited to, a high-k dielectric layer, an interfacial layer, and/or combinations thereof. For example, the dielectric fins 860, 862, 864 may include a nitride based dielectric, a metal oxide dielectric, hafnium oxide (HfO2), tantalum oxide (Ta2O5), titanium oxide (TiO2), zirconium oxide (ZrO2), aluminum oxide (Al2O3), yttrium oxide (Y2O3), or combinations thereof. In some embodiment, the dielectric fins 860, 862, 864 respectively have widths measured along the X-direction of the layout illustrated in FIG. 19, and the width of the dielectric fins 860, 862, 864 are different than widths of the dielectric fins 850, 852, 854, 856 measured along the X-direction of the layout illustrated in FIG. 19. For example, the widths of the dielectric fins 860, 862, 864 may be less than the widths of the dielectric fins 850, 852, 854, 856. By forming the dielectric fins 850, 852, 854, 856, 860, 862, 864 in the same layout of the semiconductor device 700, the patterns of the layout of the semiconductor device 700 is homogeneous, and such configuration of the semiconductor device 700 may be advantageous to make the process more flexible, thereby improving yield of the semiconductor device 700.

Figure 20:
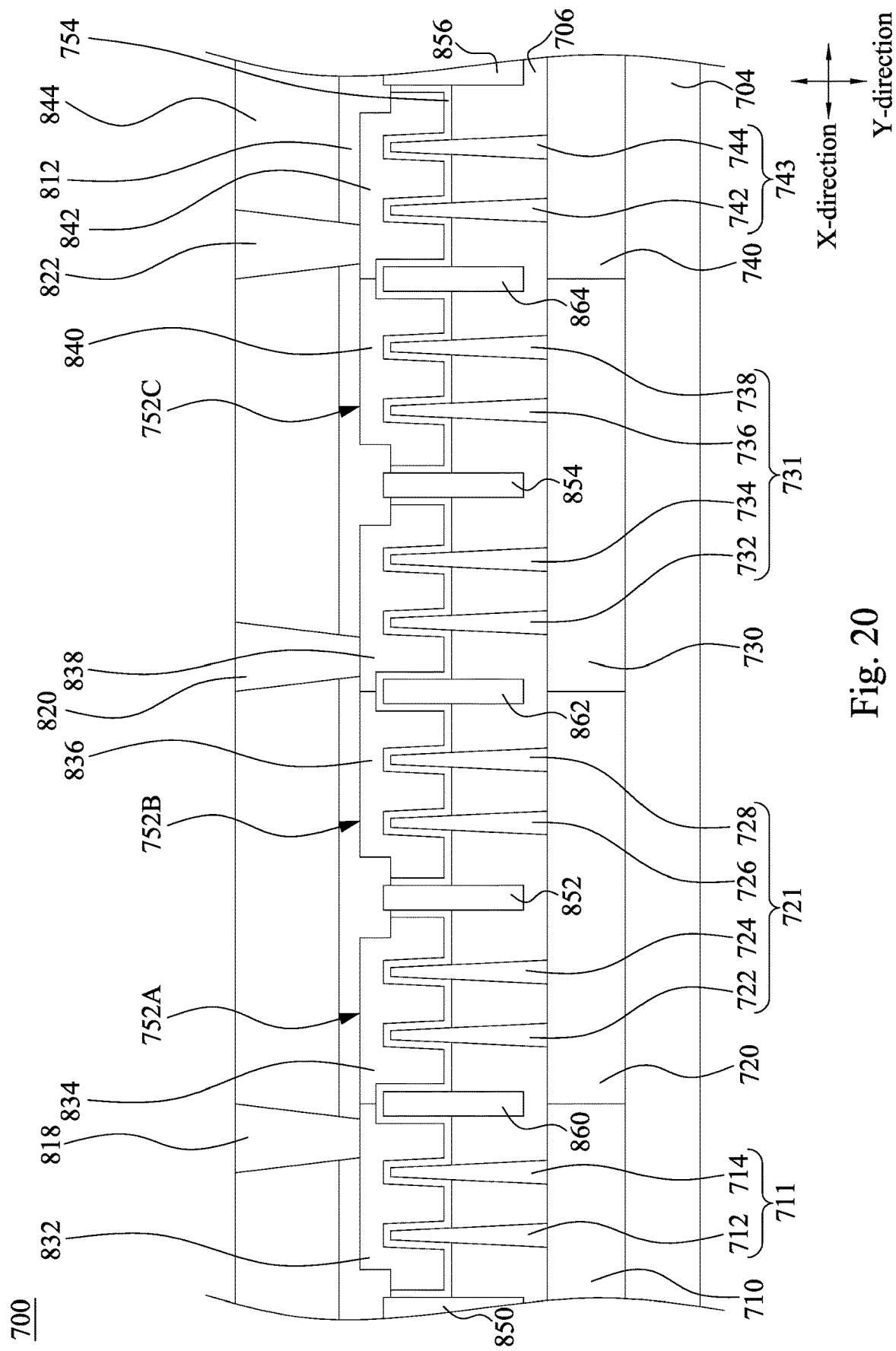
FIG. 20 is a cross-section view taken along line 20-20 in FIG. 19.

Reference is made to FIG. 20, which is a cross-section view taken along line 20-20 in FIG. 19. The structures shown in FIG. 20 can be formed by modelling in a layout as depicted in FIG. 19. For example, physical elements or layers can be formed by using the gate electrode or the gate contact illustrated in FIG. 16 as patterns. Many aspects of the semiconductor device 700 illustrated in FIG. 20 are the same as or similar to those of the semiconductor device 500 as depicted in FIG. 16. For example, the semiconductor device 700 includes a substrate 704, a first active area region 711 with fins 712, 714, a second active area region 721 with fins 722, 724, 726, 728, a third active area region 731 with fins 732, 734, 736, 738, a fourth active area region 741 with fins 742, 744, p-well regions 710, 730, n-well regions 720, 740, an isolation structure 706, gate electrodes 752A, 752B, 752C including corresponding N-type and P-type work function metal layers 832, 834, 836, 838, 840, 842, a gate dielectric layer 754, a first capping layer 812, gate contacts 818, 820, 822, and an ILD layer 844, and thus the detailed explanation may be omitted. Different from the semiconductor device 500 as depicted in FIG. 16, the semiconductor device 700 illustrated in FIG. 20 further includes a plurality of dielectric fins 860, 862, 864 arranged along a X-direction of FIG. 20.

In some embodiments, the dielectric fins 860, 862, 864 are between the isolation structure 706 and the gate dielectric layer 754. In some embodiments, the dielectric fins 860, 862, 864 are between a pair of ends portions of the corresponding gate electrodes 752A-752C. In some embodiments, the gate electrodes 752A-752C are across the corresponding dielectric fins 860, 862, 864. In some embodiments, at least one of the dielectric fins 860, 862, 864 has a bottom portion surrounded by the isolation structure 706 and a top portion above the bottom portion, in which the gate dielectric layer 754 adheres to the top portion. In some embodiments, at least one of the dielectric fins 860, 862, 864 is above an interface between the corresponding well regions. For example, the dielectric fin 862 is above an interface between the n-well region 720 and the p-well region 730 and overlaps the interface. In some embodiments, the dielectric fins 860, 862, 864 are separated from the corresponding p-well and n-well regions 710, 720, 730, 740 by the isolation structure 706. In some embodiments, at least one of the dielectric fins 860, 862, 864 has a top surface facing away from the isolation structure 706 and in a position higher than the fins 712, 714, 722, 724, 726, 728, 732, 734, 736, 738, 742, 744. In some embodiments, the top surface of at least one of the dielectric fins 860, 862, 864 is in a position higher than connecting surfaces of the gate electrodes 752A-752C facing away from the isolation structure 706.

In some embodiments, the dielectric fins 850, 852, 854, 856, 860, 862, 864 are formed in the same process. For example, the dielectric fins 850, 852, 854, 856, 860, 862, 864 are formed after the formation of the isolation structure 706 and prior to the formation of the gate dielectric layer 754. Similarly, the isolation structure 706 may have concaves between the adjacent fins due to the dishing effect, and the dielectric fins 850, 852, 854, 856, 860, 862, 864 are formed by depositing a dielectric material such that the dielectric material is received by the concaves.

Figure 21:
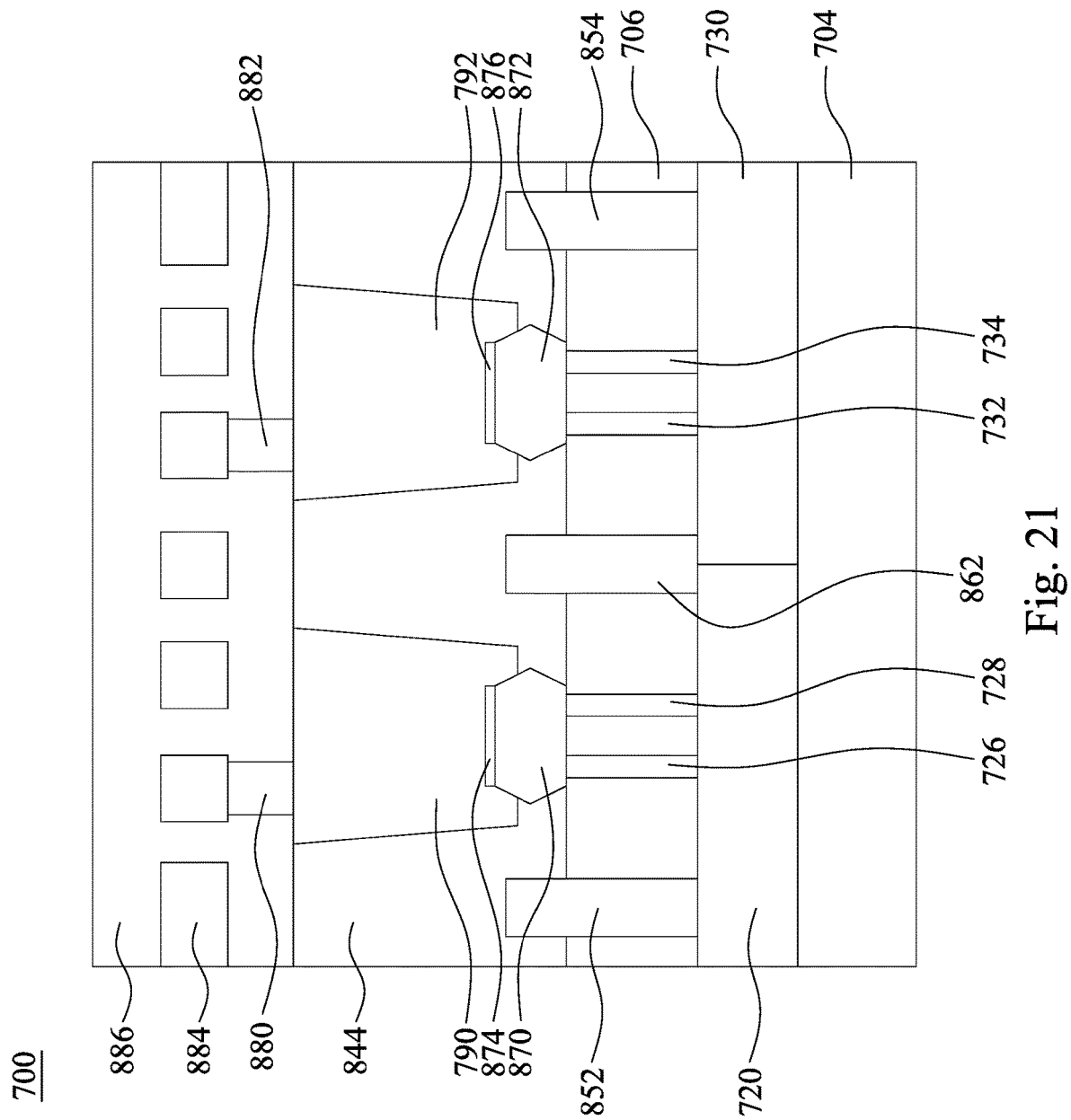
FIG. 21 is a cross-section view of the semiconductor device taken along the S/D region in FIG. 19.

Reference is made to FIG. 21 which is a cross-section view of the semiconductor device 700 taken along the S/D region in FIG. 19. The structure shown in FIG. 21 can be formed by modelling in a layout as depicted in FIG. 19. As illustrated in FIG. 21, the semiconductor device 700 comprises the substrate 704, the n-well region 720, the p-well region 730, the isolation structure 706, the fins 726, 728, 732, 734, and the ILD layer 844 as previously described in FIG. 20. Many aspects of the semiconductor device 700 illustrated in FIG. 21 are the same as or similar to those of the semiconductor device 500 as depicted in FIG. 15. For example, the semiconductor device 700 comprises source/drains 870, 872, silicide regions 874, 876, contact plugs 790, 792, the S/D vias 880, 882, a conductive layer 884, and an IMD layer 886, and thus the detailed explanation may be omitted. For the sake of simplicity, the contact plugs are designated by the same reference numerals of the corresponding contact areas illustrated in FIG. 19. Different from the semiconductor device 700 as depicted in FIG. 21, the semiconductor device 700 further comprises dielectric fins 852, 854, 862, in which the dielectric fin 862 is between the dielectric fins 852 and 854 and between the source/drains 870 and 872. In some embodiments, at least one of the dielectric fins 852, 854, 862 has a top surface facing away from the isolation structure 706, and the top surface is in a position lower than the silicide regions 874, 876.

Figure 22:
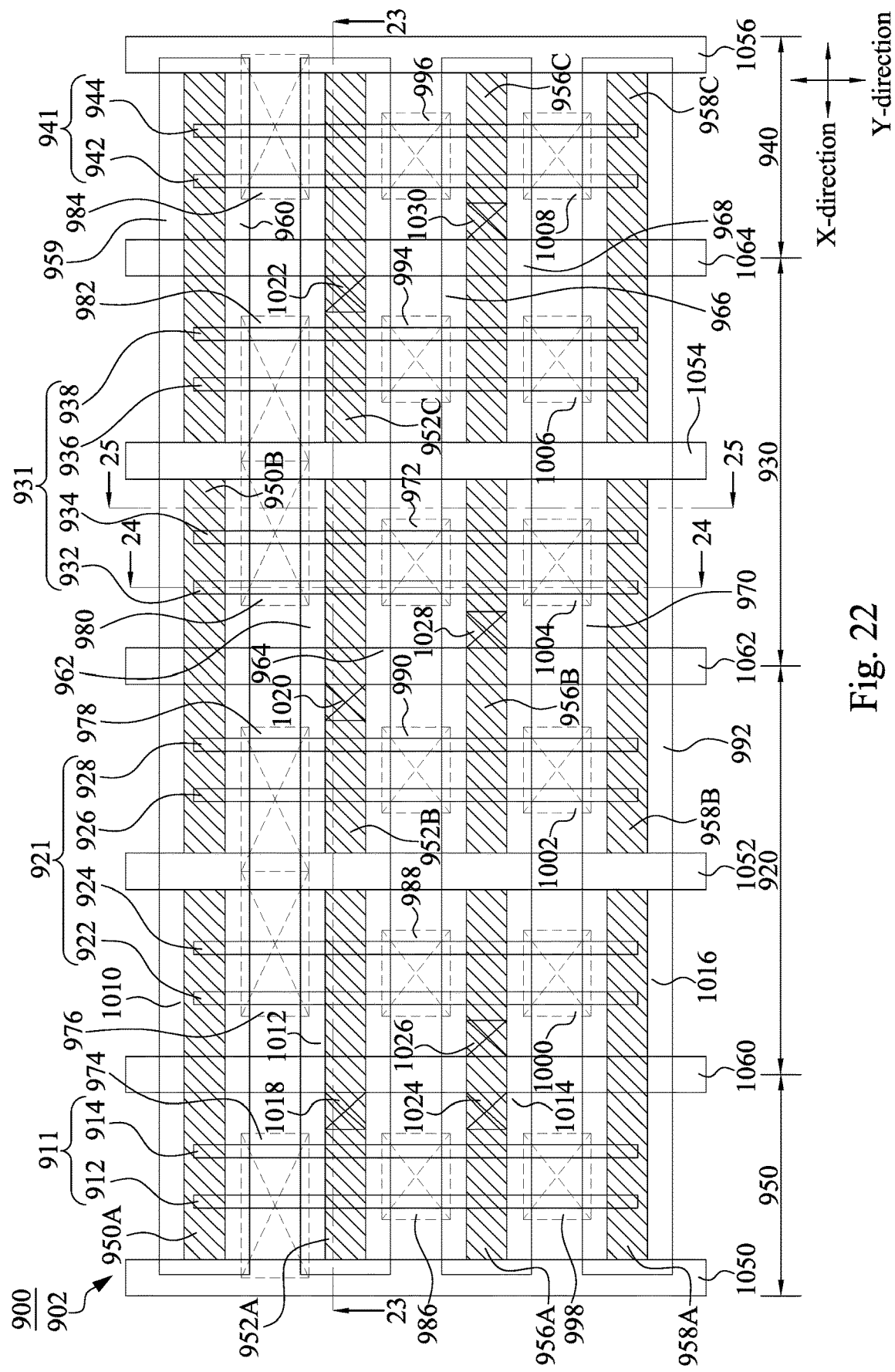
FIG. 22 illustrates a top view of a layout corresponding to a circuit of a semiconductor device according to some embodiments of the present disclosure.

Reference is made to FIG. 22, which illustrates a top view of a layout corresponding to a circuit 902 of a semiconductor device 900 according to some embodiments of the present disclosure. Many aspects of the circuit 902 illustrated in FIG. 22 are the same as or similar to those of the circuit 702 of the semiconductor device 700 as depicted in FIG. 19. For example, the circuit 902 includes a first active area region 911 with fins 912, 914, a second active area region 921 with fins 922, 924, 926, 928, a third active area region 931 with fins 932, 934, 936, 938, a fourth active area region 941 with fins 942, 944, a plurality of gate electrodes 950A, 950B, 950C, 952A, 952B, 952C, 956A, 956B, 956C, 958A, 958B, 958C, a plurality of spacers 959, 960, 962, 964, 966, 968, 970, 972, a plurality of contact areas 974, 976, 978, 980, 982, 984, 986, 988, 990, 992, 994, 996, 998, 1000, 1002, 1004, 1006, 1008, a plurality of gate contacts 1010, 1012, 1014, 1016, 1018, 1020, 1022, and a plurality of dielectric fins 1024, 1026, 1028, 1030, 1032, 1034, 1036. The first active area region 911 is within a well region 910 which is a p-well region, the second active area region 921 is within a well region 920 which is an n-well region, the third active area region 931 is within a well region 930 which is a p-well region, and the fourth active area region 941 is within a well region 940 which is an n-well region. Because layers or elements are the same as or similar to those of the circuit 702 of the semiconductor device 700 as depicted in FIG. 19, the detailed explanation may be omitted. Different from the circuit 702 of the semiconductor device 700, in the circuit 902 of the semiconductor device 900, capping layers (e.g., the first capping layers 810, 812, 814, 816 as depicted in FIG. 19) are omitted therefrom.

Figure 23:
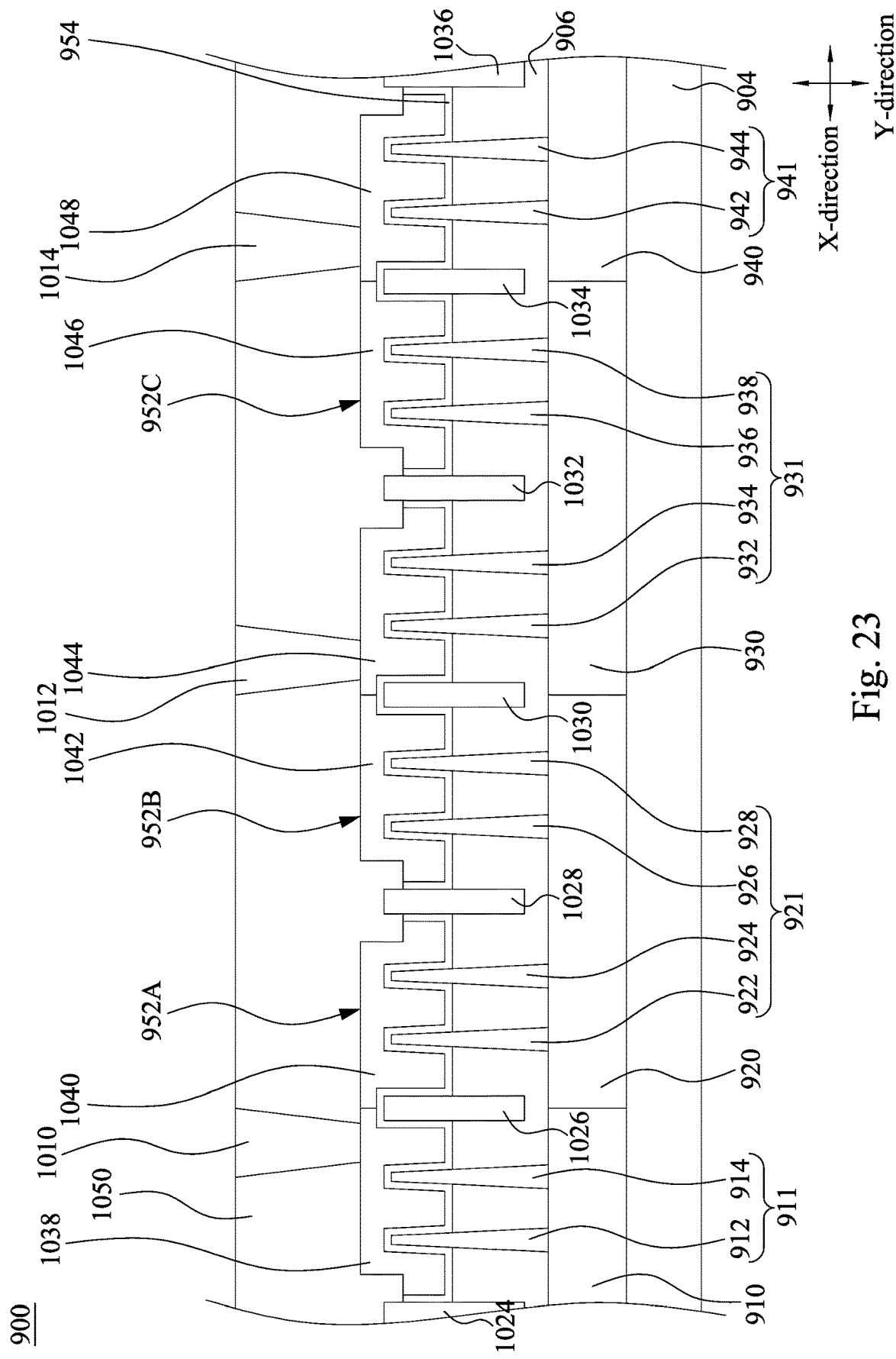
FIG. 23 is a cross-section taken along line 23-23 in FIG. 22.

Reference is made to FIG. 23 which is a cross-section taken along line 23-23 in FIG. 22. The structure shown in FIG. 23 can be formed by modelling in a layout as depicted in FIG. 22. For example, physical elements or layers can be formed by using the gate electrode or the gate contact illustrated in FIG. 22 as patterns. Many aspects of the semiconductor device 900 depicted in FIG. 23 are the same as or similar to those of the semiconductor device 700 as depicted in FIG. 20. For example, the semiconductor device 900 includes a substrate 904, a first active area region 911 with fins 912, 914, a second active area region 921 with fins 922, 924, 926, 928, a third active area region 931 with fins 932, 934, 936, 938, a fourth active area region 941 with fins 942, 944, p-well regions 910, 930, n-well regions 920, 940, an isolation structure 906, gate electrode 952A, 952B, 952C, a gate dielectric layer 954, gate contacts 1010, 1012, 1014, a plurality of dielectric fins 1024, 1026, 1028, 1030, 1032, 1034, 1036, and an ILD layer 1050, and thus the detailed explanation may be omitted. Different from the semiconductor device 700 as depicted in FIG. 20, a capping layer (e.g., the first capping layer 812 as depicted in FIG. 20) is omitted from the semiconductor device 900 depicted in FIG. 23.

In the example configuration in FIG. 23, the gate electrode 952A extending continuously from the p-well region 910 to the n-well region 920 includes an N-type work function metal layer 1038 and a P-type work function metal layer 1040. The gate electrode 952B extending continuously from the n-well region 920 to the p-well region 930 includes a P-type work function metal layer 1042 and an N-type work function metal layer 1044. The gate electrode 952C extending continuously from the p-well region 930 to the n-well region 940 includes a P-type work function metal layer 1046 and an N-type work function metal layer 1048. The N-type work function metal layer 1038, the P-type work function metal layers 1040, 1042, the N-type work function metal layers 1044, 1046, and the P-type work function metal layer 1048 are arranged along a X-direction of FIG. 23 in sequence.

In some embodiments, at least one the dielectric fins 1024, 1028, 1032, 1036 is within a gap defined by a pair of the adjacent work function metal layers. For example, the P-type work function metal layers 1040 and 1042 define a gap therebetween, and the dielectric fin 1028 is within this gap and covered by the ILD layer 1050. Furthermore, the dielectric fin 1028 has a bottom portion, a top portion, and a central portion between the bottom and top portions. The bottom portion of the dielectric fin 1028 is surrounded by the isolation structure 906, the gate dielectric layer 954 adheres to the central portion of the dielectric fin 1028, and the top portion of the dielectric fin 1028 is covered by the ILD layer 1050.

In some embodiments, at least one the dielectric fins 1026, 1030, 1034 is located at an interface between a pair of adjacent P-type and N-type work function metal layers. For example, the dielectric fin 1030 is located at an interface between the adjacent P-type and N-type work function metal layers 1042, 1044 and is covered by the gate dielectric layer 954. Furthermore, a top surface of the dielectric fin 1030 facing away from the isolation structure 906 is covered by a portion of the gate dielectric layer 954.

In some embodiments, prior to the formation of the ILD layer 1050, some portions of the gate electrodes 952A-952C are removed until exposing the dielectric fins 1024, 1028, 1032, 1036. In some embodiments, the portions of the gate electrodes 952A-952C are removed by performing a patterning process such that recess-shaped end portions of the gate electrodes 952A-952C are formed, and at least one of the dielectric fins 1024, 1028, 1032, 1036 is between a pair of the adjacent recess-shaped end portions of the gate electrodes 952A-952C. After the patterning process, the formation of the ILD layer 1050 may be performed to covered the gate electrodes 952A-952C and the exposed dielectric fins 1024, 1028, 1032, 1036, such that the ILD layer 1050 is in contact with the gate electrodes 952A-952C and the dielectric fins 1024, 1028, 1032, 1036. Then, the gate contacts 1010, 1012, 1014 through the ILD layer 1050 are formed to contact the gate electrodes 952A-952C.

Figure 24:
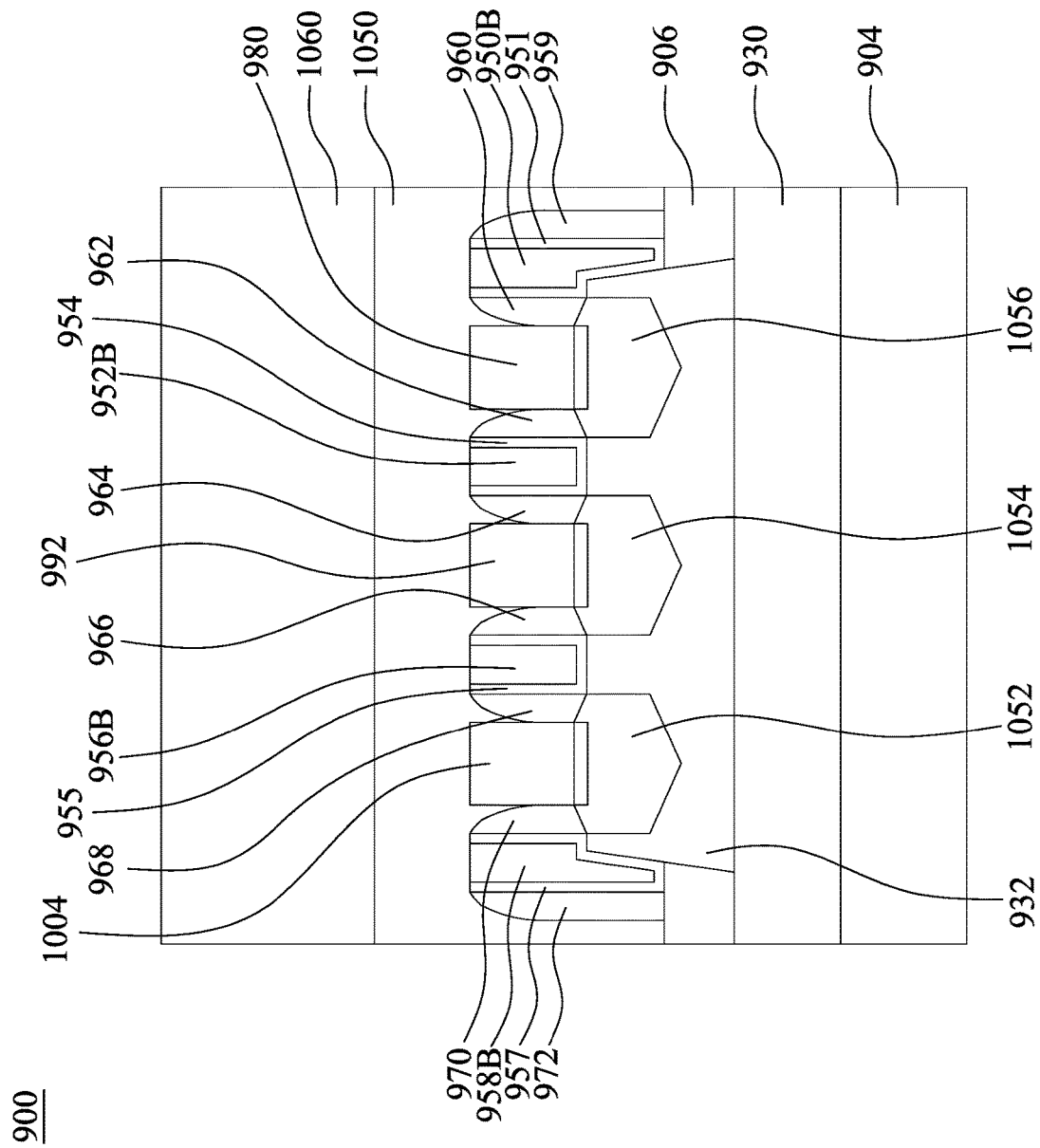
FIGS. 24 and 25 are cross-section views of the semiconductor device.
Figure 25:
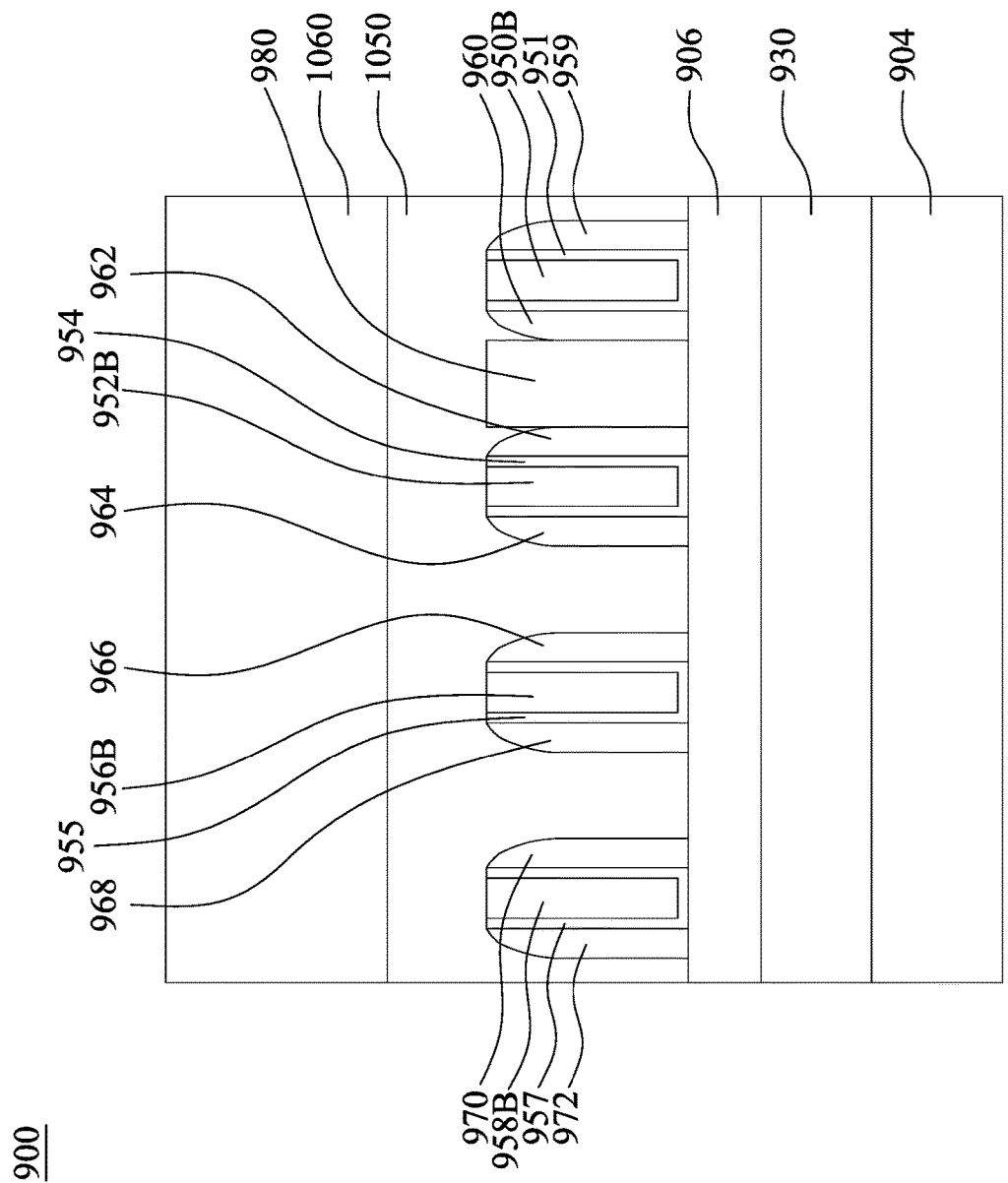

Reference is made to FIGS. 24 and 25 which are cross-section views of the semiconductor device 900. The cross-section view in FIG. 24 is taken along line 24-24 in FIG. 22. The cross-section view in FIG. 25 is taken along line 25-25 in FIG. 22. The configuration of the semiconductor device 900 is described herein with respect to both FIG. 24 and FIG. 25. The structures shown in FIGS. 24 and 25 can be formed by modelling in a layout as depicted in FIG. 22. For example, physical elements or layers can be formed by using the gate electrode or the gate contact illustrated in FIG. 22 as patterns. Many aspects of the semiconductor device 700 depicted in FIGS. 24 and 20 are the same as or similar to those of the semiconductor device 500 depicted in FIGS. 17 and 18. For example, the semiconductor device 900 includes a substrate 904, a p-well region 930, an isolation structure 906, gate electrodes 950B, 952B, 956B, 958B, contact areas 980, 992, 1004, gate dielectric layers 951, 954, 955, 957, spacers 959, 960, 962, 964, 966, 968, 970, 972, an ILD layer 1050, source/drains 1054, 1056, 1056, silicide regions 1058, and an IMD layer 1060, and thus the detailed explanation may be omitted.

Different from the semiconductor device 500 as depicted in FIGS. 17 and 18, a capping layer (e.g., the first capping layers 610, 612, 614, 616 as depicted in FIGS. 17 and 18) is omitted from the semiconductor device 900 depicted in FIGS. 24 and 25, and contact plugs of the semiconductor device 900 are formed by a series of operations including deposition and etching processes. Contact plugs are in the corresponding contact areas 980, 992, 1004. For the sake of simplicity, the contact plugs are designated by the same reference numerals of the corresponding contact areas. In some embodiments, after the gate electrodes 950B, 952B, 956B, 958B are formed, a dielectric layer may be deposited above the gate electrodes 950B, 952B, 956B, 958B and the source/drains 1054, 1056, 1056, and then a plurality of contact holes are formed in the dielectric layer. In some embodiments, one or more conductive layers are deposited within the contact holes in the dielectric layer and above the dielectric layer, and a planarization process, such as a CMP process, is performed to remove some excess portions of the one or more conductive layers, so as to form the contact plugs 980, 992, 1004. Example materials of the contact plugs 980, 992, 1004 include, but are not limited to, Ti, TiN, TaN, Co, Ru, Pt, W, Al, Cu, or combinations thereof. In some embodiments, at least one of the contact plugs 980, 992, 1004 includes multiple metal material. In some embodiments, the contact plugs 980, 992, 1004 are surrounded by corresponding barrier layers, and example materials of the barrier layers include, Ti, TiN, or combinations thereof. In some embodiments, after the contact plugs 980, 992, 1004 are formed, a dielectric material is deposited to cover the contact plugs 980, 992, 1004 and to form the ILD layer 1050.

Figure 26:
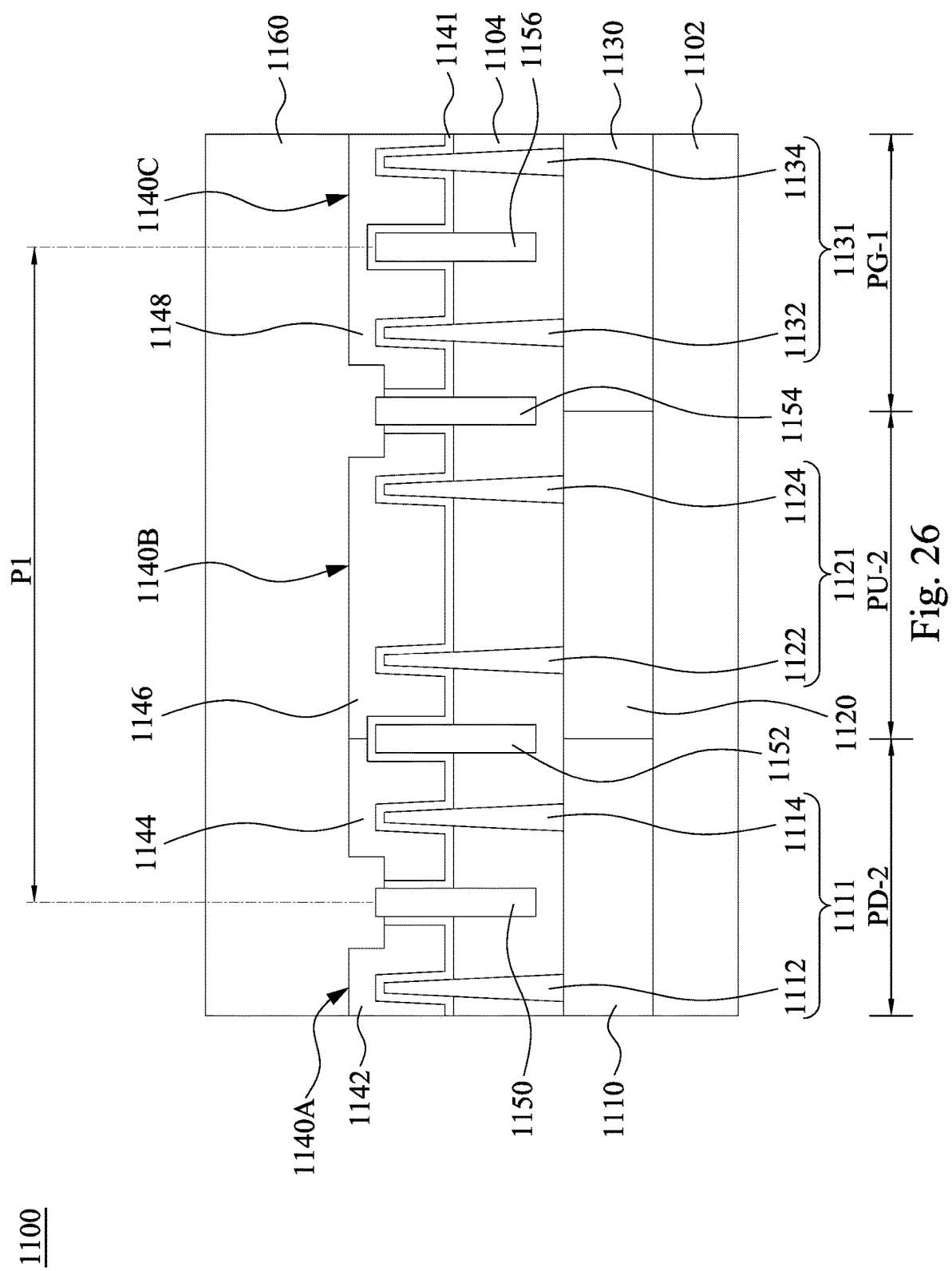
FIG. 26 illustrates a cross-section view for a SRAM cell according to some embodiments of the present disclosure.

In some embodiments, at least one of the structures described above can be applied to a SRAM cell, and thus the SRAM cell may have a structure with at least one dielectric fin as described above. For example, FIG. 26 illustrates a cross-section view for a SRAM cell 1100 according to some embodiments of the present disclosure. Many aspects of the SRAM cell 1100 are the same as or similar to those of the semiconductor device 900 as depicted in FIG. 23. For example, the SRAM cell 1100 includes a substrate 1102, a first active area region 1111 with fins 1112, 1114, a second active area region 1121 with fins 1122, 1124, a third active area region 1131 with fins 1132, 1134, p-well regions 1110, 1130, an n-well region 1120, an isolation structure 1104, gate electrodes 1140A, 1140B, 1140C, a gate dielectric layer 1141, a plurality of dielectric fins 1150, 1152, 1154, 1156, and an ILD layer 1160, and thus the detailed explanation may be omitted.

In the example configuration in FIG. 26, the gate dielectric layer 1141 is arranged under and around the gate electrodes 1140A-1140C, in which the fins 1112, 1114, 1122, 1124, 1132, 1134 are covered by the gate dielectric layer 1141. The gate dielectric layer 1141 adheres to sidewalls of the dielectric fins 1150, 1152, 1154, 1156. The gate electrode 1140A above the p-well region 1110 includes an N-type work function metal layer 1142. The gate electrode 1140B extending from the p-well region 1110 into the n-well region 1120 includes an N-type work function metal layer 1144 and a P-type work function metal layer 1146. The gate electrode 1140C above the p-well region 1130 includes an N-type work function metal layer 1148. The N-type work function metal layers 1142, 1144, the P-type work function metal layer 1146, and the N-type work function metal layer 1148 are arranged along a X-direction of FIG. 26 in sequence. In some embodiments, at least one of the N-type work function metal layers 1142, 1144, 1148 and the P-type work function metal layer 1146 has an end portion in a recess shape, and each of the end portions has a notched profile and can be referred to as a notched corner. The end portions of the N-type work function metal layers 1142, 1144 are between the fin 1112 and the fin 1114, and the dielectric fin 1150 is between the end portions of the N-type work function metal layers 1142, 1144. The end portions of the P-type work function metal layer 1146 and the N-type work function metal layer 1148 are between the fin 1124 and the fin 1132, and the dielectric fin 1154 is between the end portions of the P-type work function metal layer 1146 and the N-type work function metal layer 1148. In some embodiments, the dielectric fins 1150, 1154 are covered by the ILD layer 1160 and are in contact with the ILD layer 1160. In some embodiments, the dielectric fins 1152, 1156 are covered by the gate dielectric layer 1141 and separated from the ILD layer 1160 by the gate electrodes 1140A-1140C and the gate dielectric layer 1141. In some embodiments, at least one of the dielectric fins 1150, 1152, 1154, 1156 has a width in a range from 2 nm to 50 nm. In some embodiments, at least one of the dielectric fins 1150, 1154 has a width different from that of at least one of the dielectric fins 1152, 1156. For example, the width of at least one of the dielectric fins 1152, 1156 is greater than the width of at least one of the dielectric fins 1150, 1154. In some embodiments, a difference between the width of at least one of the dielectric fins 1152, 1156 and the width of at least one of the dielectric fins 1150, 1154 is equal to or greater than 5 nm.

In some embodiments, the SRAM cell 1100 includes a pull-down transistor PD-2, a pull-up transistor PU-2, and a pass-gate transistor PG-1, in which the pull-down transistor PD-2 and the pass-gate transistor PG-1 are n-type transistors and the pull-up transistor PU-2 is a p-type transistor, such as the n-type or p-type FinFET discussed above. In some embodiment, the first active area region 1111 with the fins 1112, 1114 may serve as an active area region of the pull-down transistor PD-2, and the N-type work function metal layers 1142, 1144 may serve as a gate of the pull-down transistor PD-2. In some embodiment, the second active area region 1121 with the fins 1122, 1124 may serve as an active area region of the pull-up transistor PU-2, and the P-type work function metal layer 1146 may serve as a gate of the pull-up transistor PU-2. In some embodiment, the third active area region 1131 with the fins 1132, 1134 may serve as an active area region of the pass-gate transistor PG-1, and the N-type work function metal layer 1148 may serve as a gate of the pass-gate transistor PG-1. In some embodiment, a distance from the dielectric fin 1150 to the dielectric fin 1156 that is measured along the X-direction of FIG. 26 can be referred to as a cell X-pitch P1.

Figure 27:
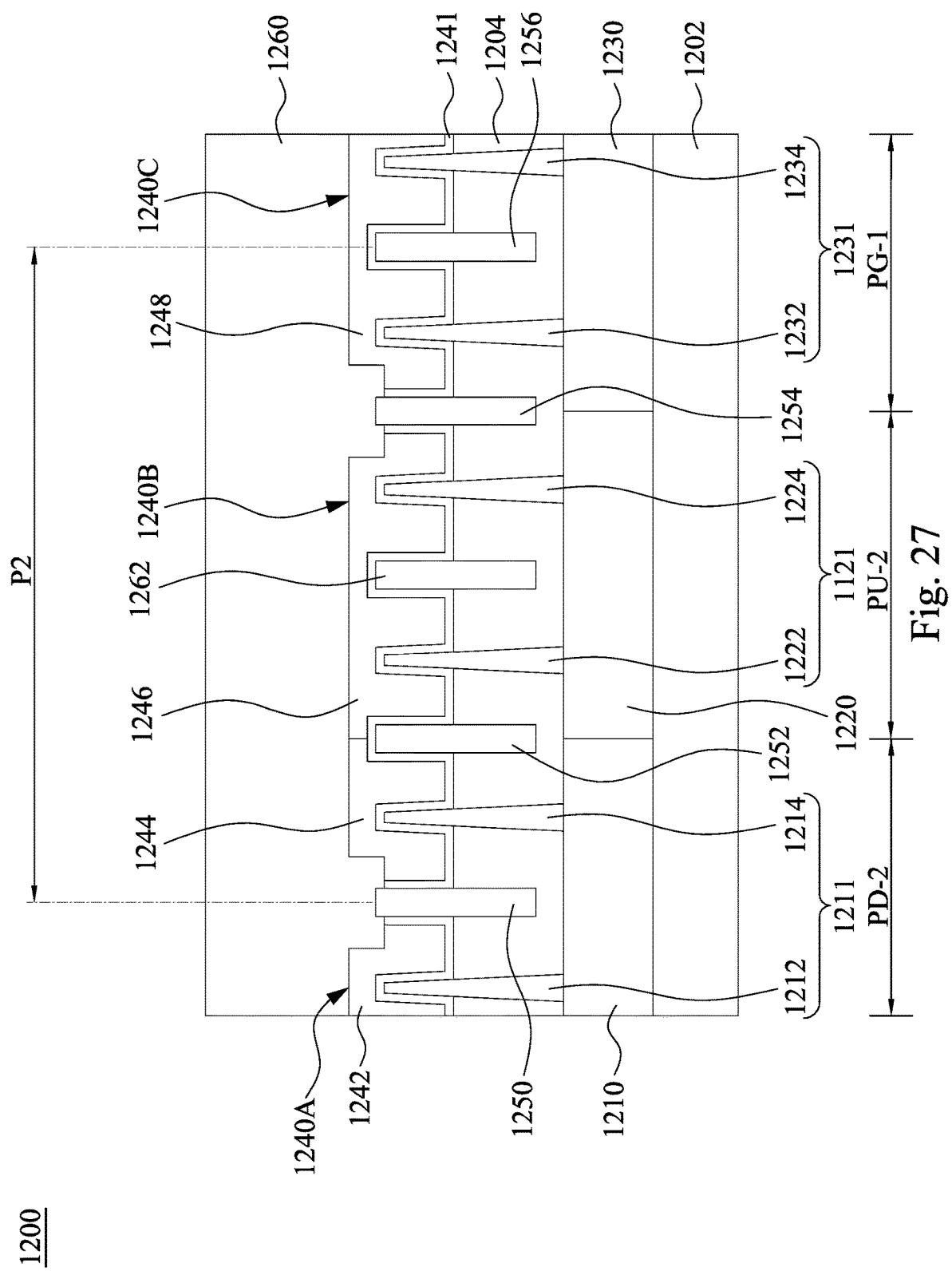
FIG. 27 illustrates a cross-section view for a SRAM cell according to some embodiments of the present disclosure.

Reference is made to FIG. 27 which illustrates a cross-section view for a SRAM cell 1200 according to some embodiments of the present disclosure. Many aspects of the SRAM cell 1200 are the same as or similar to those of the SRAM cell 1100 as depicted in FIG. 26. For example, the SRAM cell 1200 includes a substrate 1202, a first active area region 1211 with fins 1212, 1214, a second active area region 1221 with fins 1222, 1224, a third active area region 1231 with fins 1232, 1234, p-well regions 1210, 1230, an n-well region 1220, an isolation structure 1204, gate electrodes 1240A, 1240B, 1240C, a gate dielectric layer 1241, a plurality of dielectric fins 1250, 1252, 1254, 1256, and an ILD layer 1260, and thus the detailed explanation may be omitted. Different from the SRAM cell 1100 as depicted in FIG. 26, the SRAM cell 1200 further comprises a dielectric fin 1262 between the fin 1222 and fin 1224.

In some embodiments, the gate electrode 1240A above the p-well region 1210 includes an N-type work function metal layer 1242. The gate electrode 1240B extending from the p-well region 1210 into the n-well region 1220 includes an N-type work function metal layer 1244 and a P-type work function metal layer 1246. The gate electrode 1240C above the p-well region 1230 includes an N-type work function metal layer 1248. The N-type work function metal layers 1242, 1244, the P-type work function metal layer 1246, and the N-type work function metal layer 1248 are arranged along a X-direction of FIG. 27 in sequence. In some embodiments, the dielectric fin 1262 is between the isolation structure 1204 and the P-type work function metal layer 1246. In some embodiments, the dielectric fin 1262 is covered by the gate dielectric layer 1241 and separated from the ILD layer 1260 by the gate electrodes 1240A-1240C and the gate dielectric layer 1241.

In some embodiments, the SRAM cell 1200 includes a pull-down transistor PD-2, a pull-up transistor PU-2, and a pass-gate transistor PG-1, in which the pull-down transistor PD-2 and the pass-gate transistor PG-1 are n-type transistors and the pull-up transistor PU-2 is a p-type transistor, such as the n-type or p-type FinFET discussed above. Many aspects of the transistors of the SRAM cell 1200 are the same as or similar to those of the transistors of the SRAM cell 1100 as depicted in FIG. 26. For example, a distance from the dielectric fin 1250 to the dielectric fin 1256 that is measured along the X-direction of FIG. 27 can be referred to as a cell X-pitch P2.

Figure 28:
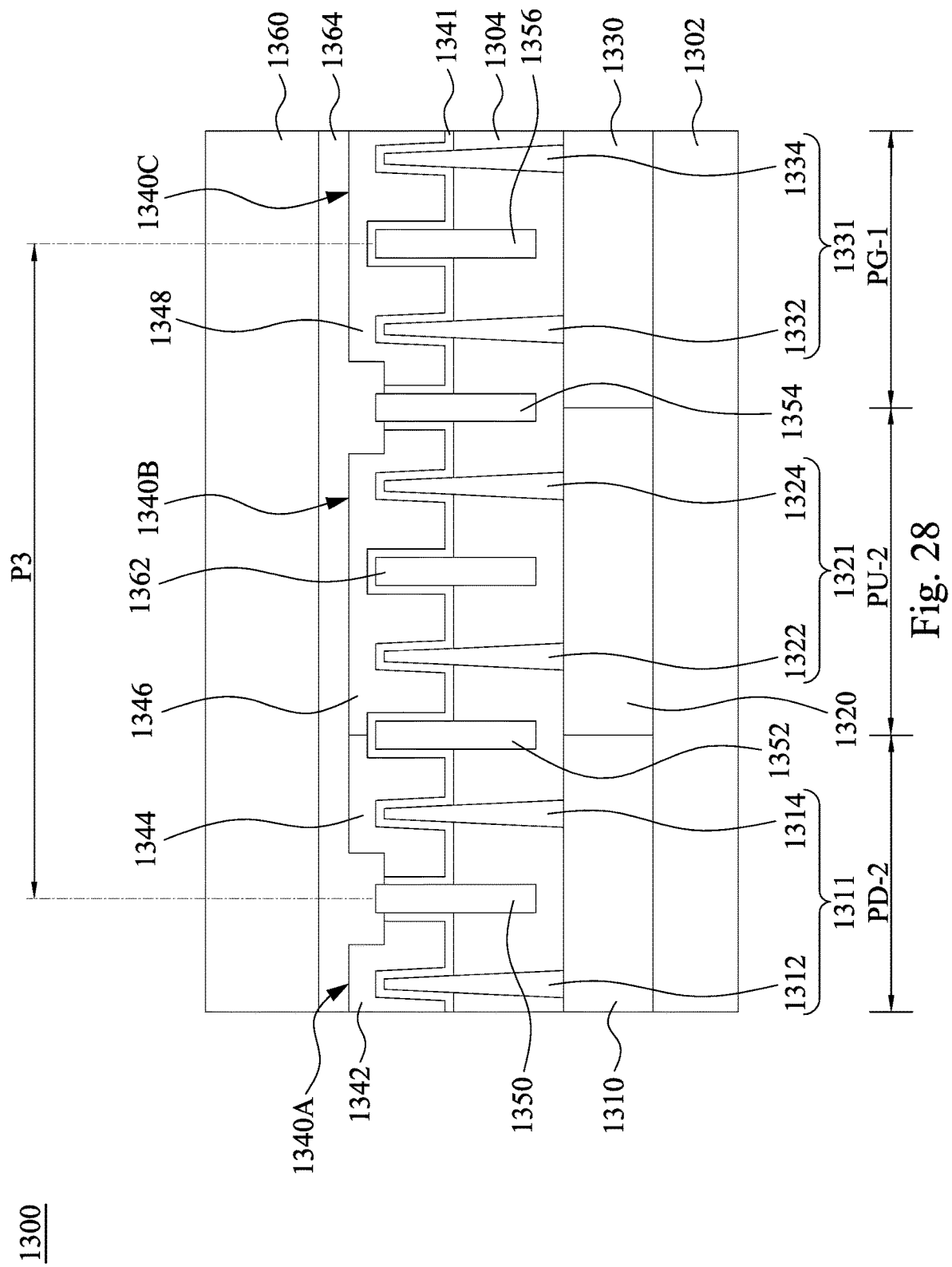
FIG. 28 illustrates a cross-section view for a SRAM cell according to some embodiments of the present disclosure.

Reference is made to FIG. 28 which illustrates a cross-section view for a SRAM cell 1300 according to some embodiments of the present disclosure. Many aspects of the SRAM cell 1300 are the same as or similar to those of the SRAM cell 1200 as depicted in FIG. 27. For example, the SRAM cell 1300 includes a substrate 1302, a first active area region 1311 with fins 1312, 1314, a second active area region 1321 with fins 1322, 1324, a third active area region 1331 with fins 1332, 1334, p-well regions 1310, 1330, an n-well region 1320, an isolation structure 1304, gate electrode 1340A-1340C, a gate dielectric layer 1341, a plurality of dielectric fins 1350, 1352, 1354, 1356, 1362, and an ILD layer 1360, and thus the detailed explanation may be omitted. Different from the SRAM cell 1200 as depicted in FIG. 27, the SRAM cell 1300 further comprises a capping layer 1364 covering the gate electrodes 1340A-1340C and the dielectric fins 1350, 1354. The ILD layer 1360 is above the capping layer 1364, and the gate electrodes 1340A-1340C and the dielectric fins 1350, 1354 are separated from the ILD layer 1360 by the capping layer 1364.

In some embodiments, the gate electrode 1340A above the p-well region 1210 includes an N-type work function metal layer 1342. The gate electrode 1340B extending from the p-well region 1310 into the n-well region 1320 includes an N-type work function metal layer 1344 and a P-type work function metal layer 1346. The gate electrode 1340C above the p-well region 1330 includes an N-type work function metal layer 1348. At least one of the N-type work function metal layers 1342, 1344, 1348 and the P-type work function metal layer 1346 has an end portion in a recess shape, and each of the end portions has a notched profile and can be referred to as a notched corner. At least one portion of the capping layer 1364 is between a pair of the adjacent end portions. For example, a first portion of the capping layer 1364 covering the dielectric fin 1350 is between the end portions of the N-type work function metal layers 1342, 1344, and a second portion of the capping layer 1364 covering the dielectric fin 1354 is between the end portions of the P-type work function metal layer 1346 and the N-type work function metal layer 1348. In some embodiments, the capping layer 1364 has a first bottom surface in contact with at least one of the N-type work function metal layers 1342, 1344, and the first bottom surface of the capping layer 1364 is in a position lower than a top surface of the dielectric fin 1350 facing away from the isolation structure 1304. In some embodiments, the capping layer 1364 has a second bottom surface in contact with at least one of the P-type work function metal layer 1346 and the N-type work function metal layer 1348, and the second bottom surface of the capping layer 1364 is in a position lower than a top surface of the dielectric fin 1354 facing away from the isolation structure 1304. Example materials of the capping layer 1364 include, but are not limited to, a high-k dielectric layer, an interfacial layer, and/or combinations thereof. For example, the capping layer 1364 may include a nitride based dielectric, a metal oxide dielectric, hafnium oxide (HfO2), tantalum oxide (Ta2O5), titanium oxide (TiO2), zirconium oxide (ZrO2), aluminum oxide (Al2O3), yttrium oxide (Y2O3), or combinations thereof.

In some embodiments, the SRAM cell 1300 includes a pull-down transistor PD-2, a pull-up transistor PU-2, and a pass-gate transistor PG-1, in which the pull-down transistor PD-2 and the pass-gate transistor PG-1 are n-type transistors and the pull-up transistor PU-2 is a p-type transistor, such as the n-type or p-type FinFET discussed above. Many aspects of the transistors of the SRAM cell 1300 are the same as or similar to those of the transistors of the SRAM cell 1200 as depicted in FIG. 27. For example, a distance from the dielectric fin 1350 to the dielectric fin 1356 that is measured along the X-direction of FIG. 28 can be referred to as a cell X-pitch P3.

Figure 29:
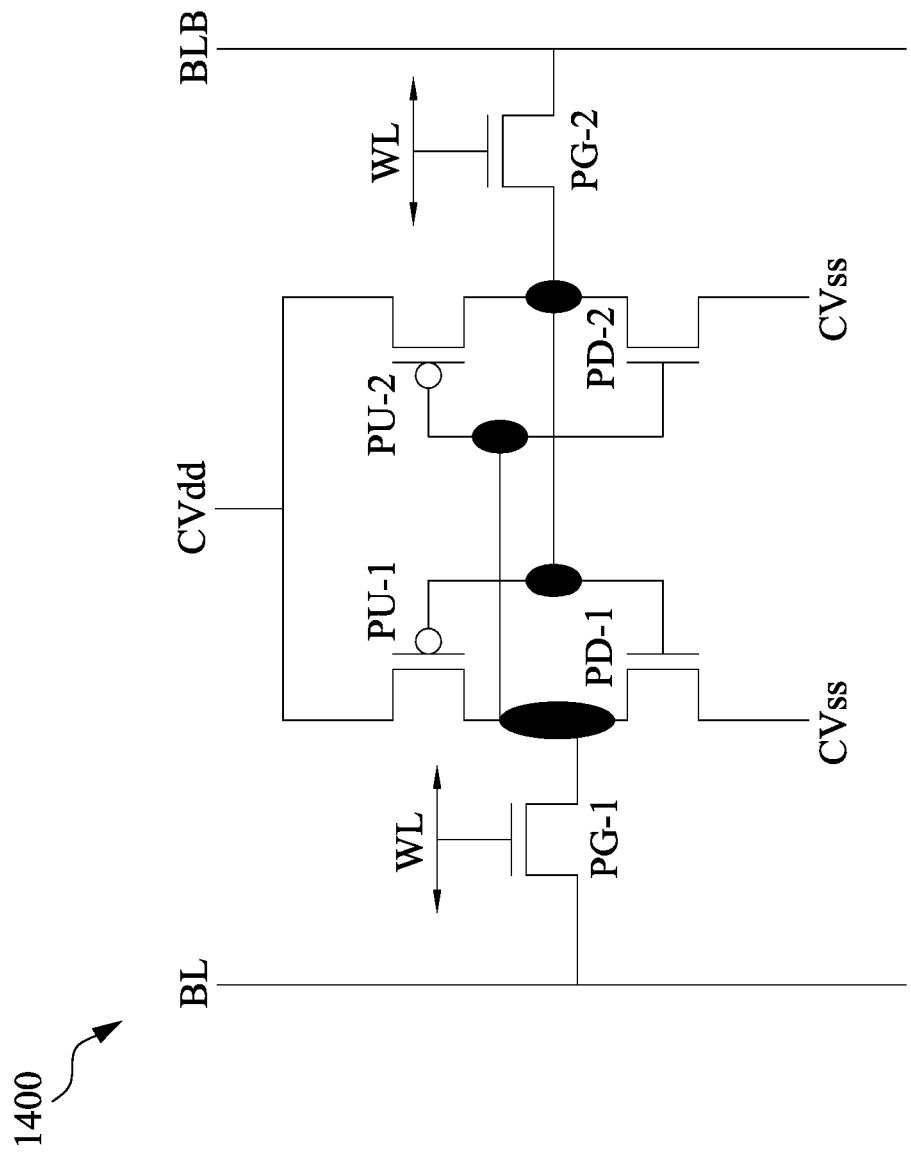
FIG. 29 illustrates a circuit configuration for a SRAM cell.
Figure 30:
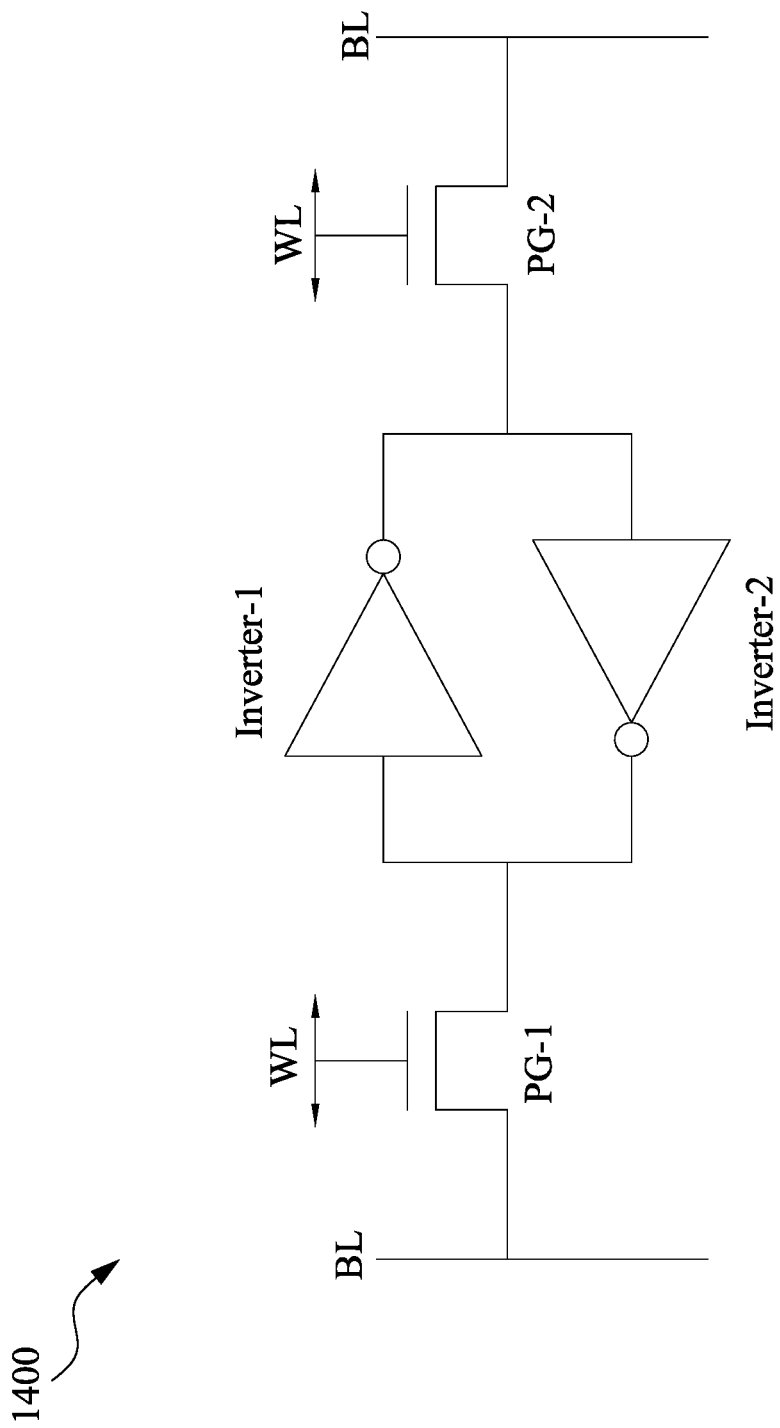
FIG. 30 illustrates a circuit diagram showing an equivalent circuit of the SRAM cell as depicted in FIG. 29.

Reference is made to FIGS. 29 and 30. FIG. 29 illustrates a circuit configuration for a SRAM cell 1400, and FIG. 30 illustrates a circuit diagram showing an equivalent circuit of the SRAM cell 1400 as depicted in FIG. 29. In some embodiments, the SRAM cell 1400 can be referred to as a single-port SRAM cell. The single-port SRAM cell 1400 includes pull-up transistors PU-1, PU-2; pull-down transistors PD-1, PD-2; and pass-gate transistors PG-1, PG-2. As show in the circuit diagram, transistors PU-1 and PU-2 are p-type transistors, such as the p-type FinFETs discussed above, and transistors PG-1, PG-2, PD-1, and PD-2 are n-type, such as FinFETs discussed above.

The drains of pull-up transistor PU-1 and pull-down transistor PD-1 are coupled together, and the drains of pull-up transistor PU-2 and pull-down transistor PD-2 are coupled together. Transistors PU-1 and PD-1 are cross-coupled with transistors PU-2 and PD-2 to form a first data latch. The gates of transistors PU-2 and PD-2 are coupled together and to the drains of transistors PU-1 and PD-1 to form a first storage node, and the gates of transistors PU-1 and PD-1 are coupled together and to the drains of transistors PU-2 and PD-2 to form a complementary first storage node. Sources of the pull-up transistors PU-1 and PU-2 are coupled to power voltage CVdd, and the sources of the pull-down transistors PD-1 and PD-2 are coupled to a ground voltage CVss.

The first storage node of the first data latch is coupled to bit line BL through pass-gate transistor PG-1, and the complementary first storage node is coupled to complementary bit line BLB through pass-gate transistor PG-2. The first storage node and the complementary first storage node are complementary nodes that are often at opposite logic levels (logic high or logic low). Gates of pass-gate transistors PG-1 and PG-2 are coupled to a word line WL.

Such circuit configuration may provide two cross-couple inverters, as the equivalent circuit illustrated in FIG. 30. In the example configuration in FIG. 30, the transistors PU-1 and PD-1 in FIG. 29 are represented as first inverter Inverter-1, and transistors PU-2 and PD-2 in FIG. 29 are represented as second inverter Inverter-2. The output of first inverter Inverter-1 is connected to transistor PG-1 and the input of the second inverter Inverter-2. The output of second inverter Inverter-2 is connected to transistor PG-2 and the input of second inverter Inverter-2.

Figure 31:
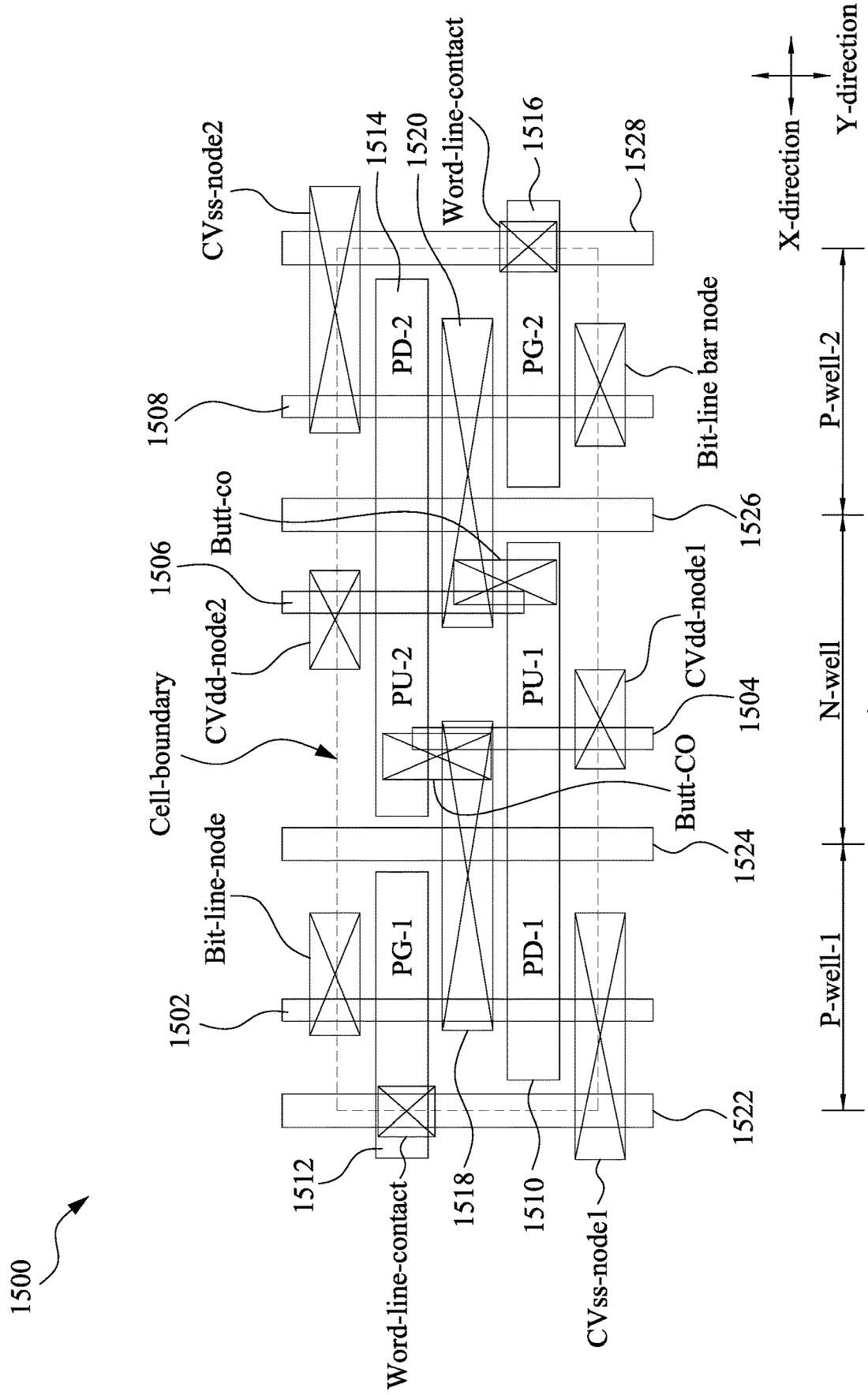
FIG. 31 illustrates a layout in a top view of a SRAM cell according to some embodiments of the present disclosure.

Reference is made to FIG. 31, which illustrates a layout in a top view of a SRAM cell 1500 according to some embodiments of the present disclosure. In some embodiments, the SRAM cell 1500 can be referred to as a single-port SRAM cell. An outer boundary of the SRAM cell 1500 is illustrated using dashed lines, which form a rectangle. Nodes CVdd-node1, CVdd-node2, CVss-node1, CVss-node2, bit-line-node, and bit-line bar node and some other nodes such as Word-line contacts are also illustrated in FIG. 31.

The SRAM cell 1500 includes a plurality of fin lines 1502, 1504, 1506, 1508 (also referred to as active region, or OD). The fin lines 1502, 1504, 1506, 1508 are arranged along a X-direction of FIG. 31 and extend alone a Y-direction of FIG. 31. A gate electrode 1510 forms a pull-down transistor PD-1 with the underlying fin line 1502. The gate electrode 1510 further forms a pull-up transistor PU-1 with the underlying fin line 1504. A gate electrode 1512 forms a pass-gate transistor PG-1 with the underlying fin line 1502, which is the same fin line that also forms the pull-down transistor PD-1. A gate electrode 1514 forms a pull-down transistor PD-2 with the underlying fin line 1508. The gate electrode 1514 further forms a pull-up transistor PU-2 with the underlying fin line 1506. A gate electrode 1516 forms pass-gate transistor PG-2 with the underlying fin line 1508, which is the same fin line that also form the pull-down transistor PD-2.

The SRAM cell 1500 includes an N-type well region N-well and two P-well regions P-well-1, P-well-2 on opposite sides of the N-type well region N-well. A first butted contact plug Butt-CO is used to electrically connect gate electrode 1514 of the transistors PU-2 and PD-2 to the drain region of the pull-up transistor PU-1, and a second butted contact plug Butt-CO is used to electrically connect gate electrode 1510 of the transistors PU-1 and PD-1 to the drain region of the transistor PU-2. Butted contacts Butt-CO are formed in contact level and OD level. A long contact 1518 is used to connect fin line 1502 (the drain region of FinFET PD-1) to fin line 1504 and the first butted contact Butt-CO, wherein the long contact 1518 and the first butted contact Butt-CO form a storage node. The long contact 1518 has a longitudinal direction perpendicular to the longitudinal directions of fin lines 1502, 1506, 1508. A long contact 1520 is used to connect fin line 1508 (the drain region of FinFET PD-2) to fin line 1506 and the second butted contact Butt-CO, wherein the long contact 1520 and the second butted contact Butt-CO form a storage node. The long contact 1520 has a longitudinal direction parallel to the longitudinal direction of the long contact 1518.

The SRAM cell 1500 further includes a plurality of dielectric fins 1522, 1524, 1526, 1528. The dielectric fins 1522, 1524, 1526, 1528 are arranged along the X-direction of FIG. 31 and extend alone the Y-direction of FIG. 31, and thus the longitudinal directions of fin lines 1502, 1506, 1508 are parallel with the longitudinal directions of the dielectric fins 1522, 1524, 1526, 1528. Many aspects of the dielectric fins 1522, 1524, 1526, 1528 may be the same as or similar to those of the dielectric fins as previously described (e.g., the dielectric fins illustrated in FIGS. 26, 27, 28), and thus the detailed explanation may be omitted. For example, when at least one of the gate electrode 1510, 1512, 1514, 1516 is etched to form at least one end portion in a recess shape, the etching process may be performed until exposing some portions of the dielectric fins 1522, 1524, 1526, 1528, so as to prevent at least one of the gate electrode 1510, 1512, 1514, 1516 from removing too much.

Figure 32:
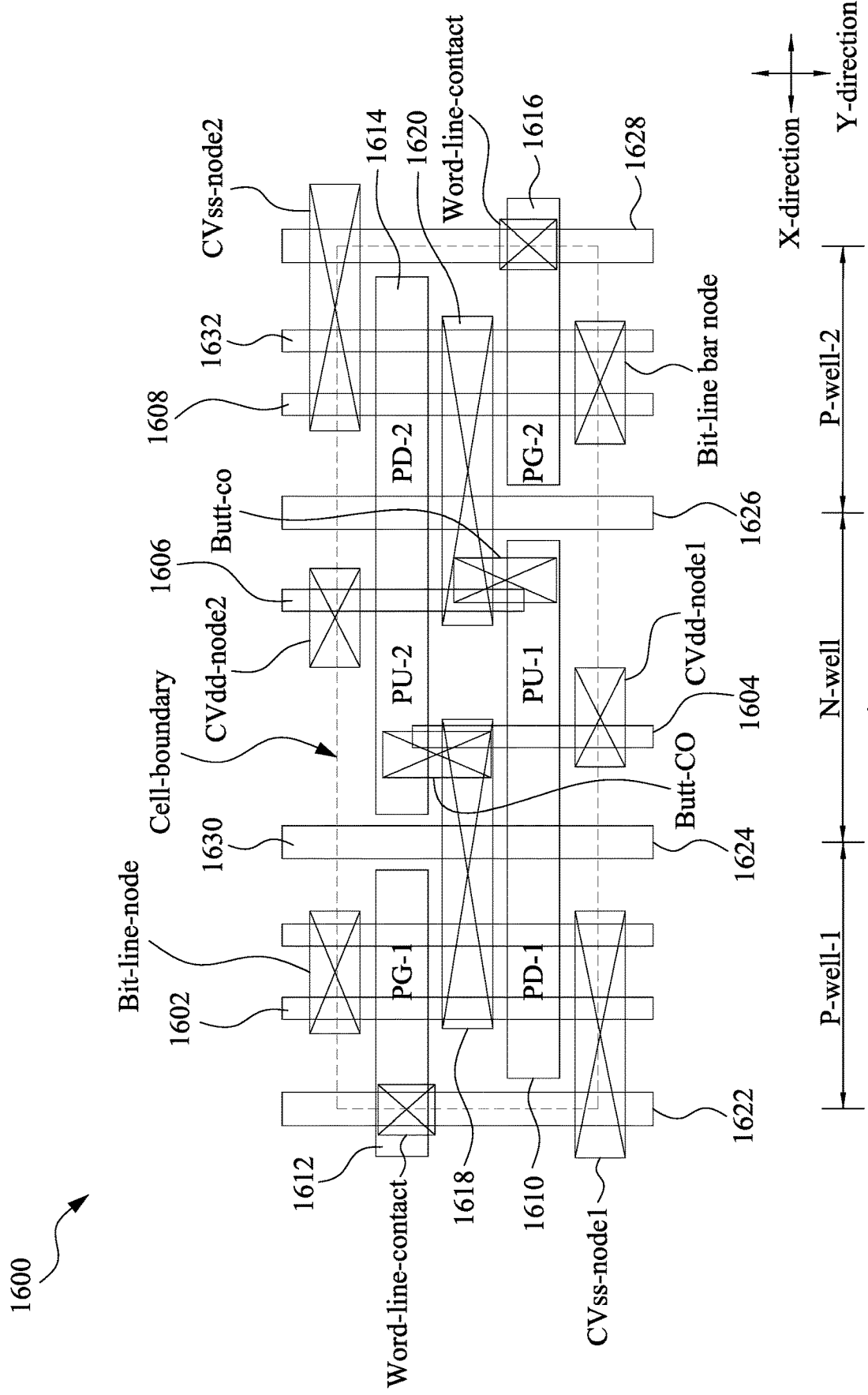
FIG. 32, which illustrates a layout in a top view of a SRAM cell according to some embodiments of the present disclosure.

Reference is made to FIG. 32, which illustrates a layout in a top view of a SRAM cell 1600 according to some embodiments of the present disclosure. In some embodiments, the SRAM cell 1600 can be referred to as a single-port SRAM cell. An outer boundary of the SRAM cell 1600 is illustrated using dashed lines, which form a rectangle. Nodes CVdd-node1, CVdd-node2, CVss-node1, CVss-node2, bit-line-node, and bit-line bar node and some other nodes such as Word-line contacts are also illustrated in FIG. 32. Many aspects of the SRAM cell 1600 may be the same as or similar to those of the SRAM cell 1500 as depicted in FIG. 31. For example, the SRAM cell 1600 includes a plurality of fin lines 1602, 1606, 1606, 1608, a plurality of gate electrodes 1610, 1612, 1614, 1616, long contacts 1618, 1620, a plurality of dielectric fins 1622, 1624, 1626, 1628, and thus the detailed explanation may be omitted. Different from the SRAM cell 1500, the SRAM cell 1600 further includes fin lines 1630, 1632.

The SRAM cell 1600 includes pull-down transistors PD-1, PD-2, pull-up transistors PU-1, PU-2, pass-gate transistors PG-1, PG-2. In some embodiments, the fin line 1630 overlaps with the gate electrodes 1612, 1618 and serves as a part of the pass-gate transistor PG-1 and the pull-down transistor PD-1, and thus each of the pass-gate transistor PG-1 and the pull-down transistor PD-1 comprises two fin lines and can be referred to as a multi-fin FinFET. Similarly, the fin line 1632 overlaps with the gate electrodes 1614, 1616 and serves as a part of the pass-gate transistor PG-2 and the pull-down transistor PD-2, and thus each of the pass-gate transistor PG-2 and the pull-down transistor PD-2 comprises two fin lines and can be referred to as a multi-fin FinFET. By adding more fins, the speed of the SRAM cell 1600 are improved.

Figure 33:
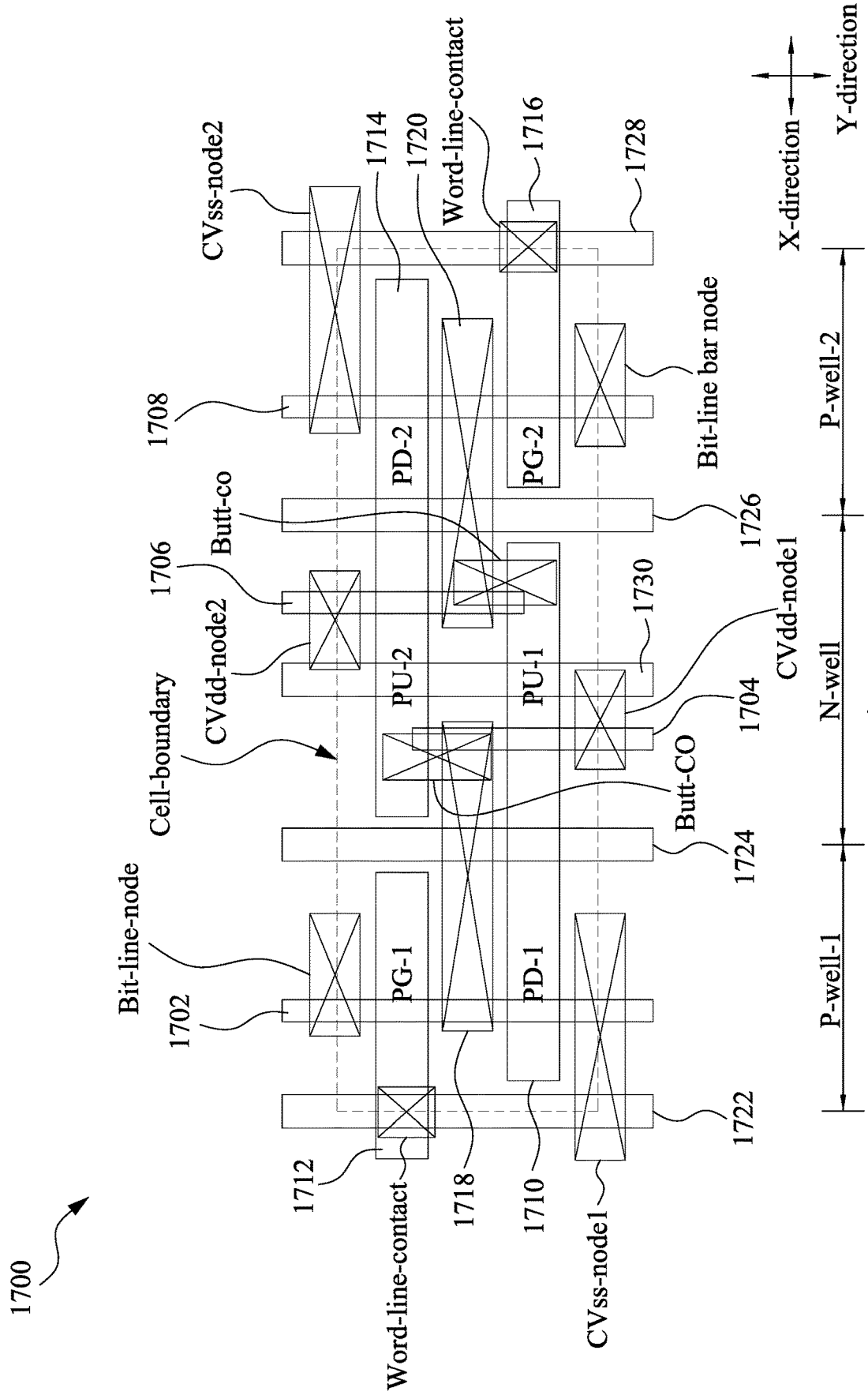
FIG. 33 illustrates a layout in a top view of a SRAM cell according to some embodiments of the present disclosure.

Reference is made to FIG. 33, which illustrates a layout in a top view of a SRAM cell 1700 according to some embodiments of the present disclosure. In some embodiments, the SRAM cell 1700 can be referred to as a single-port SRAM cell. An outer boundary of the SRAM cell 1700 is illustrated using dashed lines, which form a rectangle. Nodes CVdd-node1, CVdd-node2, CVss-node1, CVss-node2, bit-line-node, and bit-line bar node and some other nodes such as Word-line contacts are also illustrated in FIG. 33. Many aspects of the SRAM cell 1700 may be the same as or similar to those of the SRAM cell 1500 as depicted in FIG. 31. For example, the SRAM cell 1700 includes a plurality of fin lines 1702, 1706, 1706, 1708, a plurality of gate electrodes 1710, 1712, 1714, 1716, long contacts 1718, 1720, a plurality of dielectric fins 1722, 1724, 1726, 1728, the pull-down transistors PD-1, PD-2, pull-up transistors PU-1, PU-2, pass-gate transistors PG-1, PG-2, and thus the detailed explanation may be omitted. Different from the SRAM cell 1500, the SRAM cell 1700 further includes a dielectric fin 1730 between the fin line 1704, 1706. In some embodiment, the dielectric fin 1730 extends along a Y-direction of FIG. 33 and overlaps with the gate electrodes 1710, 1714. By forming the dielectric fins 1722, 1724, 1726, 1728, 1730 in the same layout of the SRAM cell 1700, the patterns of the layout of the SRAM cell 1700 is homogeneous, and such configuration of the SRAM cell 1700 may be advantageous to make the process more flexible, thereby improving yield of the SRAM cell 1700.

Figure 34:
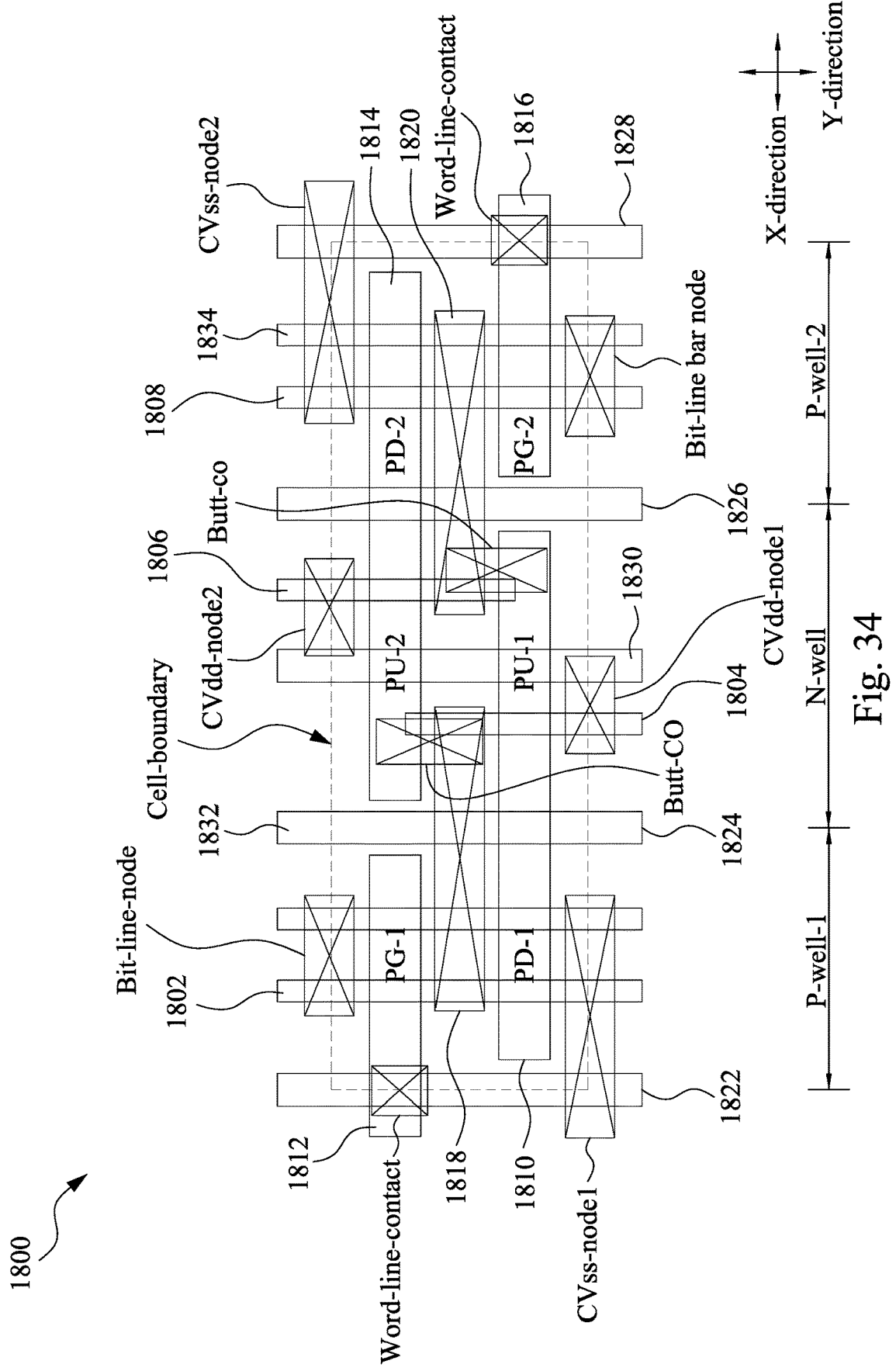
FIG. 34 illustrates a layout in a top view of a SRAM cell according to some embodiments of the present disclosure.

Reference is made to FIG. 34, which illustrates a layout in a top view of a SRAM cell 1800 according to some embodiments of the present disclosure. In some embodiments, the SRAM cell 1800 can be referred to as a single-port SRAM cell. An outer boundary of the SRAM cell 1800 is illustrated using dashed lines, which form a rectangle. Nodes CVdd-node1, CVdd-node2, CVss-node1, CVss-node2, bit-line-node, and bit-line bar node and some other nodes such as Word-line contacts are also illustrated in FIG. 34. Many aspects of the SRAM cell 1800 may be the same as or similar to those of the SRAM cell 1700 as depicted in FIG. 33. For example, the SRAM cell 1800 includes a plurality of fin lines 1802, 1806, 1806, 1808, a plurality of gate electrodes 1810, 1812, 1814, 1816, long contacts 1818, 1820, a plurality of dielectric fins 1822, 1824, 1826, 1828, 1830, and thus the detailed explanation may be omitted. Different from the SRAM cell 1700, the SRAM cell 1800 further includes fin lines 1832, 1834.

The SRAM cell 1800 includes pull-down transistors PD-1, PD-2, pull-up transistors PU-1, PU-2, pass-gate transistors PG-1, PG-2. In some embodiments, the fin line 1832 overlaps with the gate electrodes 1812, 1818 and serves as a part of the pass-gate transistor PG-1 and the pull-down transistor PD-1, and thus each of the pass-gate transistor PG-1 and the pull-down transistor PD-1 comprises two fin lines and can be referred to as a multi-fin FinFET. Similarly, the fin line 1834 overlaps with the gate electrodes 1814, 1816 and serves as a part of the pass-gate transistor PG-2 and the pull-down transistor PD-2, and thus each of the pass-gate transistor PG-2 and the pull-down transistor PD-2 comprises two fin lines and can be referred to as a multi-fin FinFET. By adding more fins, the speed of the SRAM cell 1800 are improved.

The fins, gate electrodes, contact, dielectric fins, and/or capping layers, can be modelled in corresponding layouts as discussed above. These layouts are represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As described above, the semiconductor device of the present disclosure includes the gate electrode and the contact plugs. The gate electrode has recess-shaped end portions (or notched top corners) which may be formed by an etch process. The contact plugs can be formed by a self-aligned process which is performed prior to the etch process. The semiconductor device may further include a capping layer between the end portions and the contact plugs. By the capping layer and the recess-shaped end portions, a risk of the contact plugs in contact with the gate electrodes is reduced, thereby improving yield of the semiconductor device. Furthermore, the semiconductor device may further include at least one dielectric fin between the end portions of the gate electrodes. Prior to the formation of the recess-shaped end portions, the dielectric fin is under the gate electrode. When an etch process is performed to form the recess-shaped end portions, the etch process can be performed until exposing the dielectric fin. Since the etch process is terminated at the time that the dielectric fins is exposed, a depth of a gap between a pair of the end portions can be controlled, so as to prevent the gate electrode from removing too much.

According to various embodiments of the present disclosure, a semiconductor device includes a first fin, a first gate electrode, a second fin, a second gate electrode, and a first dielectric capping layer. The first fin extends along a direction. The first gate electrode is across the first fin and has a first notched corner. The second fin extends along the direction. The second gate electrode is across the second fin and has a second notched corner. The first dielectric capping layer has a first portion in between the first notched corner and the second notched corner.

In some embodiments, the semiconductor device further comprises a pair of spacers and a contact area. The spacers are arranged along longitudinal sides of the first and second gate electrodes and overlap the first dielectric capping layer. The contact area overlaps at least one of the spacers.

In some embodiments, the first dielectric capping layer further comprises a second portion under the first portion, and the second portion is narrower than the first portion.

In some embodiments, the first portion of the first dielectric capping layer has a curved surface.

In some embodiments, the semiconductor device further comprises a second dielectric capping layer between the first and second gate electrodes and covered by the first dielectric capping layer.

In some embodiments, the first portion of the first dielectric capping layer is wider than the second dielectric capping layer.

In some embodiments, the semiconductor device further comprises a first dielectric fin extending along the direction and between the first and second gate electrodes, in which a top surface of the first dielectric fin is between the first and second notched corners and in a position higher than a bottom of the first notched corner and a bottom of the second notched corner.

In some embodiments, the semiconductor device of claim 7, further comprises a first well region, a second well region, and a second dielectric fin. The second well region has a different conductivity type than the first well region, in which the first gate electrode extends from the first well region to the second well region. The second dielectric fin extends along the direction and overlaps an interface between the first and second well regions, in which the first gate electrode is across the second dielectric fin.

According to various embodiments of the present disclosure, a semiconductor device includes a first fin, a second fin, a gate electrode, and a first dielectric layer. The first fin extends along a direction. The second fin extends along the direction. The gate electrode crosses the first and second fins and has a first end portion and a second end portion opposite to the first end portion, in which the first end portion and second end portion have a notched profile. The first dielectric layer is in contact with the first and second end portions of the gate electrode.

In some embodiments, the first end portion has a top sidewall, a bottom sidewall, and a connecting surface extending from the top sidewall to the bottom sidewall and in contact with the first dielectric layer, in which the connecting surface is non-parallel with the top and bottom sidewalls.

In some embodiments, the first end portion and the first dielectric layer form an interface, and the interface has a curved segment and a bottom segment extending from a bottom of the curved segment.

In some embodiments, the semiconductor device further comprises a second dielectric layer under the first dielectric layer, in which the second dielectric layer has a dielectric constant lower than a dielectric constant of the first dielectric layer.

In some embodiments, the semiconductor device further comprises a dielectric fin having a top in a position higher than a bottom surface of the first dielectric layer.

In some embodiments, the semiconductor device further comprising a dielectric fin having a top embedded in the first dielectric layer.

In some embodiments, the semiconductor device further comprises an n-type well region and a p-type well region. The first and second end portions of the gate electrode are respectively over the n-type well region and the p-type well region.

In some embodiments, the first dielectric layer is a high-k dielectric layer.

In some embodiments, the semiconductor device further comprises a gate contact through the first dielectric layer and in contact with the gate electrode.

In some embodiments, the semiconductor device further comprises a plurality of first dielectric fins and a second dielectric fin. The first and second end portions of the gate electrode and the first and second fins are between the first dielectric fins. The second dielectric fin is between the first and second end portions of the gate electrode.

According to various embodiments of the present disclosure, a method for manufacturing a semiconductor device is provided. The method comprises steps as follows. A first gate electrode is formed across fins. The first gate electrode is etched to break the first gate electrode into a plurality of second gate electrodes, in which etching the first gate electrode is performed such that the second gate electrodes are separated by a stepped hole. A dielectric material is filled into the stepped hole.

In some embodiments, etching the first gate electrode comprises steps as follows. The gate electrode is etched to form an opening exposing an isolation structure. A top portion of the opening is widened to from the stepped hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising: a first fin extending along a direction;
    a first gate electrode across the first fin and having a first top sidewall, a first bottom sidewall the first top sidewall laterally set back from the first bottom sidewall, and a first connecting surface extending from the first top sidewall to the first bottom sidewall, wherein the first connecting surface is non-parallel with the first top and first bottom sidewalls, the first top sidewall and first connecting surface defining a first notched corner;
    a second fin extending along the direction;
    a second gate electrode across the second fin and having a second top sidewall facing the first top sidewall, a second bottom sidewall facing the first bottom sidewall, the second top sidewall laterally set back from the second bottom sidewall, and a second connecting surface extending from the second top sidewall to the second bottom sidewall, wherein the connecting surface is non-parallel with the top and bottom sidewalls, the top sidewall and connecting surface defining a second notched corner;
    and
    a first dielectric capping layer comprising a first portion contacting the first notched corner and the second notched corner a third portion contacting the first bottom sidewall and the second bottom sidewall and a second portion extending along a portion of a top surface of the first gate electrode,
    wherein the dielectric capping layer is monolithic.

2. The semiconductor device of claim 1, further comprising:
    a pair of spacers arranged along longitudinal sides of the first and second gate electrodes and overlapping the first dielectric capping layer; and
    a contact area overlapping one of the spacers.

3. The semiconductor device of claim 1, wherein the third portion is narrower than the first portion.

4. A semiconductor device, comprising:
    a first fin extending along a first direction;
    a second fin extending along the first direction;
    a gate electrode crossing the first and second fins in a second direction different than the first direction and having a top surface, a first end portion facing the second direction and a second end portion opposite to the first end portion, wherein the first end portion has a first top sidewall, a first bottom sidewall the first top sidewall laterally set back from the first bottom sidewall, and a first connecting surface extending from the first top sidewall to the first bottom sidewall, wherein the first connecting surface is non-parallel with the first top and first bottom sidewalls, the first top sidewall and first connecting surface defining a notched profile and the second end portion has a second top sidewall facing the first top sidewall, a second bottom sidewall facing the first bottom sidewall, the second top sidewall laterally set back from the second bottom sidewall, and a second connecting surface extending from the second top sidewall to the second bottom sidewall, wherein the connecting surface is non-parallel with the second top and bottom sidewalls, the top sidewall and connecting surface defining a notched profile; and
    a first dielectric layer in contact with the top surface of the gate electrode, the first and second bottom sidewalls and the notched profiles of the first and second end portions of the gate electrode, wherein a top of the first dielectric layer is higher than a top of the gate electrode,
    wherein the first dielectric layer is monolithic.

5. The semiconductor device of claim 4, further comprising:
    an n-type well region; and
    a p-type well region, wherein the first and second end portions of the gate electrode are respectively over the n-type well region and the p-type well region.

6. The semiconductor device of claim 4, wherein the first dielectric layer is a high-k dielectric layer.

7. The semiconductor device of claim 4, further comprising a gate contact through the first dielectric layer and in contact with the gate electrode.

8. A semiconductor device, comprising:
a substrate;
a gate structure over the substrate and including:
a gate dielectric; and
a gate electrode over the gate dielectric, wherein the gate electrode has a top surface and a stepped sidewall structure having a surface normal to a first direction including a lower sidewall and an upper sidewall laterally set back from the lower sidewall, the stepped sidewall structure defining a notched corner below the top surface;
first and second source/drains on opposite sides of the gate structure, respectively and spaced apart from each other in a second direction different from the first direction; and
a dielectric feature adjacent to the gate structure, the dielectric feature being in contact with and covering the top surface and both the upper sidewall and the lower sidewall of the stepped sidewall structure of the gate electrode, wherein a bottom portion of the dielectric feature contacts the gate dielectric,
wherein the dielectric feature is monolithic.

9. The semiconductor device of claim 8, wherein the dielectric feature is made of a high-k dielectric material.

* * * * *